(12) United States Patent
Ryu et al.

(10) Patent No.: US 12,063,837 B2
(45) Date of Patent: Aug. 13, 2024

(54) COLOR CONVERTING SUBSTRATE AND DISPLAY DEVICE INCLUDING SAME

(71) Applicant: Samsung Display Co., LTD., Yongin-si (KR)

(72) Inventors: Jang Wi Ryu, Yongin-si (KR); Soo Dong Kim, Hwaseong-si (KR); Byung Chul Kim, Yongin-si (KR); In Seok Song, Pocheon-si (KR); Ha Lim Ji, Seoul (KR); Gak Seok Lee, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 430 days.

(21) Appl. No.: 17/613,473

(22) PCT Filed: May 7, 2020

(86) PCT No.: PCT/KR2020/005976
§ 371 (c)(1),
(2) Date: Nov. 22, 2021

(87) PCT Pub. No.: WO2020/235838
PCT Pub. Date: Nov. 26, 2020

(65) Prior Publication Data
US 2022/0223654 A1 Jul. 14, 2022

(30) Foreign Application Priority Data
May 23, 2019 (KR) .................. 10-2019-0060380
Apr. 20, 2020 (KR) .................. 10-2020-0047482

(51) Int. Cl.
*H10K 59/38* (2023.01)
*G02B 5/20* (2006.01)
*H10K 59/122* (2023.01)

(52) U.S. Cl.
CPC ............. *H10K 59/38* (2023.02); *G02B 5/201* (2013.01); *H10K 59/122* (2023.02)

(58) Field of Classification Search
CPC .... H10K 59/38; H10K 59/122; H10K 50/865; H10K 59/12; H10K 99/00; G02B 5/201; G02B 5/003; G02B 5/0242
See application file for complete search history.

(56) References Cited

U.S. PATENT DOCUMENTS

2013/0208017 A1* 8/2013 Gu ..................... G09G 3/3208
345/690
2017/0023830 A1* 1/2017 Yang ................. G02F 1/134336
(Continued)

FOREIGN PATENT DOCUMENTS

JP        5872407 B2    3/2016
KR   1020150069947 A    6/2015
(Continued)

OTHER PUBLICATIONS

International Search Report mailed Aug. 21, 2020 for PCT/KR2020/005976.

*Primary Examiner* — Yasser A Abdelaziez
(74) *Attorney, Agent, or Firm* — CANTOR COLBURN LLP

(57) ABSTRACT

A color converting substrate includes: a base part having, defined therein a first light transmitting region, a second light transmitting region spaced apart from the first light transmitting region in a first direction, and a first light blocking region between the first light transmitting region and the second light transmitting region; a first color filter positioned on one surface of the base part and overlapping the first light transmitting region; a second color filter positioned on the one surface of the base part and overlapping the second light transmitting region; a light blocking pattern overlapping the first light blocking region and posi- (Continued)

tioned on the one surface of the base part; and a light transmitting pattern positioned on the first color filter, the second color filter, and the light blocking pattern, wherein the first color filter and the second color filter include a coloring material of a first color.

26 Claims, 33 Drawing Sheets

(56) References Cited

U.S. PATENT DOCUMENTS

| | | | |
|---|---|---|---|
| 2018/0346748 A1 | 12/2018 | Pan et al. | |
| 2018/0374904 A1 | 12/2018 | Xu | |
| 2019/0146269 A1* | 5/2019 | Mikumo | G03F 7/0007 430/7 |
| 2020/0168667 A1* | 5/2020 | Kim | H10K 71/00 |

FOREIGN PATENT DOCUMENTS

| | | |
|---|---|---|
| KR | 101699191 B1 | 1/2017 |
| KR | 1020170043724 A | 4/2017 |
| KR | 1020170043727 A | 4/2017 |
| KR | 1020170137797 A | 12/2017 |
| KR | 1020180068560 A | 6/2018 |
| KR | 1020180092326 A | 8/2018 |
| KR | 1020190009871 A | 1/2019 |
| KR | 1020190036650 A | 4/2019 |
| KR | 1020200138507 A | 12/2020 |

* cited by examiner

COLOR CONVERTING SUBSTRATE AND DISPLAY DEVICE INCLUDING SAME

This application claims priority to Korean Patent Application 10-2019-0060380 filed on May 23, 2019, and Korean Patent Application 10-2020-0047482 filed on Apr. 20, 2020, all the benefits accruing therefrom under 35 U.S.C. 119, the contents of which in their entirety are herein incorporated by reference.

TECHNICAL FIELD

The disclosure relates to a color converting substrate and a display device including the same.

BACKGROUND ART

A display device is becoming more important with developments in multimedia technology. Accordingly, various display devices such as a liquid crystal display ("LCD") device, an organic light-emitting diode ("OLED") display device, and the like have been used.

A self-luminous display device, which is a type of the display device, includes self-luminous elements such as OLEDs. Each of the self-luminous elements may include two electrodes facing each other and an emission layer interposed between the two electrodes. In a case where the self-luminous elements are OLEDs, electrons and holes from the two electrodes may recombine together in the emission layer to generate excitons, and light may be emitted in response to the transition of the excitons from an excited state to a ground state.

The self-luminous display device does not need a separate light source and can thus be implemented as a low-power consumption, thin, light-weight display device with high-quality characteristics such as wide viewing angles, high luminance and contrast, and a fast response speed, drawing attention as a next-generation display device.

DISCLOSURE

Technical Problem

Aspects of the disclosure provide a color converting substrate having an improved distribution for an inkjet process.

Aspects of the disclosure also provide a display device including the color converting substrate and thereby capable of improving the quality of display.

It should be noted that aspects of the disclosure are not limited thereto and other aspects, which are not mentioned herein, will be apparent to those of ordinary skill in the art from the following description.

Technical Solution

According to an embodiment of the disclosure, a color converting substrate includes: a base part having, defined therein, a first light transmitting region, a second light transmitting region spaced apart from the first light transmitting region in a first direction, and a first light blocking region between the first transmitting region and the second light transmitting region; a first color filter positioned on one surface of the base part and overlapping with the first light transmitting region in a plan view; a second color filter positioned on the one surface of the base part and overlapping with the second light transmitting region in the plan view; a light blocking pattern overlapping with the first light blocking region in the plan view and positioned on the one surface of the base part; and a light transmitting pattern positioned on the first color filter, the second color filter, and the light blocking pattern, where the first and second color filters include a colorant of a first color.

A third light transmitting region spaced apart from the second light transmitting region in the first direction and a second light blocking region between the second light transmitting region and the third light transmitting region may be further defined in the base part, and the color converting substrate may further comprise a third color filter positioned on the one surface of the base part, overlapping with the third light transmitting region in the plan view, and including a colorant of a second color, which is different from the colorant of the first color; a first light blocking member positioned between the second color filter and the third color filter and overlapping with the second light blocking region in the plan view; and a first wavelength converting pattern positioned on the third light transmitting region.

A width, in the first direction, of the light transmitting pattern may be greater than a width, in the first direction, of the first wavelength converting pattern.

The color converting substrate may further comprise a barrier positioned in the second light blocking region and disposed between the light transmitting pattern and the first wavelength converting pattern.

A thickness of the light blocking pattern may be greater than a thickness of the first light blocking member and smaller than a thickness of the barrier.

The light blocking pattern may be disposed on the one surface of the base part and be in contact with the first and second color filters.

The light blocking pattern may be disposed to be spaced apart from the one surface of the base part, and at least part of a side surface of the light blocking pattern may be in contact with the light transmitting pattern.

The barrier may extend in a second direction, which intersects the first direction.

A fifth light transmitting region spaced apart from the first light transmitting region in the second direction may be further defined in the base part, and the light blocking pattern may be disposed between the first light transmitting region and the fifth light transmitting region.

A fourth light transmitting region spaced apart from the third light transmitting region in the first direction and a third light blocking region between the third light transmitting region and the fourth light transmitting region may be further defined in the base part, and the color converting substrate may further comprise a fourth color filter positioned on the one surface of the base part, overlapping with the fourth light transmitting region in the plan view, and including a colorant of a third color, which is different from the colorants of the first and second colors; a second light blocking member positioned between the third and fourth color filters and overlapping with the third light blocking region in the plan view; and a second wavelength converting pattern positioned on the fourth light transmitting region.

A first side of the second color filter may be in contact with the light blocking pattern, a second side of the second color filter may be in contact with the first light blocking member, a first side of the third color filter may be in contact with the first light blocking member, and a second side of the third color filter may be in contact with the second light blocking member.

A first side portion of the third color filter may be positioned in the second light blocking region, and a second side portion of the third color filter may be positioned in the third light blocking region.

The color converting substrate may further comprise a barrier positioned in the third light blocking region and disposed between the first and second wavelength converting patterns.

The first and second color filters may transmit light of the first color therethrough and block transmission of light of the second and third colors therethrough, the third color filter may transmit light of the second color therethrough and blocks transmission of light of the third and first colors therethrough, and the fourth color filter may transmit light of the third color therethrough and blocks transmission of light of the first and second colors therethrough.

A third light transmitting region spaced apart from the first light transmitting region in the first direction, a fourth light transmitting region spaced apart from the third light transmitting region in a second direction, which intersects the first direction, and a sixth light transmitting region spaced apart from the third light transmitting region in the first direction may be further defined in the base part, the color converting substrate may further comprise a third color filter positioned on the one surface of the base part, overlapping with the third light transmitting region in the plan view, and including a colorant of a second color, which is different from the colorant of the first color; a fourth color filter positioned on the one surface of the base part, overlapping with the fourth light transmitting region in the plan view, and including a colorant of a third color, which is different from the first and second colors; and a sixth color filter positioned on the one surface of the base part, overlapping with the sixth light transmitting region in the plan view, and including a colorant of the second color filter, and the light blocking pattern may be further disposed between the third and sixth light transmitting regions.

A seventh light transmitting region spaced apart from the fourth light transmitting region in the second direction may be further defined in the base part, the color converting substrate may further comprise a seventh color filter positioned on the one surface of the base part, overlapping with the seventh light transmitting region in the plan view, and including a colorant of the third color, and the light blocking pattern may be further disposed between the fourth and seventh light transmitting regions.

According to an embodiment of the disclosure, a color converting substrate includes: a base part having, defined therein, a first light transmitting region, a second light transmitting region spaced apart from the first light transmitting region in a first direction, and a third light transmitting region spaced apart from a space between the first and second light transmitting regions in a second direction, which intersects the first direction; a first color filter positioned on one surface of the base part, overlapping with the first light transmitting region in the plan view, and including a colorant of a first color; a second color filter positioned on the one surface of the base part, overlapping with the second light transmitting region in the plan view, and including a colorant of a second color; a third color filter positioned on the one surface of the base part, overlapping with the third light transmitting region in the plan view, and including a colorant of a third color, where the base part has, further defined therein, a fourth light transmitting region spaced apart from the first light transmitting region in the second direction, and the color converting substrate further includes a fourth color filter positioned on the one surface of the base part, overlapping with the fourth light blocking region in the plan view, and including a colorant of the first color and a light blocking pattern positioned between the first and fourth light transmitting regions.

The base part may have, further defined therein, a fifth light transmitting region spaced apart from the second light transmitting region in the first direction, the color converting substrate may further include a fifth color filter positioned on the one surface of the base part, overlapping with the fifth light transmitting region in the plan view, and including a colorant of the second color, and the light blocking pattern may be further positioned between the second light transmitting region and the fifth light transmitting region.

The color converting substrate may further comprise a barrier disposed to surround the first and fourth light transmitting regions, and a first wavelength converting pattern disposed on the first color filter, the fourth color filter, and the light blocking pattern, in a region surrounded by the barrier.

The base part may have, further defined therein, a sixth light transmitting region spaced apart from the third light transmitting region in the second direction, the barrier may be further disposed to surround the third and sixth light transmitting regions, the light blocking pattern may be further positioned between the third and sixth light transmitting regions, and the color converting substrate may further include a sixth color filter positioned on the one surface of the base part, overlapping with the sixth light transmitting region in the plan view, and including a colorant of the third color and a light transmitting pattern disposed on the third color filter, the sixth color filter, and the light blocking pattern, in a region surrounded by the barrier.

According to an embodiment of the disclosure, a display device includes a display substrate having, defined therein, a first emission region, a second emission region spaced apart from the first emission region in a first direction, and a non-emission region between the first emission region and the second emission region, and a color converting substrate disposed on the display substrate, where the color converting substrate includes: a base part having, defined therein, a first light transmitting region, a second light transmitting region spaced apart from the first light transmitting region in the first direction and a first light blocking region between the first light transmitting region and the second light transmitting region, a first color filter positioned on one surface of the base part and overlapping with the first light transmitting region in a plan view, a second color filter positioned on the one surface of the base part and overlapping with the second light transmitting region in the plan view, a light blocking pattern overlapping with the first light blocking region and positioned on the one surface of the base part in the plan view, and a light transmitting pattern positioned on the first color filter, the second color filter, and the light blocking pattern, and the first and second color filters include a colorant of a first color.

The first light transmitting region may overlap with the first emission region in the plan view, the second light transmitting region may overlap with the second emission region in the plan view, the first and second emission regions may emit emission light of the first color, and the emission light may be incident upon the light transmitting pattern.

At least some of the emission light emitted from the first emission region and incident upon the light transmitting pattern may be output from the first light transmitting region, and at least some of the emission light emitted from the first emission region and incident upon the light transmitting pattern may be blocked by the light blocking pattern.

The display substrate may have, further defined therein, a third emission region spaced apart from the second emission region in the first direction, and the color converting substrate may have, defined therein, a third light transmitting region spaced apart from the second light transmitting region in the first direction and a second light blocking region positioned between the second light transmitting region and the third light transmitting region and further comprise a third color filter positioned on the one surface of the base part, overlapping with the third light transmitting region in the plan view, and including a colorant of a second color, which is different from the first color; a first light blocking member positioned between the second color filter and the third color filter and overlapping with the second light blocking region in the plan view; and a first wavelength converting pattern positioned on the third light transmitting region.

The display device may further comprise a barrier positioned in the second light blocking region and disposed between the light transmitting pattern and the first wavelength converting pattern.

The third emission region may emit emission light of the first color, and the emission light may be incident upon the first wavelength converting pattern.

The details of other embodiments are included in the detailed description and the accompanying drawings.

Advantageous Effects

According to embodiments of the disclosure, a color converting substrate includes identical light transmitting regions, which are disposed adjacent to each other, and a light blocking pattern, which is positioned between the light transmitting regions. As the identical light transmitting regions are disposed adjacent to each other, the impact precision of ink during inkjet printing can be improved, and processes can be simplified so that the distribution of inkjet printing processes using multiple nozzles can be improved. Also, as a display device includes the color converting substrate, the display quality of the display device can be improved.

The effects according to the embodiments are not limited by the contents exemplified above, and more various effects are included in this disclosure.

MODES OF THE INVENTION

Figure 1:
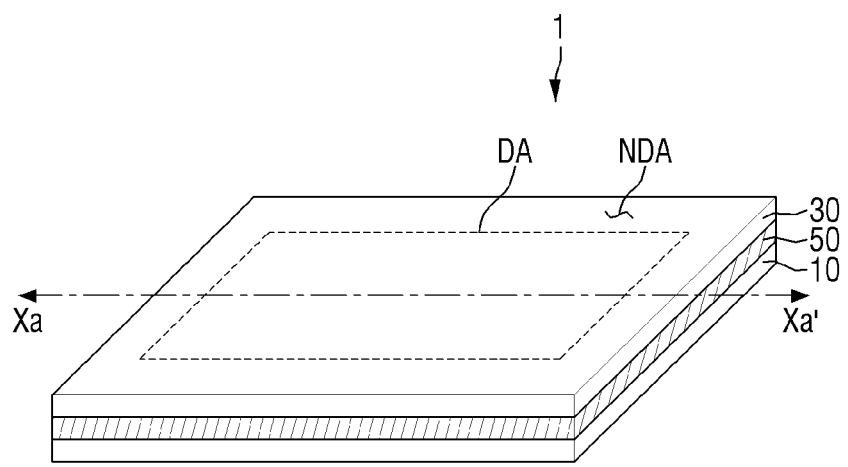
FIG. 1 is a perspective view of a display device according to an embodiment of the disclosure.
Figure 1:
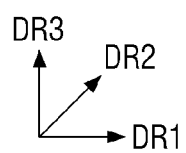

The invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be. The same reference numbers indicate the same components throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

It will be understood that, although the terms "first," "second," "third," "fourth," etc. may be used herein to describe various elements, these elements should not be limited by these terms. These terms are only used to distinguish one element from another element. For instance, a first element discussed below could be termed one of a second element, a third element, and a fourth element without departing from the teachings of the invention.

The invention will be described with reference to perspective views, cross-sectional views, and/or plan views, in which preferred embodiments of the invention are shown. Thus, the profile of a view may be modified according to manufacturing techniques and/or allowances. That is, the embodiments of the invention are not intended to limit the scope of the invention but cover all changes and modifications that can be caused due to a change in manufacturing process. Thus, regions shown in the drawings are illustrated in schematic form and the shapes of the regions are presented simply by way of illustration and not as a limitation.

Hereinafter, embodiments will be described with reference to the accompanying drawings.

Figure 2:
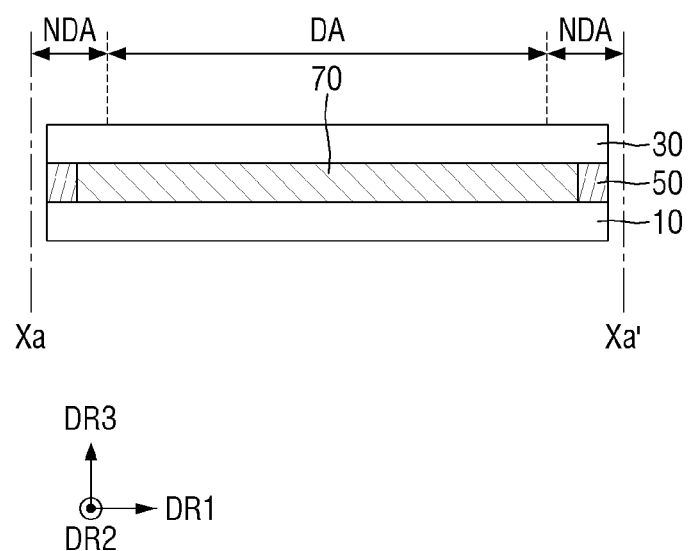
FIG. 2 is a cross-sectional view taken along line Xa-Xa' of FIG. 1.

FIG. 1 is a perspective view of a display device according to an embodiment of the disclosure. FIG. 2 is a cross-sectional view taken along line Xa-Xa' of FIG. 1.

Referring to FIGS. 1 and 2, a display device 1 may be applicable to various electronic devices, for example, a mid- to small-size electronic device such as a tablet personal computer ("PC"), a smartphone, a vehicular navigation unit, a camera, the center information display ("CID") of a vehicle, a wristwatch-type electronic device, a personal digital assistant ("PDA"), a portable multimedia player ("PMP"), or a gaming console and a mid- to large-size electronic device such as a television ("TV"), an electronic billboard, a monitor, a PC, or a notebook computer, but the disclosure is not limited thereto. That is, the display device 1 may also be applicable to various other electronic devices without departing from the concept of the invention.

In some embodiments, the display device 1 may have a rectangular shape in a plan view. The display device 1 may have two first sides extending in a first direction DR1 and two second sides extending in a second direction DR2. The corners where the first sides and the second sides of the display device 1 meet may be right-angled, but the disclosure is not limited thereto. Alternatively, the corners where the first sides and the second sides of the display device 1 meet may be curved. In some embodiments, the first sides may be shorter than the second sides, but the disclosure is not limited thereto. The planar shape of the display device 1 is not particularly limited, and the display device 1 may have a circular shape or another shape.

The display device 1 may include a display area DA, which displays an image, and a non-display area NDA, which does not display an image. In some embodiments, the non-display area NDA may be positioned around the display area DA and may surround the display area DA.

Unless specified otherwise, the terms "on", "upper", "above", "top", and "top surface", as used herein, may refer to a third direction DR3, which intersects first and second directions DR1 and DR2, and the terms "below", "lower", "bottom", and "bottom surface", as used herein, may refer to the opposite direction of the third direction DR3.

In one example, the display device 1 may include a display substrate 10, a color converting substrate 30, which faces the display substrate 10, a sealing portion 50, which couples the display substrate 10 and the color converting substrate 30, and a filler 70, which is filled between the display substrate 10 and the color converting substrate 30.

The display substrate 10 may include elements and circuits for displaying an image, such as, for example, pixel circuits (e.g., switching elements), a pixel defining film, which defines, in the display area DA, emission regions and a non-emission region that will be described later, and self-light-emitting elements. In one example, the self-light-emitting elements may include organic light-emitting diodes, quantum-dot light-emitting diodes, inorganic material-based micro-light-emitting diodes (microLEDs), and/or inorganic material-based nano-light-emitting diodes (nanoLEDs). The self-light-emitting elements will hereinafter be described as being OLEDs.

The color converting substrate 30 may be positioned on the display substrate 10 and may face the display substrate 10. The color converting substrate 30 may include color converting patterns for converting the color of incident light. In some embodiments, the color converting patterns may include color filters and/or wavelength converting patterns.

The sealing portion 50 may be positioned between the display substrate 10 and the color converting substrate 30, in the non-display area NDA. The sealing portion 50 may be disposed along the edges of each of the display substrate 10 and the color converting substrate 30, in the non-display area NDA, to surround the display area DA in a plan view. The display substrate 10 and the color converting substrate 30 may be coupled to each other by the sealing portion 50. In some embodiments, the sealing portion 50 may be formed of an organic material. In one example, the sealing portion 50 may be formed of an epoxy resin, but the disclosure is not limited thereto.

The filler 70 may be positioned in the space between the display substrate 10 and the color converting substrate 30, surrounded by the sealing portion 50. The filler 70 may fill the gap between the display substrate 10 and the color converting substrate 30. The filler 70 may be formed of a material capable of transmitting light therethrough. In some embodiments, the filler 70 may be formed of an organic material. In one example, the filler 70 may be formed of a silicone-based organic material or an epoxy-based organic material, but the disclosure is not limited thereto. In some embodiments, the filler 70 may not be provided.

Figure 3:
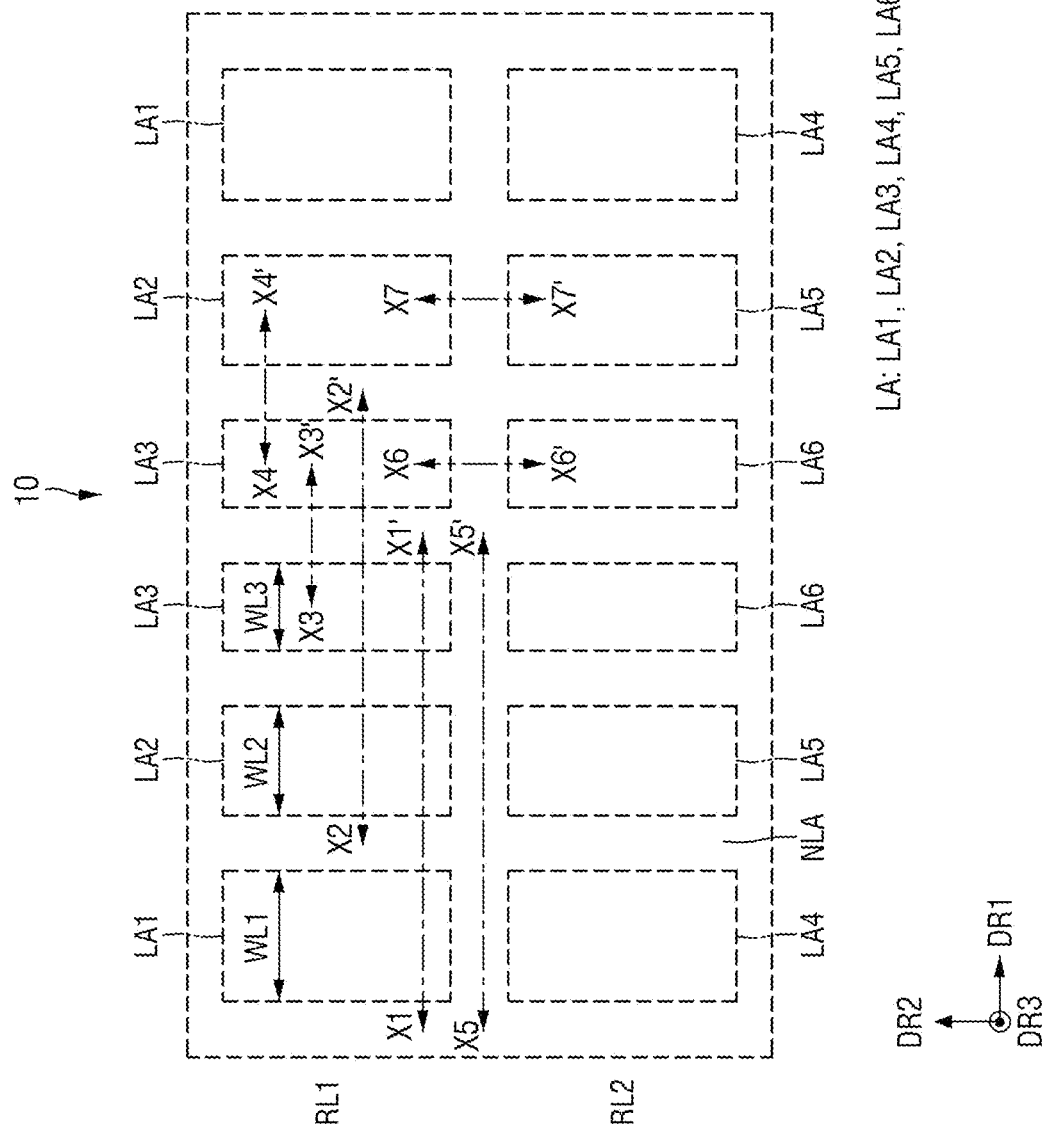
FIG. 3 is a plan view of a display substrate in a display area of the display device of FIGS. 1 and 2.
Figure 4:
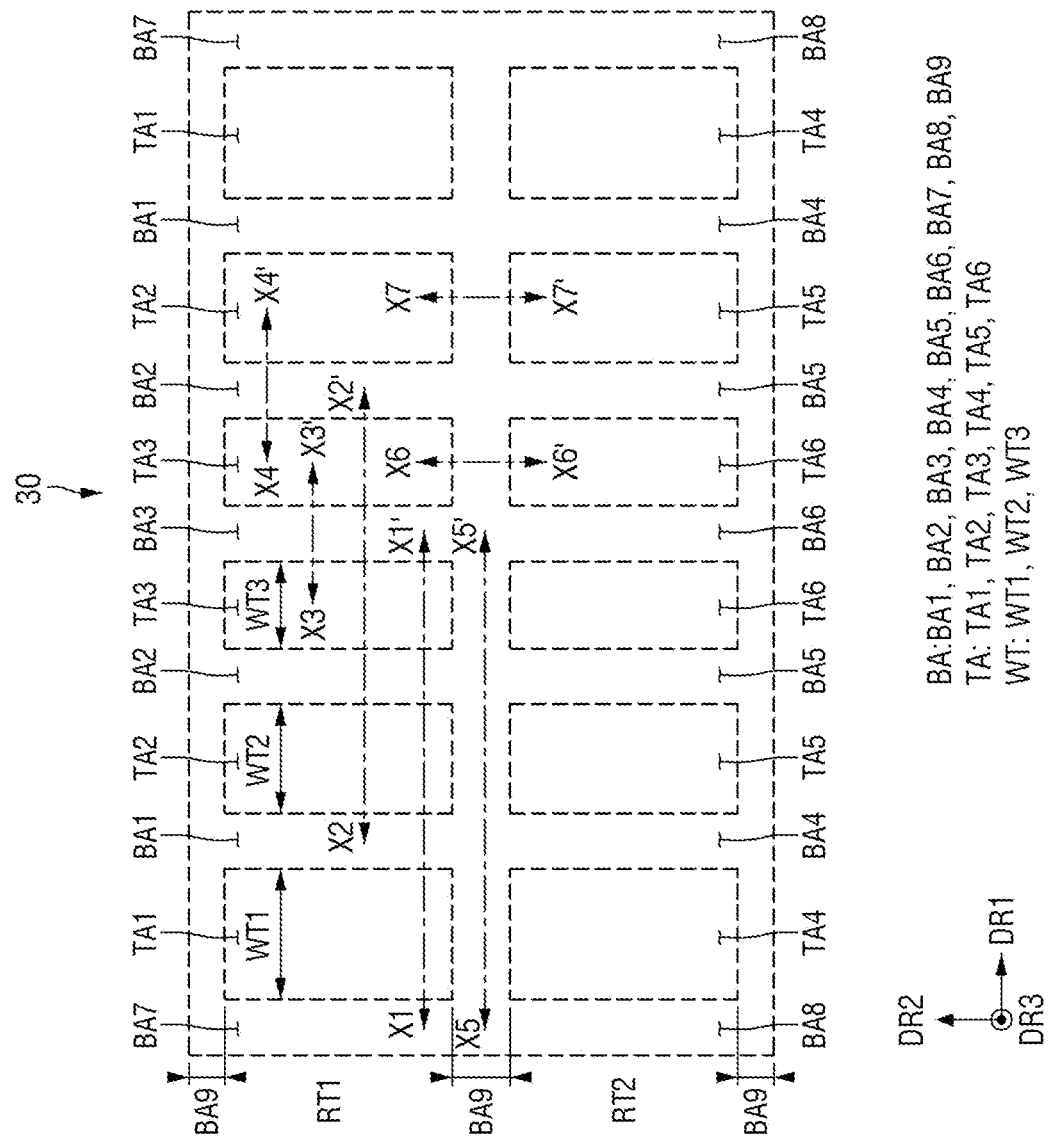
FIG. 4 is a plan view of a color converting substrate in the display area of the display device of FIGS. 1 and 2.

FIG. 3 is a plan view of the display substrate in the display area of the display device of FIGS. 1 and 2. FIG. 4 is a plan view of a color converting substrate in the display area of the display device of FIGS. 1 and 2.

Referring to FIGS. 1 through 4, a plurality of emission regions LA (LA1, LA2, LA3, LA4, LA5, and LA6) and the non-emission region NLA may be defined in the display area DA of the display substrate 10. The emission regions LA (LA1, LA2, LA3, LA4, LA5, and LA6) may be regions through which light generated by light-emitting elements is released to the outside from the display substrate 10, and the non-emission region NLA may be a region through which light is not released to the outside from the display substrate 10.

In one example, light released by the emission regions (LA1, LA2, LA3, LA4, LA5, and LA6) to the outside of the display substrate 10 may be light of a first color. In some embodiments, light of the first color may be blue light and may have a peak wavelength of about 440 nanometers (nm) to about 480 nm.

The display area DA of the display substrate 10 may include emission regions (LA1, LA2, and LA3) that are arranged in a first row RL1 and emission regions (LA4, LA5, and LA6) that are arranged in a second row RL2. First emission regions LA1, second emission regions LA2, and third emission regions LA3 may be arranged in the first row RL1 along the first direction DR1. In one example, the display substrate 10 may include a first region where the first emission regions LA1, the second emission regions LA2, and the third emission regions LA3 are arranged in the order of first, second, and third emission regions LA1, LA2, and LA3 along the first direction DR1 and a second region where the first emission regions LA1, the second emission regions LA2, and the third emission regions LA3 are arranged in the order of third, second, and first emission regions LA3, LA2, and LA1 along the first direction DR1.

In the first row RL1 of the display substrate 10, the first emission regions LA1, the second emission regions LA2, and the third emission regions LA3 may be arranged in the order of first, second, and third emission regions LA1, LA2, and LA3 along the first direction DR1 and then in the order of third, second, and first emission regions LA3, LA2, and LA1 along the first direction DR1. Accordingly, a third emission region LA3 may be disposed adjacent to another third emission region LA3 in the first direction DR1, but the disclosure is not limited thereto. Although not specifically illustrated, a first emission region LA1 may also be disposed adjacent to another first emission region LA1 in the first direction DR1, but the disclosure is not limited thereto. In some embodiments, even a second emission region LA2 may also be disposed adjacent to another second emission region LA2 in the first direction DR1.

The display substrate 10 may include regions where identical emission regions LA (this is a representative name of the emission regions LA1 to LA6) are disposed adjacent to one another. In the second row RL2, which is adjacent to the first row RL1 in the second direction DR2, the fourth emission regions LA4, the fifth emission regions LA5, and the sixth emission regions LA6 may be arranged in the order of fourth, fifth, and sixth emission regions LA4, LA5, and LA6 along the first direction DR1 and then in the order of sixth, fifth, and fourth emission regions LA6, LA5, and LA4 along the first direction DR1. In the regions where identical emission regions LA are disposed adjacent to one another, identical light transmitting regions TA (this is a representative name of the emission regions TA1 to TA6) of the color converting substrate 30 that will be described later may also be disposed adjacent to one another. This will be described later in detail.

In some embodiments, a first width WL1, in the first direction DR1, of first emission regions LA1 may be greater than each of a second width WL2, in the first direction DR1, of second emission regions LA2 and a third width WL3, in the first direction DR1, of third emission regions LA3. Also, the second width WL2 of the second emission regions LA2 may differ from the third width WL3 of the third emission regions LA3. In one example, the second width WL2 of the second emission regions LA2 may be greater than the third width WL3 of the third emission regions LA3 in the first direction DR1. In some embodiments, the size of the first emission regions LA1 may be greater than each of the size of the second emission regions LA2 and the size of the third emission regions LA3. The size of the second emission regions LA2 may be greater than the size of the third emission regions LA3.

However, the disclosure is not limited to this. The first width WL1 of the first emission regions LA1, the second width WL2 of the second emission regions LA2, and the third width WL3 of the third emission regions LA3 may all be substantially the same in another embodiment. Also, in some embodiments, the size of the second emission regions LA2 may be smaller than the size of the third emission regions LA3. Also, the size of the first emission regions LA1, the size of the second emission regions LA2, and the size of the third emission regions LA3 may all be substantially the same in another embodiment. The width of emission regions LA is illustrated as gradually decreasing from the first emission regions LA1 to the third emission regions LA3, but the disclosure is not limited thereto.

Fourth emission regions LA4, which are adjacent to their respective first emission regions LA1 in the second direction DR2, may be the same as the first emission regions LA1 except that they are arranged in the second row RL2, and the width, size, and arrangement of the fourth emission regions LA4 may be substantially the same as the width, size, and arrangement of the first emission regions LA1. Similarly, fifth emission regions LA5, which are adjacent to their respective second emission regions LA2 in the second direction DR2, may substantially the same structure as the second emission regions LA2, and sixth emission regions LA6, which are adjacent to their respective third emission regions LA3 in the second direction DR2, may substantially the same structure as the third emission regions LA3.

The color converting substrate 30 may face the display substrate 10 in a plan view. A plurality of light transmitting regions TA (TA1, TA2, TA3, TA4, TA5, and TA6) and light blocking regions BA may be defined in the display area DA of the color converting substrate 30. The light transmitting regions TA (TA1, TA2, TA3, TA4, TA5, and TA6) may be regions through which light emitted from the display substrate 10 is provided to the outside of the display substrate 10 through the color converting substrate 30. The light blocking regions BA may be regions that do not transmit light emitted from the display substrate 10 therethrough.

The color converting substrate 30 may include light transmitting regions (TA1, TA2, and TA3) that are arranged in a first row RT1 and light transmitting regions (TA4, TA5, and TA6) that are arranged in a second row RT2. First light transmitting regions TA1, second light transmitting regions TA2, and third light transmitting regions TA3 may be arranged in the first row RT1 along the first direction DR1. In one example, the color converting substrate 30 may include a first region where the first light transmitting regions TA1, the second light transmitting regions TA2, and the third light transmitting regions TA3 are arranged in the order of first, second, and third light transmitting regions TA1, TA2, and TA3 along the first direction DR1 and a second region where the first light transmitting regions TA1, the second light transmitting regions TA2, and the third light transmitting regions TA3 are arranged in the order of third, second, and first light transmitting regions TA3, TA2, and TA1 along the first direction DR1.

First light transmitting regions TA1 may correspond to or overlap with the first emission regions LA1 in the plan view. Similarly, second light transmitting regions TA2 may correspond to or overlap with the second emission regions LA2, and third light transmitting regions TA3 may correspond to or overlap with the third emission regions LA3 in the plan view. As described above, the first emission regions LA1, the second emission regions LA2, and the third emission regions LA3 may be arranged in the order of first, second, and third emission regions LA1, LA2, and LA3 or third, second, and first emission regions LA3, LA2, and LA1 in the first direction DR1, and the first light transmitting regions TA1, the second light transmitting regions TA2, and the third light transmitting regions TA3, which correspond to or overlap with the first emission regions LA1, the second emission regions LA2, and the third emission regions LA3 in the plan view, respectively, may be arranged in the order of first, second, and third light transmitting regions TA1, TA2, and TA3 or third, second, and first light transmitting regions TA3, TA2, and TA1 in the first direction DR1. The third light transmitting regions TA3 are illustrated as being disposed adjacent to each other, but the disclosure is not limited thereto. The first light transmitting region TA1 may also be disposed adjacent to other first light transmitting regions TA1, but the disclosure is not limited thereto. Alternatively, the second light transmitting regions TA2 may be disposed adjacent to other second light transmitting regions TA2.

First-color light provided by the display substrate 10 may be provided to the outside of the display device 1 through the first light transmitting regions TA1, the second light transmitting regions TA2, and the third light transmitting regions TA3. When light emitted from the first light transmitting regions TA1 to the outside of the display device 1 is referred to as first outgoing light, light emitted from the second light transmitting regions TA2 to the outside of the display device 1 is referred to as second outgoing light, and light emitted from the third light transmitting regions TA3 to the outside of the display device 1 is referred to as third outgoing light, the third outgoing light may be light of the first color, the second outgoing light may be light of a second color, which is different from the first color. The first outgoing light may be light of a third color, which is different from the first and second colors. In some embodiments, light of the first color may be blue light having a peak wavelength of about 440 nm to about 480 nm, light of the second color may be green light having a peak wavelength of about 510 nm to about 550 nm, and light of the third color may be red light having a peak wavelength of about 610 nm to about 650 nm.

In the second row RT2, which is adjacent to the first row RT1 in the second direction DR2, fourth light transmitting regions TA4, fifth light transmitting regions TA5, and sixth light transmitting regions TA6 may be arranged. The fourth light transmitting regions TA4, the fifth light transmitting regions TA5, and the sixth light transmitting regions TA6 may be arranged in the order of fourth, fifth, and sixth light transmitting regions TA4, TA5, and TA6 or sixth, fifth, and fourth light transmitting regions TA6, TA5, and TA4 in the first direction DR1. The fourth emission regions TA4 may correspond to or overlap with the fourth emission regions LA4, the fifth light transmitting regions TA5 may correspond to or overlap with the fifth emission regions LA5, and the sixth light transmitting regions TA6 may correspond to or overlap with the sixth emission regions LA6 in the plan view.

In some embodiments, a width WT this is a representative name of the widths WT1 to WT3), in the first direction DR1, of the first light transmitting regions TA1, the second light transmitting regions TA2, and the third light transmitting regions TA3 may be similar to the width of the first emission regions LA1, the second emission regions LA2, and the third emission regions LA3. In one example, a first width WT1, in the first direction DR1, of the first light transmitting regions TA1 may be greater than each of a second width WT2, in the first direction DR1, of the second light transmitting regions TA2 and a third width WT3, in the first direction DR1, of the third light transmitting regions TA3. Also, the second width WT2 of the second light transmitting regions TA2 may differ from the third width WT3 of the third light transmitting regions TA3. In one example, the second width WT2 of the second light transmitting regions TA2 may be greater than the third width WT3 of the third light transmitting regions TA3.

Also, in some embodiments, size of the first light transmitting regions TA1 may be greater than each of the sizes of the second light transmitting regions TA2 and the third light transmitting regions TA3, and the size of the second light transmitting regions TA2 may be greater than the size of the third light transmitting regions TA3. The configurations of the fourth light transmitting regions TA4, the fifth light transmitting regions TA5, and the sixth light transmitting regions TA6 may be substantially the same as the configurations of the first light transmitting regions TA1, the second light transmitting regions TA2, and the third light transmitting regions TA3, which are adjacent to the fourth light transmitting regions TA4, the fifth light transmitting regions TA5, and the sixth light transmitting regions TA6, respectively, in the second direction DR2. The colors of light emitted to the outside of the display device 1 through the fourth light transmitting regions TA4, the fifth light transmitting regions TA5, and the sixth light transmitting regions TA6 may be substantially the same as the colors of light emitted to the outside of the display device 1 through the first light transmitting regions TA1, the second light transmitting regions TA2, and the third light transmitting regions TA3, respectively.

The light blocking regions BA may be positioned around the light transmitting regions (TA1, TA2, TA3, TA4, TA5, and TA6), in the display area DA of the color converting substrate 30. In some embodiments, the light blocking regions BA may include first light blocking regions BA1, second light blocking regions BA2, a third light blocking region BA3, fourth light blocking regions BA4, fifth light blocking regions BA5, a sixth light blocking region BA6, seventh light blocking regions BA7, eighth light blocking regions BAB, and ninth light blocking regions BA9.

The first light blocking regions BA1 may be positioned between the first light transmitting regions TA1 and the second light transmitting regions TA2, along the first direction DR1, the second light blocking regions BA2 may be positioned between the second light transmitting regions TA2 and the third light transmitting regions TA3, along the first direction DR1, and the third light transmitting region BA3 may be positioned between the third light transmitting regions TA3, along the first direction DR1. The seventh light blocking regions BA7 may be positioned between the first light transmitting regions TA1 and other first light transmitting regions TA1 (not illustrated). That is, the first light blocking regions BA1 and the second light blocking regions BA2 may each be positioned between two different adjacent light transmitting regions, for example, between first and second light transmitting regions TA1 and TA2 or between second and third light transmitting regions TA2 and TA3. Each of the third light blocking region BA3 and the seventh light blocking regions BA7 may be positioned between two identical adjacent light transmitting regions, for example, between two first light transmitting regions TA1 or between two third light transmitting regions TA3.

The fourth light blocking regions BA4 may be positioned between the fourth light transmitting regions TA4 and the fifth light transmitting regions TA5, along the first direction DR1, the fifth light blocking regions BA5 may be positioned between the fifth light transmitting regions TA5 and the sixth light transmitting regions TA6, along the first direction DR1, and the sixth light blocking region BA6 may be positioned between the sixth light transmitting regions TA6, along the first direction DR1. The eighth light blocking regions BA8 may be positioned between the fourth light transmitting regions TA4 and other fourth light transmitting regions TA4 (not illustrated). That is, the fourth light blocking regions BA4 and the fifth light blocking regions BA5 may each be positioned between two different adjacent light transmitting regions, for example, between fourth and fifth light transmitting regions TA4 and TA5 or between fifth and sixth light transmitting regions TA5 and TA6. Each of the sixth light blocking region BA6 and the eighth light blocking regions BA8 may be positioned between two identical adjacent light transmitting regions, for example, between two sixth light transmitting regions TA6 or between two fourth light transmitting regions TA4.

The ninth light blocking regions BA9 may be positioned between the first and second rows RT1 and RT2, which are adjacent to each other in the second direction DR2.

The structure of the display device 1 will hereinafter be described in detail.

Figure 5:
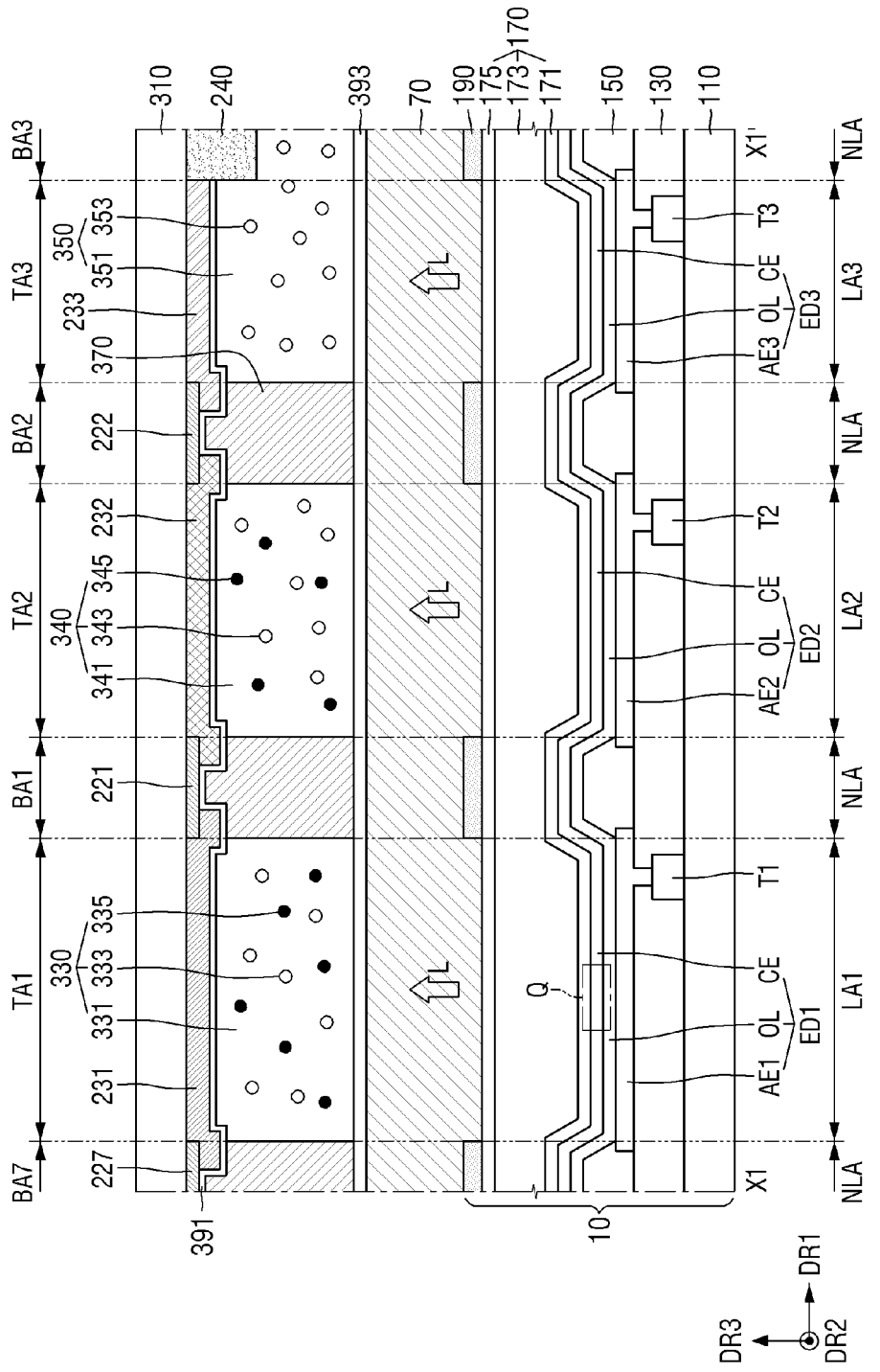
FIG. 5 is a cross-sectional view taken along line X1-X1' of FIGS. 3 and 4.
Figure 6:
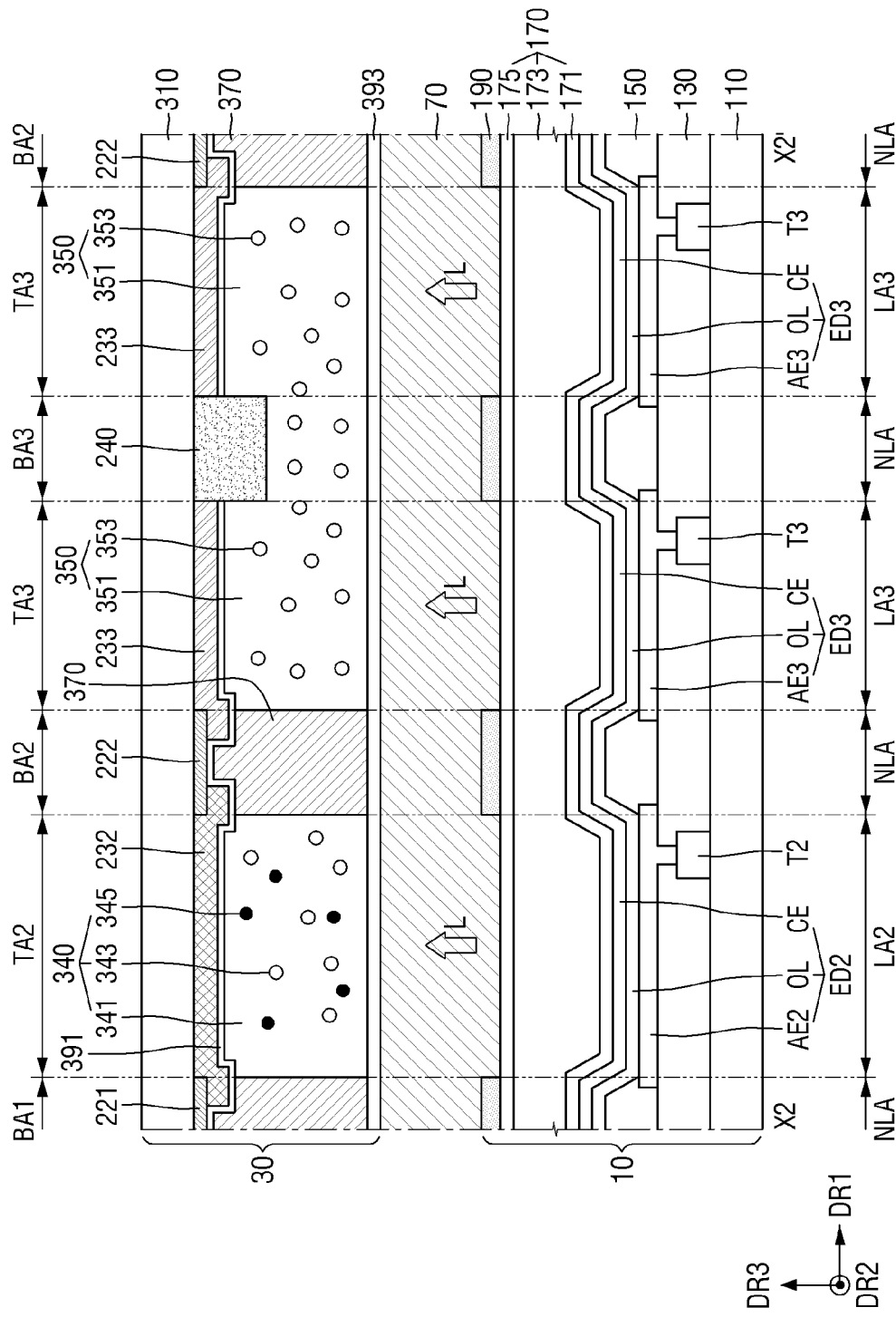
FIG. 6 is a cross-sectional view taken along line X2-X2' of FIGS. 3 and 4.
Figure 7:
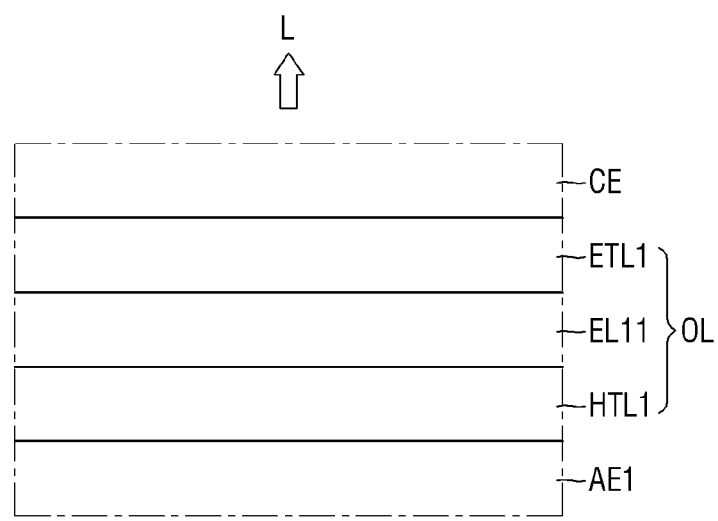
FIG. 7 is an enlarged cross-sectional view of part Q of FIG. 5.
Figure 8:
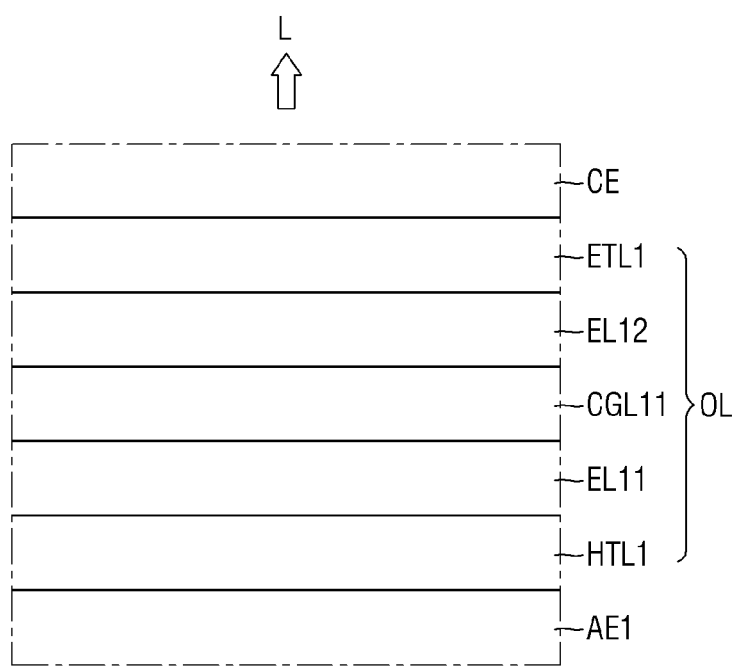
FIGS. 8 and 9 are cross-sectional views of modified examples of the part Q of FIG. 7.
Figure 9:
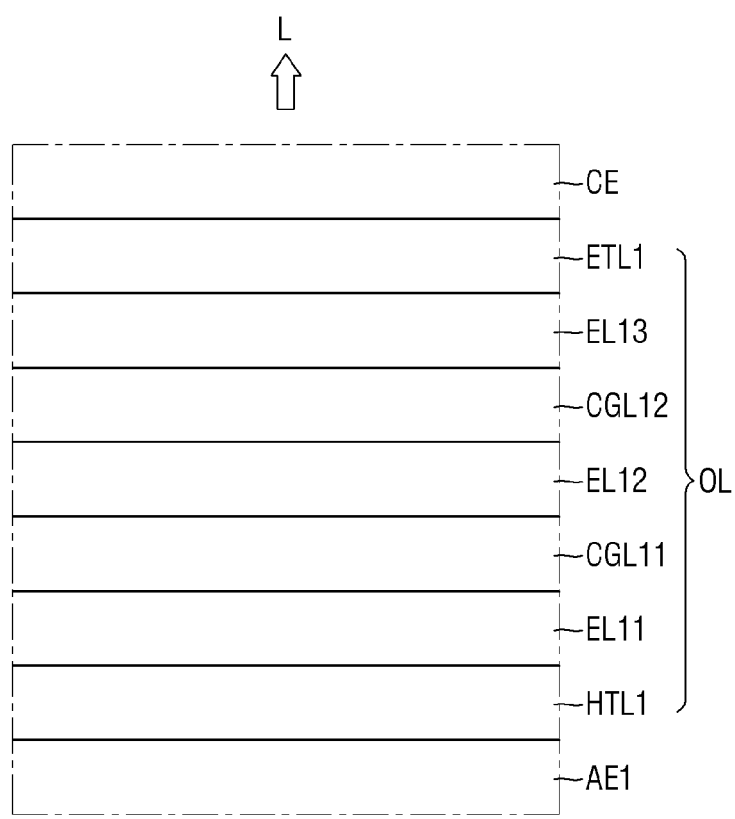

FIG. 5 is a cross-sectional view taken along line X1-X1' of FIGS. 3 and 4. FIG. 6 is a cross-sectional view taken along line X2-X2' of FIGS. 3 and 4. FIG. 7 is an enlarged cross-sectional view of part Q of FIG. 5. FIGS. 8 and 9 are cross-sectional views of modified examples of the part Q of FIG. 7.

FIG. 5 is a cross-sectional view taken across first, second, and third emission regions LA1, LA2, and LA3 of the display substrate 10 and across first, second, and third light transmitting regions TA1, TA2, and TA3 of the color converting substrate 30. FIG. 6 is a cross-sectional view taken across a second emission region LA2, a third emission region LA3, and another third emission region LA3 of the display substrate 10 and across a second light transmitting region TA2, a third light transmitting region TA3, and another third light transmitting region TA3 of the color converting substrate 30.

Referring to FIGS. 5 through 9 and further to FIGS. 3 and 4, the display device 1 may include the display substrate 10 and the color converting substrate 30, as described above, and may further include the filler 70, which is positioned between the display substrate 10 and the color converting substrate 30. The display substrate 10 will hereinafter be described in detail.

The display substrate 10 may include a first base part 110 and a plurality of switching elements (T1, T2, and T3), which are disposed on the first base part 110.

The first base part 110 may be formed of a material a light transmitting property. In some embodiments, the first base part 110 may be a glass substrate or a plastic substrate. In a case where the first base part 110 is a plastic substrate, the first base part 110 may have flexibility. In some embodiments, the first base part 110 may include a separate layer (e.g., a buffer layer or an insulating layer) positioned on a glass substrate or a plastic substrate. In some embodiments, the emission regions (LA1, LA2, LA3, LA4, LA5, and LA6) and the non-emission region NLA may be defined on the first base part 110.

The switching elements (T1, T2, and T3) may be disposed on the first base part 110. In some embodiments, first switching elements T1 may be positioned in the first emission regions LA1, second switching elements T2 may be positioned in the second emission regions LA2, and third switching elements T3 may be positioned in the third emission regions LA3. However, the disclosure is not limited to this. In other embodiments, the first switching elements T1, the second switching elements T2, and/or the third switching elements T3 may be positioned in the non-emission region NLA.

In some embodiments, the first switching elements T1, the second switching elements T2, and the third switching elements T3 may be thin-film transistors including polysilicon or an oxide semiconductor.

Although not specifically illustrated, a plurality of signal lines (e.g., gate lines, data lines, and power lines) for transmitting signals to each switching element may be further disposed on the first base part 110.

An insulating film 130 may be disposed on the first switching elements T1, the second switching elements T2, and the third switching elements T3. In some embodiments, the insulating film 130 may be a planarization film. In some embodiments, the insulating film 130 may be formed as an organic film. In one example, the insulating film 130 may include an acrylic resin, an epoxy resin, an imide resin, or an ester resin. In some embodiments, the insulating film 130 may include a positive photosensitive material or a negative photosensitive material.

First anode electrodes AE1, second anode electrodes AE2, and third anode electrodes AE3 may be disposed on the insulating film 130. The first anode electrodes AE1 may be positioned in the first emission regions LA1 and may extend at least in part into the non-emission region NLA. The second anode electrodes AE2 may be positioned in the second emission regions LA2 and may extend at least in part into the non-emission region NLA, and the third anode electrodes AE3 may be positioned in the third emission regions LA3 and may extend at least in part into the non-emission region NLA. The first anode electrodes AE1 may be connected to the first switching elements T1 through the insulating film 130, the second anode electrodes AE2 may be connected to the second switching elements T2 through the insulating film 130, and the third anode electrodes AE3 may be connected to the third switching elements T3 through the insulating film 130.

In some embodiments, the first anode electrodes AE1, the second anode electrodes AE2, and the third anode electrodes AE3 may have different widths or areas from each other. In one example, the width of the first anode electrodes AE1 may be greater than the width of the second anode electrodes AE2, and the width of the second anode electrodes AE2 may be smaller than the width of the first anode electrodes AE1, but greater than the width of the third anode electrodes AE3. The area of the first anode electrodes AE1 may be greater than the area of the second anode electrodes AE2, and the area of the second anode electrodes AE2 may be smaller than the area of the first anode electrodes AE1, but greater than the area of the third anode electrodes AE3. However, the disclosure is not limited to this. Alternatively, the area of the first anode electrodes AE1 may be smaller than the area of the second anode electrodes AE2, and the area of the third anode electrodes AE3 may be greater than the area of the second anode electrodes AE2 and the area of the first anode electrodes AE1. Alternatively, the first anode electrodes AE1, the second anode electrodes AE2, and the third anode electrodes AE3 may have substantially the same width or area.

The first anode electrodes AE1, the second anode electrodes AE2, and the third anode electrodes AE3 may be reflective electrodes, in which case, the first anode electrodes AE1, the second anode electrodes AE2, and the third anode electrodes AE3 may be metal layers including a metal such as Ag, Mg, Al, Pt, Pd, Au, Ni, Nd, Ir, or Cr. In some embodiments, the first anode electrodes AE1, the second anode electrodes AE2, and the third anode electrodes AE3 may further include metal oxide layers deposited on the metal layers. In one example, the first anode electrodes AE1, the second anode electrodes AE2, and the third anode electrodes AE3 may have a double-layer structure such as ITO/Ag, Ag/ITO, ITO/Mg, or ITO/MgF or a multilayer structure such as ITO/Ag/ITO.

A pixel defining film 150 may be disposed on the first anode electrodes AE1, the second anode electrodes AE2, and the third anode electrodes AE3. The pixel defining film 150 may include openings that expose the first anode electrodes AE1, openings that expose the second anode electrodes AE2, and openings that expose the third anode electrodes AE3 and may define the first emission regions LA1, the second emission regions LA2, the third emission regions LA3, and the non-emission region NLA. That is, parts of the first node electrodes AE1 not covered, but exposed by the pixel defining film 150 may be the first emission regions LA1. Similarly, parts of the second node electrodes AE2 not covered, but exposed by the pixel defining film 150 may be the second emission regions LA2, and parts of the third node electrodes AE3 not covered, but exposed by the pixel defining film 150 may be the third emission regions LA3. The pixel defining film 150 may be positioned in the non-emission region NLA.

In some embodiments, the pixel defining film 150 may include an organic insulating material such as an acrylic resin, an epoxy resin, a phenolic resin, a polyamide resin, a polyimide resin, an unsaturated polyester resin, a polyphenylene resin, a polyphenylene sulfide resin, or benzocyclobutene ("BCB").

In some embodiments, parts of the pixel defining film 150 may overlap with light blocking members 220, barriers 370, and a light blocking pattern 240 in the plan view. Here, the light blocking member 220 is a representative name of a first to nine light blocking member 221 to 229. In one example, as illustrated in FIG. 5, the pixel defining film 150 may overlap with first light blocking members 221, second light blocking members 222, seventh light blocking members 227, and the barriers 370 in the plan view. Also, the pixel defining film 150 may overlap with the light blocking pattern 240, which is positioned between the third light transmitting regions TA3.

An emission layer OL may be positioned on the first anode electrodes AE1, the second anode electrodes AE2, and the third anode electrodes AE3. In some embodiments, the emission layer OL may have the shape of a continuous film formed across the emission regions (LA1, LA2, LA3, LA4, LA5, and LA6) and the non-emission region NLA. The emission layer OL will be described later in detail.

A cathode electrode CE may be disposed on the emission layer OL. In some embodiments, the cathode electrode CE may be semi-transmissive or transmissive. In a case where the cathode electrode CE is semi-transmissive, the cathode electrode CE may include Ag, Mg, Cu, Al, Pt, Pd, Au, Ni, Nd, Ir, Cr, Li, Ca, LiF/Ca, LiF/Al, Mo, Ti, or a compound or mixture thereof (e.g., the mixture of Ag and Mg). Also, in a case where the cathode electrode CE has a thickness of several tens to hundreds of angstroms, the cathode electrode CE may have semi-transmissivity.

In a case where the cathode electrode CE is transmissive, the cathode electrode CE may include a transparent conductive oxide ("TCO"). In one example, the cathode electrode CE may include tungsten oxide ($W_xO_x$), titanium oxide ($TiO_2$), indium tin oxide ("ITO"), indium zinc oxide ("IZO"), zinc oxide (ZnO), indium tin zinc oxide ("ITZO"), or magnesium oxide (MgO).

The first anode electrodes AE1, the emission layer OL, and the cathode electrode CE may form first light-emitting elements ED1, the second anode electrodes AE2, the emission layer OL, and the cathode electrode CE may form second light-emitting elements ED2, and the third anode electrodes AE3, the emission layer OL, and the cathode electrode CE may form third light-emitting elements ED3. The first light-emitting elements ED1, the second light-emitting elements ED2, and the third light-emitting elements ED3 may emit outgoing light L, and the outgoing light L may be provided to the color converting substrate 30.

The display substrate 10 of the display device 1 may include first-type light-emitting elements that are adjacent to light-emitting elements ED of different types therefrom and second-type light-emitting elements that are adjacent to light-emitting elements of their type. As illustrated in FIGS. 5 and 6, a second light-emitting element ED2 is adjacent to light-emitting elements ED of different types therefrom, i.e., first and third light-emitting elements ED1 and ED3, in the first direction DR1 and may thus be a first-type light-emitting element.

On the contrary, a third light-emitting elements ED3 is adjacent to a second light-emitting element ED2 and another third light-emitting element ED3. That is, a third light-emitting element ED3 may be disposed adjacent to another light-emitting element of its type, i.e., another third light-emitting element ED3, and may thus be a second-type light-emitting element. Although not specifically illustrated, a first light-emitting element ED1 is adjacent to another first light-emitting element ED1 and a second light-emitting element ED2 in the first direction DR1 and may thus be a second-type light-emitting element.

The arrangement of the light-emitting elements ED may be associated with the arrangement of the emission regions LA and the light transmitting regions TA. As described above, as the third emission regions LA3 are disposed adjacent to each other and the third light transmitting regions TA3 are disposed adjacent to each other, the third light-emitting elements ED3 may also be disposed adjacent to each other. This type of arrangement of the light-emitting elements ED may be obtained by arranging two identical light transmitting regions such as third light transmitting regions TA3 adjacent to each other in the color converting substrate 30 and arranging two identical light-emitting elements adjacent to each other to correspond to the two identical light transmitting regions. The barriers 370 and the light blocking members 220 may not be provided between the third light transmitting regions TA3 of the color converting substrate 30, and the light blocking pattern 240 may be disposed between the third light transmitting regions TA3 of the color converting substrate 30. This will be described later in detail.

The emission layer OL of the light-emitting elements ED may have a stack of multiple layers. As illustrated in FIGS. 7 through 9, the emission layer OL may include a first hole transport layer HTL1, which is positioned on the first anode electrodes AE1, a first light-emitting material layer EL11, which is positioned on the first hole transport layer HTL1, and a first electron transport layer ETL1, which is positioned on the first light-emitting material layer EL11. The emission layer OL may include only one light-emitting layer, for example, only the first light-emitting material layer EL11 as a light-emitting layer, and the first light-emitting material layer EL11 may be a blue light-emitting layer. However, the stack structure of the emission layer OL is not particularly limited to that illustrated in FIG. 7 and may vary, as illustrated in FIGS. 8 and 9.

Referring to FIG. 8, the emission layer OL may further include a first charge generation layer CGL11, which is positioned on a first light-emitting material layer EL11, and a second light-emitting material layer EL12, which is positioned on the first charge generation layer CGL11, and a first charge transport layer ETL1 may be positioned on the second light-emitting material layer EL12.

The first charge generation layer CGL11 may inject charges into each light-emitting layer adjacent thereto. The first charge generation layer CGL11 may control the charge balance between the first and second light-emitting material layers EL11 and EL12. In some embodiments, the first charge generation layer CGL11 may include an n-type charge generation layer and a p-type charge generation layer. The p-type charge generation layer may be disposed on the n-type charge generation layer.

The second light-emitting material layer EL12, like the first light-emitting material layer EL11, may emit blue light, but the disclosure is not limited thereto. The second light-emitting material layer EL12 may emit blue light having the same peak wavelength as, or a different peak wavelength from, the first light-emitting material layer EL11. Alternatively, the first and second light-emitting material layers EL11 and EL12 may emit light of different colors. That is, the first light-emitting material layer EL11 may emit blue light, and the second light-emitting material layer EL12 may emit green light.

As the above-described emission layer OL includes two light-emitting layers, the emission efficiency and the life of the emission layer OL can be improved as compared to the example of FIG. 7.

FIG. 9 illustrates an example in which the emission layer OL includes three light-emitting material layers (EL11, EL12, and EL13) and two charge generation layers (CGL11 and CGL12). Referring to FIG. 9, the emission layer OL may further include a first charge generation layer CGL11, which is positioned on a first light-emitting material layer EL11, a second light-emitting material layer EL12, which is positioned on the first charge generation layer CGL11, a second charge generation layer CGL12, which is positioned on the second light-emitting material layer EL12, and a third light-emitting material layer EL13, which is positioned on the second charge generation layer CGL12. A first charge transport layer ETL1 may be positioned on the third light-emitting material layer EL13.

The third light-emitting material layer EL13, like the first and second light-emitting material layers EL11 and EL12, may emit blue light. In one example, the first, second, and third light-emitting material layers EL11, EL12, and EL13 may all emit blue light. The peak wavelengths of beams of blue light emitted by the first, second, and third light-emitting material layers EL11, EL12, and EL13 may all have the same peak wavelength, or some of the wavelengths of the beams of blue light emitted by the first, second, and third light-emitting material layers EL11, EL12, and EL13 may differ. Alternatively, the first, second, and third light-emitting material layers EL11, EL12, and EL13 may emit light of different colors. In one example, each of the first, second, and third light-emitting material layers EL11, EL12, and EL13 may emit blue or green light or may emit red light, green light, and blue light, thereby emitting white light as a whole.

Referring again to FIGS. 5 and 6, a thin-film encapsulation layer 170 is disposed on the cathode electrode CE. The thin-film encapsulation layer 170 may be disposed in common in the first emission regions LA1, the second emission regions LA2, the third emission regions LA3, and the non-emission region NLA. In some embodiments, the thin-film encapsulation layer 170 may directly cover the cathode electrode CE. In some embodiments, a capping layer (not illustrated), which covers the cathode electrode CE, may be further disposed between the thin-film encapsulation layer 170 and the cathode electrode CE, in which case, the thin-film encapsulation layer 170 may directly cover the capping layer.

In some embodiments, the thin-film encapsulation layer 170 may include a first encapsulation inorganic film 171, an encapsulation organic film 173, and a second encapsulation inorganic film 175, which are sequentially deposited on the cathode electrode CE.

In some embodiments, the first and second encapsulation inorganic films 171 and 175 may be formed of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), or lithium fluoride.

In some embodiments, the encapsulation organic film 173 may be formed of an acrylic resin, a methacrylic resin, polyisoprene, a vinyl-based resin, an epoxy-based resin, a urethane-based resin, a cellulose-based resin, or a perylene-based resin.

The structure of the thin-film encapsulation layer 170 is not particularly limited and may vary.

A panel light-blocking member 190 may be positioned on the thin-film encapsulation layer 170. The panel light-blocking member 190 may be positioned on the thin-film encapsulation layer 170, in the non-emission region NLA. The panel light-blocking member 190 may prevent light from infiltrating between adjacent emission regions to cause color mixing, and as a result, color reproducibility can be further improved.

In some embodiments, the panel light-blocking member 190 may be positioned in the non-emission region NLA and may be disposed to surround the emission regions (LA1, LA2, LA3, LA4, LA5, and LA6) in a plan view.

The panel light-blocking member 190 may include an organic light blocking material and may be formed by coating an organic light blocking material and subjecting the organic light blocking material to an exposure process.

The color converting substrate 30 will hereinafter be described.

Figure 10:
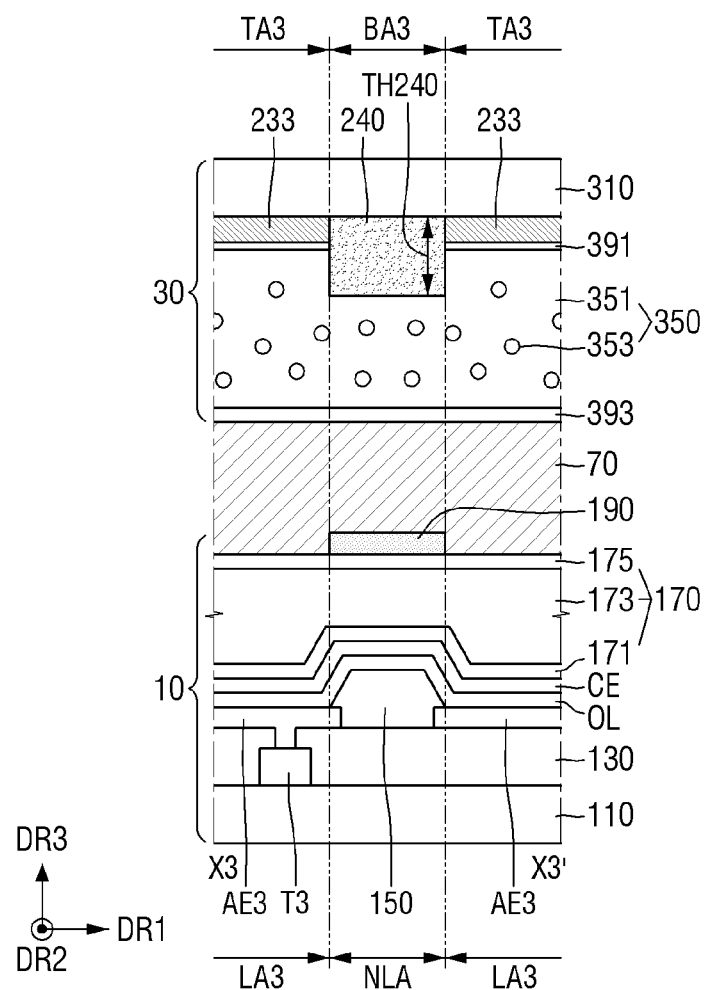
FIG. 10 is a cross-sectional view taken along line X3-X3' of FIGS. 3 and 4.
Figure 11:
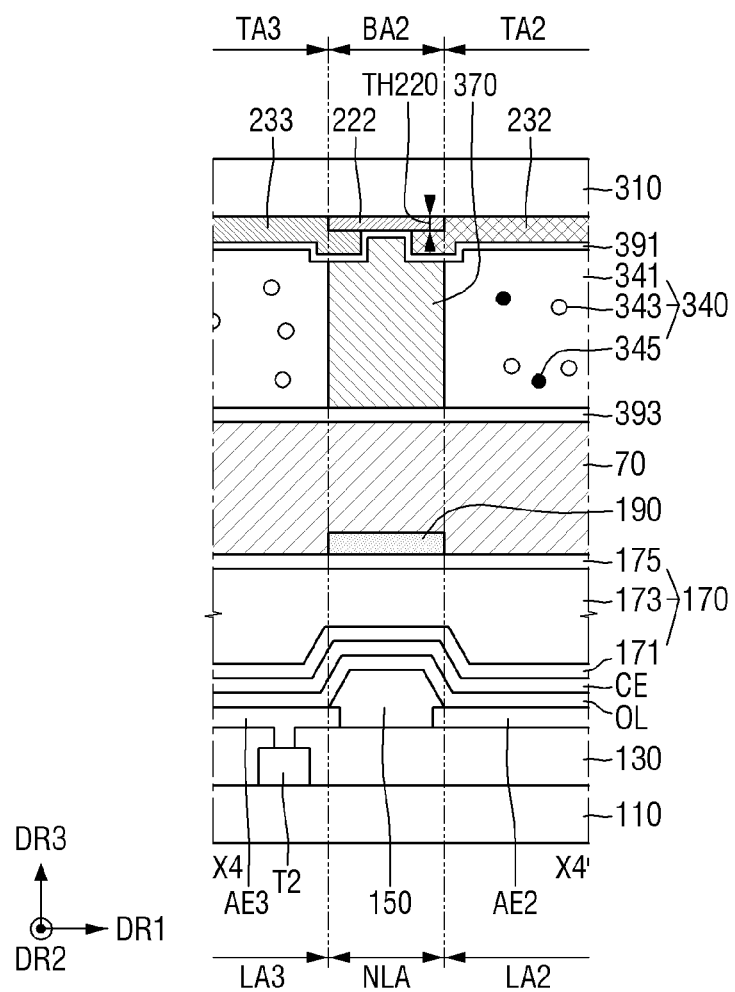
FIG. 11 is a cross-sectional view taken along line X4-X4' of FIGS. 3 and 4.

FIG. 10 is a cross-sectional view taken along line X3-X3' of FIGS. 3 and 4. FIG. 11 is a cross-sectional view taken along line X4-X4' of FIGS. 3 and 4.

Referring to FIGS. 10 through 17 and further to FIGS. 3 through 6, the color converting substrate 30 may include a second base part 310, a plurality of color filters (231, 232, and 233), a plurality of light blocking members (221, 222, and 227), the light blocking pattern 240, the barriers 370, a plurality of wavelength converting patterns (330 and 340), and light transmitting patterns 350.

The second base part 310 may be formed of a light transmitting material. In some embodiments, the second base part 310 may include a glass substrate or a plastic substrate. In some embodiments, the second base part 310 may further include a separate layer (e.g., an insulating layer such as an inorganic film) positioned on the glass substrate or the plastic substrate. As described above, the light transmitting regions (TA1, TA2, TA3, TA4, TA5, and TA6) and the light blocking regions BA of FIG. 4 may be defined on the second base part 310, and detailed descriptions thereof will be omitted.

The color filters (231, 232, and 233), the light blocking members (221, 222, and 227), and the light blocking pattern 240 may be positioned on a surface of the second base part 310 that faces the display substrate 10.

The color filters (231, 232, and 233) may include first color filters 231, second color filters 232, and third color filters 233.

The first color filters 231 may be positioned on the surface of the second base part 310, in the first light transmitting regions TA1 and the fourth light transmitting regions TA4. In some embodiments, first color filters 231 positioned in the first light transmitting regions TA1 and first color filters 231 positioned in the fourth light transmitting regions TA4 may be connected to one another. That is, first color filters 231 positioned in the first row RT1 may be connected to first color filters 231 positioned in the second row RT2. The first color filters 231 may extend in the second direction DR2, and ninth light blocking members 229 that will be described later may be positioned in the overlapping areas of the first color filters 231 and the ninth light blocking regions BA9. The ninth light blocking members 229 may divide the first light transmitting regions TA1 and the fourth light transmitting regions TA4 in the second direction DR2.

However, the disclosure is not limited to this. Alternatively, the first color filters 231 positioned in the first light transmitting regions TA1 may be spaced apart from the first color filters 231 positioned in the fourth light transmitting regions TA4. That is, the first color filters 231 may be arranged as stripes that extend in the second direction DR2 or as islands that are spaced apart from one another in the second direction DR2.

The first color filters 231 may selectively transmit light of the third color (e.g., red light) therethrough and may block or absorb light of the first color (e.g., blue light) and light of the second color (e.g., green light). In some embodiments, the first color filters 231 may be red color filters and may include a red colorant such as a red dye or a red pigment. The term "colorant", as used herein, may be understood as encompassing both a dye and a pigment.

The second color filters 232 and the third color filters 233, like the first color filters 231, may also be disposed on the surface of the second base part 310. The second color filters 232 may be positioned in the second light transmitting regions TA2 and the fifth light transmitting regions TA5, and the third color filters 233 may be positioned in the third light transmitting regions TA3 and the sixth light transmitting regions TA6. In some embodiments, as the second color filters 232 and the third color filters 233 extend in the second direction DR2, second color filters 232 positioned in the first row RT1 and third color filters 233 positioned in the first row RT1 may be connected to second color filters 232 positioned in the second row RT2 and third color filters 233 positioned in the second row RT2. The ninth light blocking members 229 that will be described later may be positioned in the overlapping areas of the second color filters 232 and the ninth light blocking regions BA9 and of the third color filters 233 and the ninth light blocking regions BA9. However, the disclosure is not limited to this. Alternatively, the second color filters 232 and the third color filters 233 may also be spaced apart between the first and second rows RT1 and RT2. That is, the second color filters 232 and the third color filters 233 may also be arranged as stripes that extend in the second direction DR2 or as islands that are spaced apart from one another in the second direction DR2.

The second color filters 232 may selectively transmit light of the second color (e.g., green light) therethrough and may block or absorb light of the first color (e.g., blue light) and light of the third color (e.g., red light). In some embodiments, the second color filters 232 may be green color filters and may include a green colorant such as a green dye or a green pigment.

The third color filters 233 may selectively transmit light of the first color (e.g., blue light) therethrough and may block or absorb light of the second color (e.g., green light) and light of the third color (e.g., red light). In some embodiments, the third color filters 233 may be blue color filters and may include a blue colorant such as a blue dye or a blue pigment.

Figure 13:
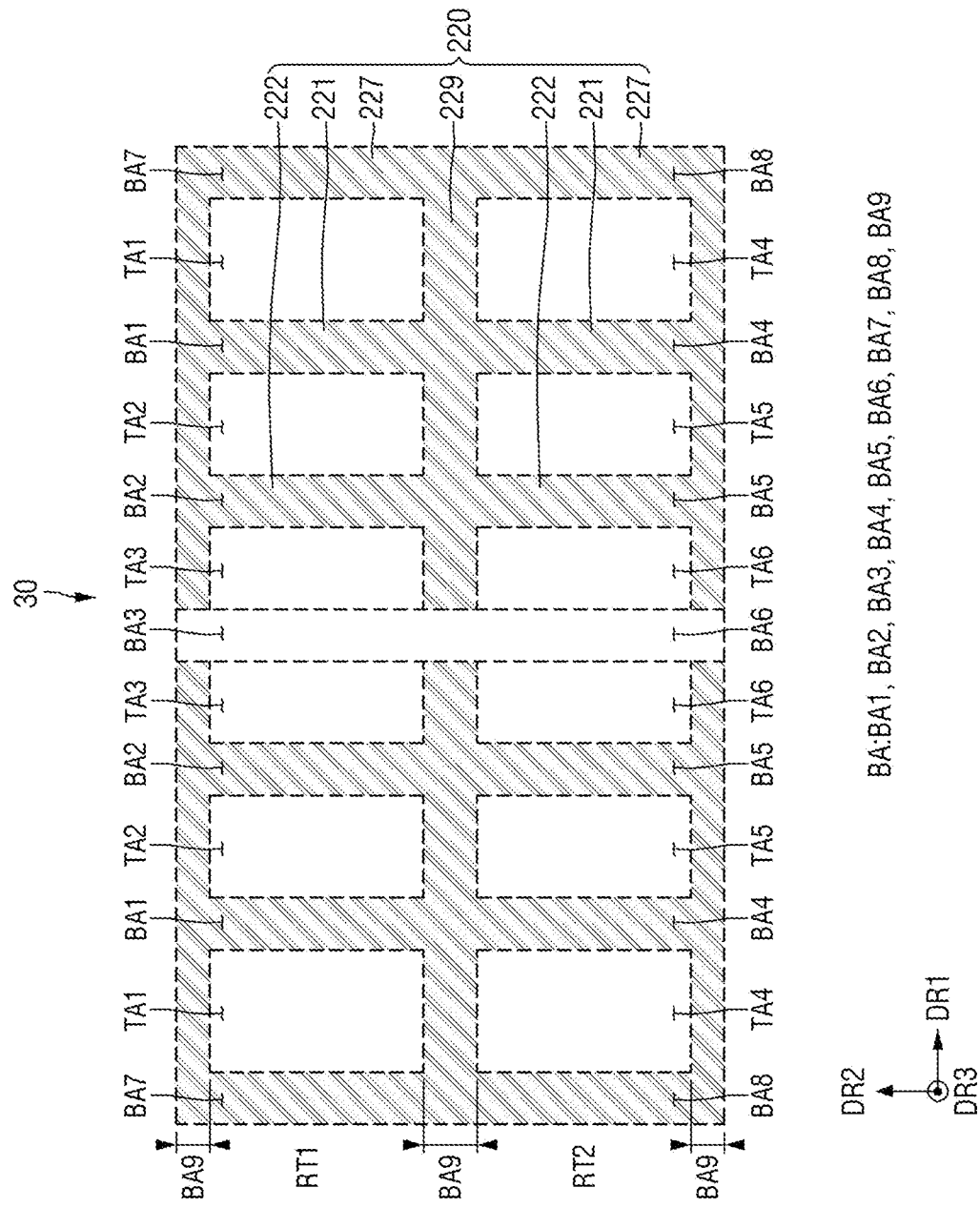
FIG. 13 is a plan view illustrating the arrangement of light blocking members in the color converting substrate according to an embodiment of the disclosure.

The light blocking members 220 may be disposed on the surface of the second base part 310 that faces the display substrate 10. The light blocking members 220 may be positioned in some of the light blocking regions BA to block the transmission of light. In some embodiments, the light blocking members 220 may be arranged substantially in a lattice shape in a plan view, as illustrated in FIG. 13.

In some embodiments, the light blocking members 220 may include an organic light blocking material and may be formed by coating an organic light blocking material and subjecting the organic light blocking material to an exposure process. External light directed to the display device 1 may distort the color reproducibility of the color converting substrate 30. The light blocking members 220, which are positioned on the second base part 310, can absorb at least some of the external light. Thus, the light blocking members 220 can reduce the distortion of colors by the reflection of the external light. In some embodiments, the light blocking members 220 can prevent light from infiltrating between adjacent light transmitting regions to cause color mixing, and as a result, color reproducibility can be further improved.

In some embodiments, the light blocking members 220 may include first light blocking members 221, which are positioned in the first light blocking regions BA1, second light blocking members 222, which are positioned in the second light blocking regions BA2, fourth light blocking regions BA4, which are positioned in the fourth light blocking regions BA4, a sixth light blocking region 226, which is positioned in the sixth light blocking region BA6, seventh light blocking members 227, which are positioned in the seventh light blocking regions BA7, eighth light blocking members 228, which are positioned in the eighth light blocking regions BAB, and the ninth light blocking members 229, which are positioned in the ninth light blocking region BA9. In some embodiments, the first light blocking members 221, the second light blocking members 222, and the seventh light blocking members 227 may be connected to the ninth light blocking members 229, and the fourth light blocking members 224, the fifth light blocking members 225, and the eighth light blocking members 228 may also be connected to the ninth light blocking members 229. The light blocking members 220 may be formed to have substantially the same shape as the light blocking regions BA. That is, the first light blocking members 221, the second light blocking members 222, the fourth light blocking members 224, the fifth light blocking members 225, the seventh light blocking members 227, and the eighth light blocking members 228 may extend in the second direction DR2, and the ninth light blocking members 229 may extend in the first direction DR1. The light blocking members 220 may be substantially integrally formed into a single pattern, and the reference numerals assigned to the light blocking members 220 may be understood as being for distinguishing the light blocking members 220 from one another for their locations.

In some embodiments, first sides of the first color filters 231 may be positioned on the seventh light blocking members 227, in the seventh light blocking regions BA7. Second sides of the first color filters 231 may be disposed on the first light blocking members 221, in the first light blocking regions BA1. Similarly, first sides of the second color filters 232 may be positioned on the first light blocking members 221, in the first light blocking regions BA1, and second sides of the second color filters 232 may be disposed on the second light blocking members 222, in the second light blocking regions BA2.

In some embodiments, the first color filters 231 and the second color filters 232 may be formed as stripes that extend in the second direction DR2 and may extend across the ninth light blocking regions BA9, between the first and second rows RT1 and RT2. The first color filters 231 and the second color filters 232 may be positioned on the ninth light blocking members 229, in the ninth light blocking regions BA9, and may be disposed to cover the ninth light blocking members 229. However, the disclosure is not limited to this. Alternatively, the first color filters 231 and/or the second color filters 232 may be disposed to be spaced apart from the ninth light blocking region BA9 between the first and second rows RT1 and RT2, along the second direction DR2. That is, the first color filters 231 and the second color filters 232 may be formed as islands.

Meanwhile, the light blocking members 220 may not be disposed in the third and sixth light blocking regions BA3 and BA6. The display device 1 may include the light blocking pattern 240, which is positioned in at least part of the color converting substrate 30. The light blocking pattern 240, unlike the light blocking members 220, may be disposed between adjacent identical light transmitting regions, for example, between the third light transmitting regions TA3. Accordingly, first sides of the third color filters 233, which are disposed in the third light transmitting regions TA3, may be positioned on the second light blocking members 222, in the second light blocking regions BA2, but second sides of the third color filters 233 may be in contact with the light blocking pattern 240 in the third light blocking region BA3. In some embodiments, as the light blocking pattern 240 extends in the second direction DR2, the light blocking patterns 240 may be disposed in the third and sixth light blocking regions BA3 and BA6 to form stripes.

The light blocking pattern 240 may perform substantially the same functions as the light blocking members 220. That is, the light blocking pattern 240 may be positioned in the third light blocking region BA3 to block the transmission of light. The light blocking pattern 240 can prevent beams of light emitted from adjacent identical light transmitting regions, for example, from the third light transmitting regions TA3, from being mixed together.

As will be described later, the light transmitting patterns 350, which are disposed in adjacent third light transmitting regions TA3, may be connected to each other beyond the third light blocking region BA3. Light emitted from the third light-emitting elements ED3 of the display substrate 10 may be released from the third light transmitting regions TA3 through the light transmitting patterns 350 and the third color filters 233. Here, the light blocking pattern 240, which is positioned between the adjacent third light transmitting regions TA3, can prevent light from infiltrating between the light transmitting regions through the light transmitting patterns 350 to cause color mixing. As a result, the light blocking pattern 240 can improve color reproducibility.

Also, the light blocking pattern 240 can absorb at least some of external light and can reduce the distortion of colors. The light blocking pattern 240 may be formed by applying laser light to the third light blocking region BA3 after the formation of the third color filters 233 during the fabrication of the color converting substrate 30. That is, the light blocking pattern 240 may be formed by carbonizing parts of the third color filters 233 and parts of the light transmitting patterns 350, but the disclosure is not limited thereto. Alternatively, the light blocking pattern 240 may include an organic light blocking material and may be formed by coating an organic light blocking material and subjecting the organic light blocking material to an exposure process. This will be described later in detail.

A first capping layer 391, which covers the light blocking members 220, the first color filters 231, the second color filters 232, and the third color filters 233, may be positioned on the surface of the second base part 310. In some embodiments, the first capping layer 391 may be in direct contact with the first color filters 231, the second color filters 232, and the third color filters 233.

The first capping layer 391 may be in contact with the light blocking members 220. In some embodiments, in the first light blocking regions BA1, the first light blocking members 221 may be in direct contact with the first capping layer 391. Also, in the second light blocking regions BA2, the second light blocking members 222 may be in contact with the first capping layer 391, and in the seventh light blocking regions BA7, the seventh light blocking members 227 may be in contact with the first capping layer 391. Also, in the ninth light blocking regions BA9, the ninth light blocking members 229 may be in direct contact with the first capping layer 391. Meanwhile, the light blocking pattern 240 that will be described later may be disposed in the third light blocking region BA3 and may be formed by carbonizing part of the first capping layer 391 with laser light. That is, the first capping layer 391 may be disposed on the entire surface of the second base part 310, but may be divided in part by the third light blocking region BA3.

The first capping layer 391 may prevent the light blocking members 220, the first color filters 231, the second color filters 232, and the third color filters 233 from being damaged or contaminated by impurities from the outside such as moisture or the air. Also, the first capping layer 391 may prevent the colorants from the first color filters 231, the second color filters 232, and the third color filters 233 from diffusing into elements other than the first color filters 231, the second color filters 232, and the third color filters 233, such as, for example, first wavelength converting patterns 330 and second wavelength converting patterns 340. In some embodiments, the first capping layer 391 may be formed of an inorganic material. For example, the first capping layer 391 may include silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride.

The barriers 370 may be positioned in some of the light blocking regions BA and may overlap with the non-emission region NLA in the plan view. The barriers 370 may be disposed to surround the first light transmitting regions TA1, the second light transmitting regions TA2, the fourth light transmitting regions TA4, and the fifth light transmitting regions TA5. In some embodiments, the barriers 370 may form a lattice shape in a plan view.

The first wavelength converting patterns 330, the second wavelength converting patterns 340, and the light transmitting patterns 350 that will be described later may be formed by inkjet printing using an ink composition. The barriers 370, which are formed in the color converting substrate 30, may guide the ink composition for forming the first wavelength converting patterns 330, the second wavelength converting patterns 340, and the light transmitting patterns 350, such that the ink composition can be stably placed at any desired location.

In some embodiments, the barriers 370 may be formed of an organic material, particularly, a photosensitive organic material. The photosensitive organic material may be a negative photosensitive material that is cured when illuminated with light, but the disclosure is not limited thereto. Also, in some embodiments, the barriers 370 may further include light blocking members. That is, the barriers 370 may be positioned in the light blocking regions BA to block the transmission of light. Specifically, the barriers 370 may be positioned between the first wavelength converting patterns 330 and the second wavelength converting patterns 340 and between the second wavelength converting patterns 340 and the light transmitting patterns 350. The barriers 370 may prevent beams of light emitted from adjacent different light transmitting regions from being mixed together.

The first wavelength converting patterns 330, the second wavelength converting patterns 340, and the light transmitting patterns 350 may be disposed on the first capping layer 391. In some embodiments, the first wavelength converting patterns 330, the second wavelength converting patterns 340, and the light transmitting patterns 350 may be formed by inkjet printing, but the disclosure is not limited thereto. In other embodiments, the light transmitting patterns 350, the first wavelength converting patterns 330, and the second wavelength converting patterns 340 may be formed by applying a photosensitive material and exposing and developing the photosensitive material. The light transmitting patterns 350, the first wavelength converting patterns 330, and the second wavelength converting patterns 340 will hereinafter be described as being formed by inkjet printing.

The first wavelength converting patterns 330 may be positioned on the first capping layer 391, in the first light transmitting regions TA1 and the fourth light transmitting regions TA4. In some embodiments, the first wavelength converting patterns 330 may be formed as stripes that extend in the second direction DR2 and may extend across the ninth light blocking region BA9 between the first and second rows RT1 and RT2, but the disclosure is not limited thereto. In other embodiments, the first wavelength converting patterns 330 may be formed as islands that are spaced apart between the first light transmitting regions TA1 and the fourth light transmitting regions TA4.

The first wavelength converting patterns 330 may convert or shift convert the peak wavelength of incident light into a particular peak wavelength. In some embodiments, the first wavelength converting patterns 330 may convert emission light L provided by the first light-emitting elements ED1 into red light having a peak wavelength of about 610 nm to about 650 nm and may emit the red light.

In some embodiments, the first wavelength converting patterns 330 may include a first base resin 331 and a first wavelength converting material 335, which is dispersed in the first base resin 331, and may further include a first scatterer 333, which is dispersed in the first base resin 331. The first base resin 331 may be formed of a material having a high light transmittance. In some embodiments, the first base resin 331 may be formed of an organic material. In some embodiments, the first base resin 331 may include an organic material such as an epoxy resin, an acrylic resin, a cardo resin, or an imide resin, but the disclosure is not limited thereto.

The first wavelength converting material 335 may convert or shift the peak wavelength of incident light into a particular peak wavelength. In some embodiments, the first wavelength converting material 335 may convert the emission light L provided by the first light-emitting elements ED1 into red light having a single peak wavelength of about 610 nm to about 650 nm and may emit the red light.

Examples of the first wavelength converting material 335 include quantum dots, quantum rods, and a phosphor. In one example, the quantum dots may be a particulate material that emits light of a particular color in response to the electrons transitioning from the conduction band to the valance band.

The quantum dots may be a semiconductor nanocrystal material. Since the quantum dots have a predetermined band gap depending on their composition and size, the quantum dots absorb light and emit light of a predetermined wavelength. The semiconductor nanocrystal material includes a group IV element, a group II-VI compound, a group III-V compound, a group IV-VI compound, and a combination thereof.

The group II-VI compound may be selected from the group consisting of: a binary compound selected from among CdSe, CdTe, ZnS, ZnSe, ZnTe, ZnO, HgS, HgSe, HgTe, MgSe, MgS, and a mixture thereof; a ternary compound selected from among InZnP, AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; or a quaternary compound selected from among HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The group III-V compound may be selected from the group consisting of: a binary compound selected from among GaN, GaP, GaAs, GaSb, AlN, AlP, AlAs, AlSb, InN, InP, InAs, InSb, and a mixture thereof; a ternary compound selected from among GaNP, GaNAs, GaNSb, GaPAs, GaPSb, AlNP, AlNAs, AlNSb, AlPAs, AlPSb, InGaP, InNP, InAiP, InNAs, InNSb, InPAs, InPSb, GaAlNP, and a mixture thereof; and a quaternary compound selected from among GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

The group IV-VI compound may be selected from the group consisting of: a binary compound selected from among SnS, SnSe, SnTe, PbS, PbSe, PbTe, and a mixture thereof; a ternary compound selected from among SnSeS, SnSeTe, SnSTe, PbSeS, PbSeTe, PbSTe, SnPbS, SnPbSe, SnPbTe, and a mixture thereof; and a quaternary compound selected from among SnPbSSe, SnPbSeTe, SnPbSTe, and a mixture thereof. The group IV element may be selected from the group consisting of Si, Ge, and a mixture thereof. The group IV compound may be a binary compound selected from among SiC, SiGe, and a mixture thereof.

These binary, ternary, or quaternary compounds may exist in a uniform concentration or in a partially different concentration in particles. The quantum dots may have a core-shell structure in which one quantum dot surrounds another quantum dot. The interfaces between the cores and the shells of the quantum dots may have a concentration gradient in which the concentration of the element(s) in the shells of the quantum dots gradually decreases toward the centers of the shells of the quantum dots.

In some embodiments, the quantum dots may have a core-shell structure consisting of a core including the above-described semiconductor nanocrystal material and a shell surrounding the core. The shells of the quantum dots may serve as protective layers for maintaining the semiconductor characteristics of the quantum dots by preventing chemical denaturation of the cores of the quantum dots and/or as charging layers for imparting electrophoretic characteristics to the quantum dots. The shells of the quantum dots may have a single-layer structure or a multilayer structure. The interfaces between the cores and the shells of the quantum dots may have a concentration gradient in which the concentration of the element(s) at the shells of the quantum dots gradually decreases toward the centers of the shells of the quantum dots. The shells of the quantum dots may include a metal or non-metal oxide, a semiconductor compound, or a combination thereof.

In one example, the metal or non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO or a ternary compound such as $MgAl_2O_4$, $CoFe_2O_4$, $NiFe_2O_4$, or $CoMn_2O_4$, but the disclosure is not limited thereto.

In one example, the semiconductor compound may be CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, or AlSb, but the disclosure is not limited thereto.

Light emitted by the first wavelength converting material 335 may have a full width at half maximum ("FMHM") of about 45 nm or less, about 40 nm or less, or about 30 nm or less, and thus, the purity of colors displayed by the display device 1 and the color reproducibility of the display device 1 can be further improved. Also, the first wavelength converting material 335 can emit light in various directions regardless of the incidence direction of the light. The side visibility of the third color displayed in the first light transmitting regions TA1 can be improved.

Some of the emission light L provided by the first light-emitting elements ED1 may not be converted into red light by the first wavelength converting material 335, but may be emitted through the first wavelength converting patterns 330. Components of the emission light L that are incident upon the first color filters 231 without being converted by the first wavelength converting patterns 330 may be blocked by the first color filters 231. On the contrary, red light obtained from the emission light L by the first wavelength converting patterns 330 may be emitted to the outside through the first color filters 231. That is, light emitted form the first light transmitting regions TA1 may be red light.

The first scatterer 333 may have a different refractive index from the first base resin 331 and may form an optical interface with the first base resin 331. In one example, the first scatterer 333 may include light-scattering particles. The material of the first scatterer 333 is not particularly limited as long as it can scatter at least some light, and the first scatterer 333 may include, for example, particles of a metal oxide or particles of an organic material. The metal oxide may be titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$), and the organic material may be an acrylic resin or a urethane resin. The first scatterer 333 may scatter light in random directions, regardless of the incident direction of the light, without substantially changing the wavelength of light passing through the first wavelength converting patterns 330.

The second wavelength converting patterns 340 may be positioned on the first capping layer 391, in the second light transmitting regions TA2 and the fifth light transmitting regions TA5. In some embodiments, the second wavelength converting patterns 340 may be formed as stripes that extend in the second direction Dr2 and may extend across the ninth light blocking region BA9 between the first and second rows RT1 and RT2, but the disclosure is not limited thereto. In other embodiments, the second wavelength converting patterns 340 may be formed as islands that are spaced apart between the second light transmitting regions TA2 and the fifth light transmitting regions TA5.

The second wavelength converting patterns 340 may convert or shift convert the peak wavelength of incident light into a particular peak wavelength. In some embodiments, the second wavelength converting patterns 340 may convert emission light L provided by the second light-emitting elements ED2 into green light having a peak wavelength of about 510 nm to about 550 nm and may emit the green light.

In some embodiments, the second wavelength converting patterns 340 may include a second base resin 341 and a second wavelength converting material 345, which is dispersed in the second base resin 341, and may further include a second scatterer 343, which is dispersed in the second base resin 341.

The second base resin 341 may be formed of a material having a high light transmittance. In some embodiments, the second base resin 341 may be formed of an organic material. In some embodiments, the second base resin 341 may be formed of the same material as the first base resin 331 or may include at least one of the above-described materials for the first base resin 331, but the disclosure is not limited thereto.

The second wavelength converting material 345 may convert or shift the peak wavelength of incident light into a particular peak wavelength. In some embodiments, the second wavelength converting material 345 may convert blue light having a peak wavelength of 440 nm to 480 nm into green light having a peak wavelength of 510 nm to 550 nm.

Examples of the second wavelength converting material 345 include quantum dots, quantum rods, and a phosphor. The second wavelength converting material 345 is substantially the same as the first wavelength converting material 335, and thus, a detailed description thereof will be omitted.

In some embodiments, the first and second wavelength converting materials 335 and 345 may both be formed of quantum dots. In this case, the particle size of the first wavelength converting material 335 may be greater than the particle size of the second wavelength converting material 345.

The second scatterer 343 may have a different refractive index from the second base resin 341 and may form an optical interface with the second base resin 341. In one example, the second scatterer 343 may include light-scattering particles. The second scatterer 343 is substantially the same as the first scatterer 333, and thus, a detailed description thereof will be omitted.

The emission light L emitted by the second light-emitting elements ED2 may be provided to the second wavelength converting patterns 340, and the second wavelength converting material 345 may convert the emission light L provided by the second light-emitting elements ED2 into green light having a peak wavelength of about 510 nm to about 550 nm and emit the green light.

The light transmitting patterns 350 may be positioned on the first capping layer 391, in the third light transmitting regions TA3 and the sixth light transmitting regions TA6. In some embodiments, the light transmitting patterns 350 may be formed as stripes that extend in the second direction DR2 and may extend across the ninth light blocking region BA9 between the first and second rows RT1 and RT2, but the disclosure is not limited thereto. In other embodiments, the light transmitting patterns 350 may be formed as islands that are spaced apart between the third light transmitting regions TA3 and the sixth light transmitting regions TA6.

Also, the light transmitting patterns 350 may be positioned in the adjacent third light transmitting regions TA3. In one example, a light transmitting pattern 350 positioned in one third light transmitting region TA3 may be connected to a light transmitting pattern 350 positioned in another third light transmitting region TA3, thereby forming a single light transmitting pattern 350 together. The light transmitting patterns 350 may also be positioned in the third light blocking region BA3 and may have a larger width than a width of each of the first wavelength converting patterns 330 and the second wavelength converting patterns 340. As described above, the light blocking pattern 240 may be disposed in the third light blocking region BA3, between the adjacent third light transmitting regions TA3. Accordingly, even though the light transmitting patterns 350 are disposed in and across the adjacent third light transmitting regions TA3, light incident upon the light transmitting patterns 350 from one third light-emitting element ED3 may be emitted to a third light transmitting region TA3 corresponding to the third light-emitting element ED3, but not to a third light transmitting region TA3 corresponding to a neighboring third light-emitting element ED3. That is, the light blocking pattern 240 can prevent beams of light incident upon the light transmitting patterns 350 from being emitted to other light transmitting regions, for example, other third light transmitting regions TA3 that do not correspond to an arbitrary third light-emitting element ED3.

In one example, a thickness TH240 of the light transmitting patterns 240 in the third direction DR3 (i.e., thickness direction of the color converting substrate 30) may be greater than a thickness TH220 of the light blocking members 220, but smaller than the thickness of the barriers 370. As will be described later, the light blocking pattern 240 may be formed by applying laser light to the third light blocking region BA3 during the fabrication of the color converting substrate 30. The light blocking pattern 240 may be formed by carbonizing parts of the light transmitting patterns 350, the third color filters 233, and the first capping layer 391 in the third light blocking region BA3 with the laser light. Here, the light blocking pattern 240 may have a sufficient thickness to prevent light incident upon the light transmitting patterns 350 from the third light-emitting elements ED3 to other third light transmitting regions TA3 that do not correspond to the third light-emitting elements ED3. The thickness TH240 of the light blocking pattern 240 may be smaller than the thickness of the barriers 370, but greater than the thickness TH220 of the light blocking members 220. In one example, the thickness TH240 of the light blocking pattern 240 may be less than half the thickness of the barriers 370, but the disclosure is not limited thereto.

The light transmitting patterns 350 may transmit incident light therethrough. Emission light L provided by the third light-emitting elements ED3 may be emitted to the outside of the display device 1 through the light transmitting patterns 350 and the third color filters 233. That is, light emitted from the third light transmitting regions TA3 may be blue light.

In some embodiments, the light transmitting patterns 350 may include a third base resin 351 and may further include a third scatterer 353, which is dispersed in the third base resin 351.

The third base resin 351 may be formed of a material having a high light transmittance. In some embodiments, the third base resin 351 may be formed of an organic material. In some embodiments, the third base resin 351 may be formed of the same material as the first base resin 331 or may include at least one of the above-described materials for the first base resin 331, but the disclosure is not limited thereto.

The third scatterer 353 may have a different refractive index from third base resin 351 and may form an optical interface with the third base resin 351. In one example, the third scatterer 353 may include light-scattering particles. The third scatterer 353 is substantially the same as the first scatterer 333, and thus, a detailed description thereof will be omitted.

A second capping layer 393 may be positioned on the light transmitting patterns 350, the first wavelength converting patterns 330, and the second wavelength converting patterns 340. The second capping layer 393 may cover and seal the light transmitting patterns 350, the first wavelength converting patterns 330, the second wavelength converting patterns 340, and the barriers 370. As a result, the light transmitting patterns 350, the first wavelength converting patterns 330, and the second wavelength converting patterns 340 can be prevented from being damaged or polluted by impurities from the outside such as moisture or the air. In some embodiments, the second capping layer 393 may be formed of an inorganic material. In some embodiments, the second capping layer 393 may be formed of the same material as the first capping layer 391 or may include at least one of the above-described materials for the first capping layer 391, but the disclosure is not limited thereto.

As described above, the filler 70 may be positioned in the space between the color converting substrate 30 and the display substrate 10. In some embodiments, the filler 70 may be positioned between the second capping layer 393 and the thin-film encapsulation layer 170. In some embodiments, the filler 70 may be in direct contact with the second capping layer 393.

As described above, the light blocking members 220, the light blocking pattern 240, and the barriers 370 may be disposed in the light blocking regions BA of the color converting substrate 30. However, the barriers 370, the light blocking members 220, and the light blocking pattern 240 may be disposed only in some of the light blocking regions BA. The light blocking members 220, the light blocking pattern 240, and the barriers 370, which are disposed in the color converting substrate 30, and the light transmitting regions TA will hereinafter be described in further detail.

Figure 12:
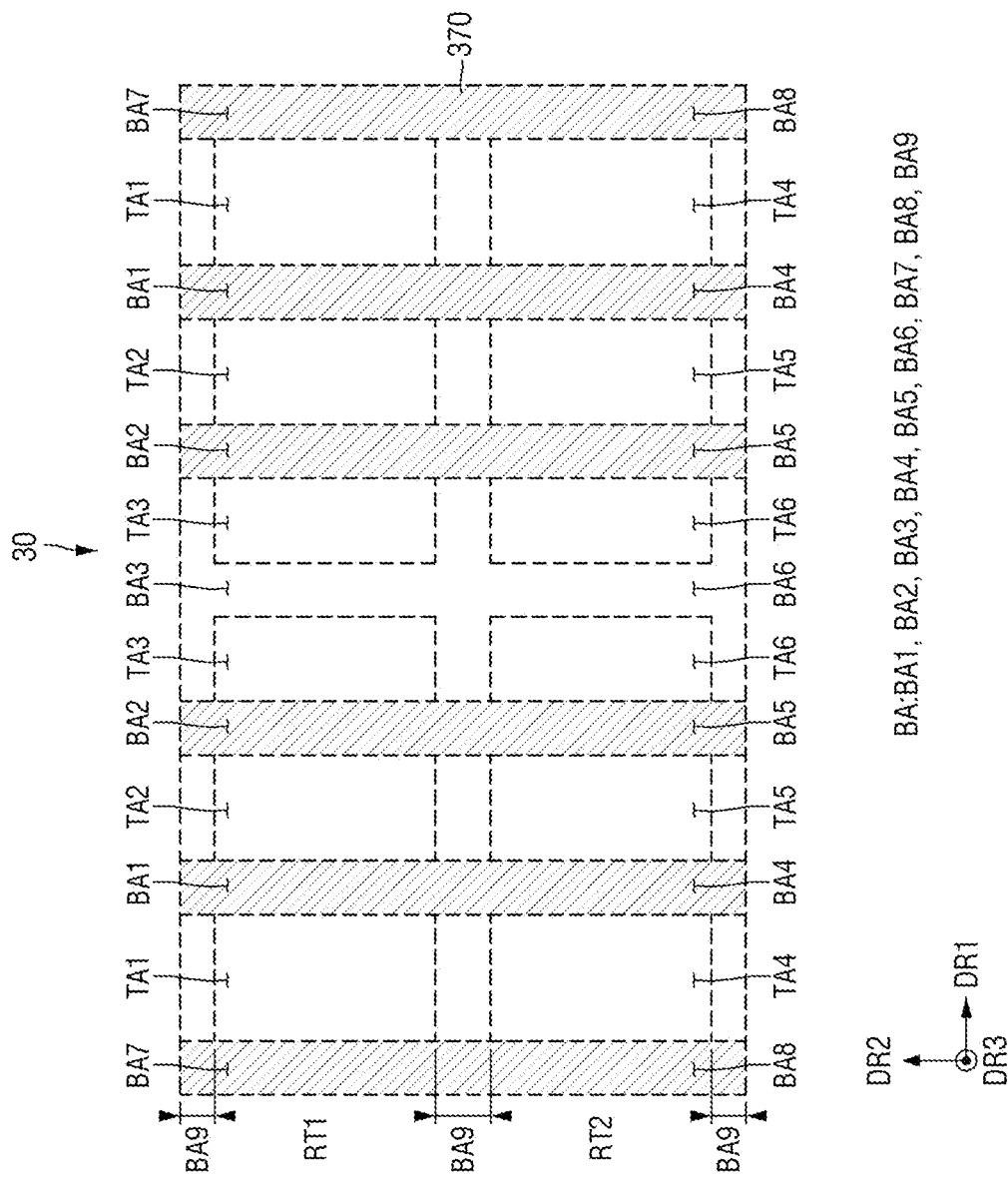
FIG. 12 is a plan view illustrating the arrangement of barriers in a color converting substrate according to an embodiment of the disclosure.
Figure 14:
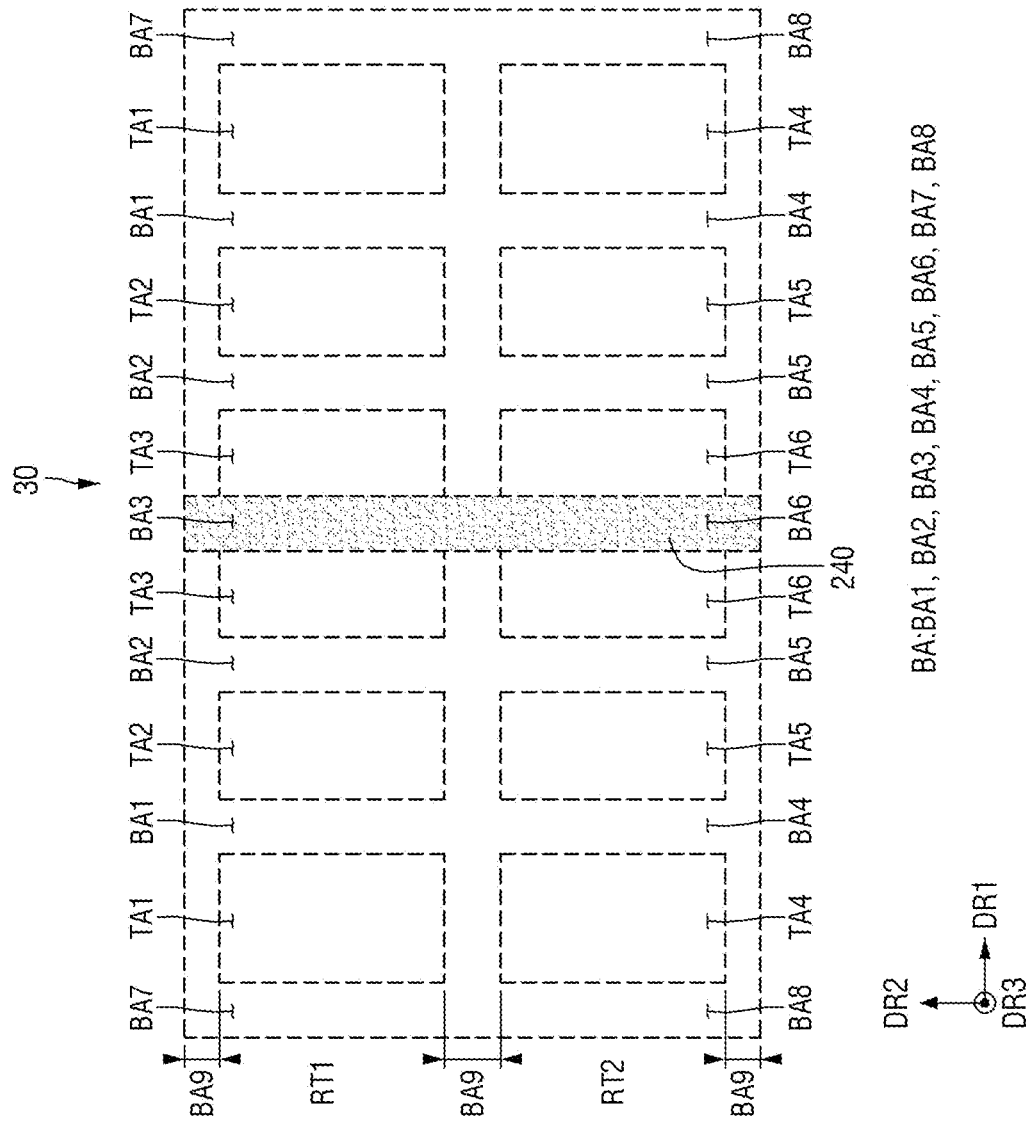
FIG. 14 is a plan view illustrating the arrangement of a light blocking pattern in the color converting substrate according to an embodiment of the disclosure.
Figure 15:
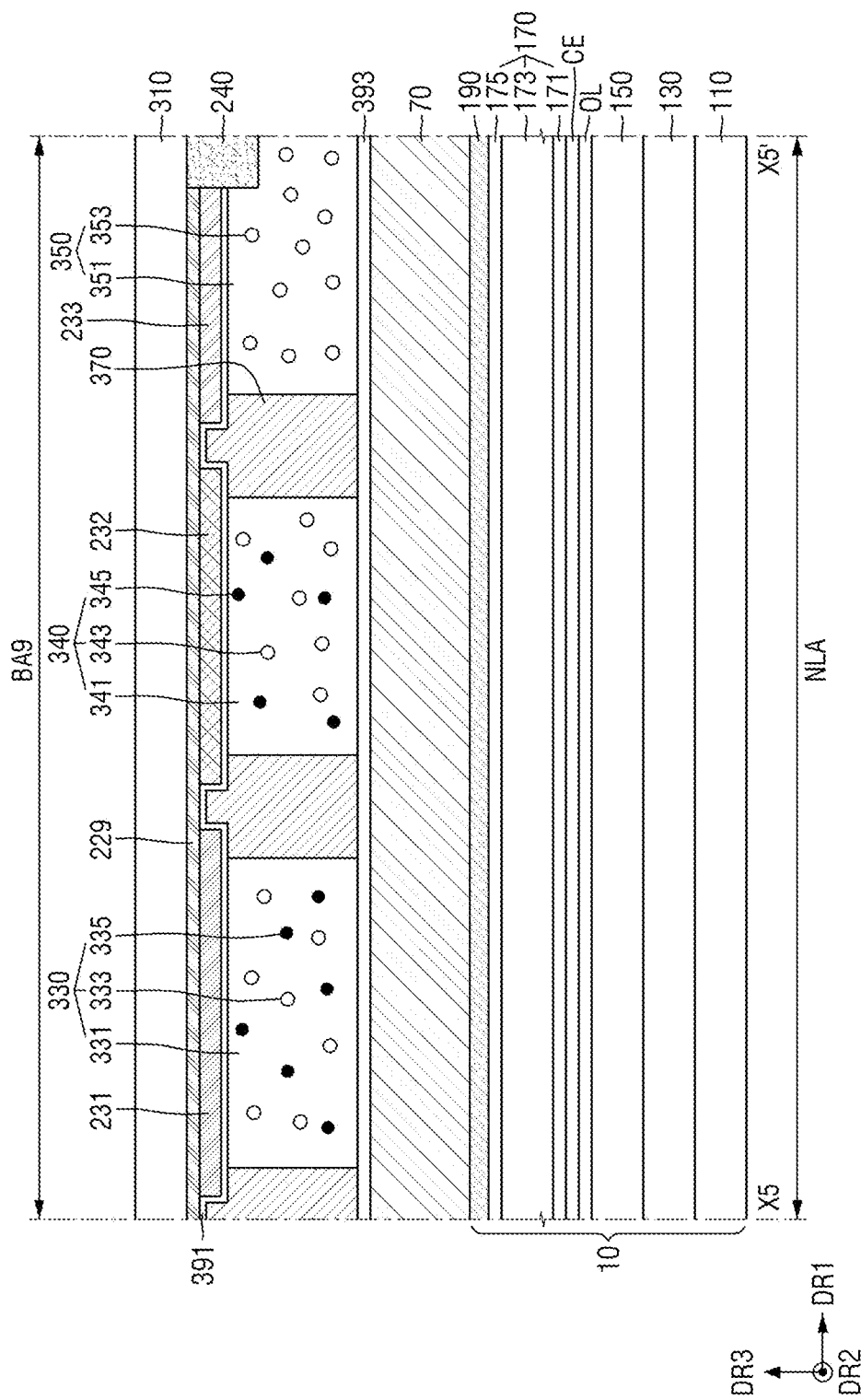
FIG. 15 is a cross-sectional view taken along line X5-X5' of FIGS. 3 and 4.
Figure 16:
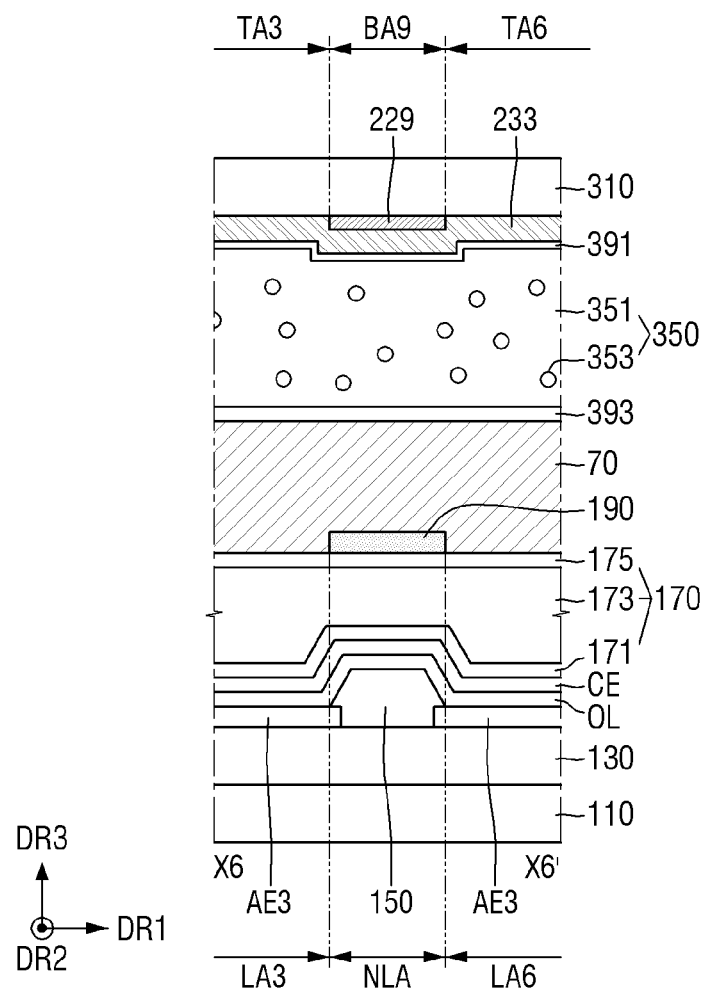
FIG. 16 is a cross-sectional view taken along line X6-X6' of FIGS. 3 and 4.
Figure 17:
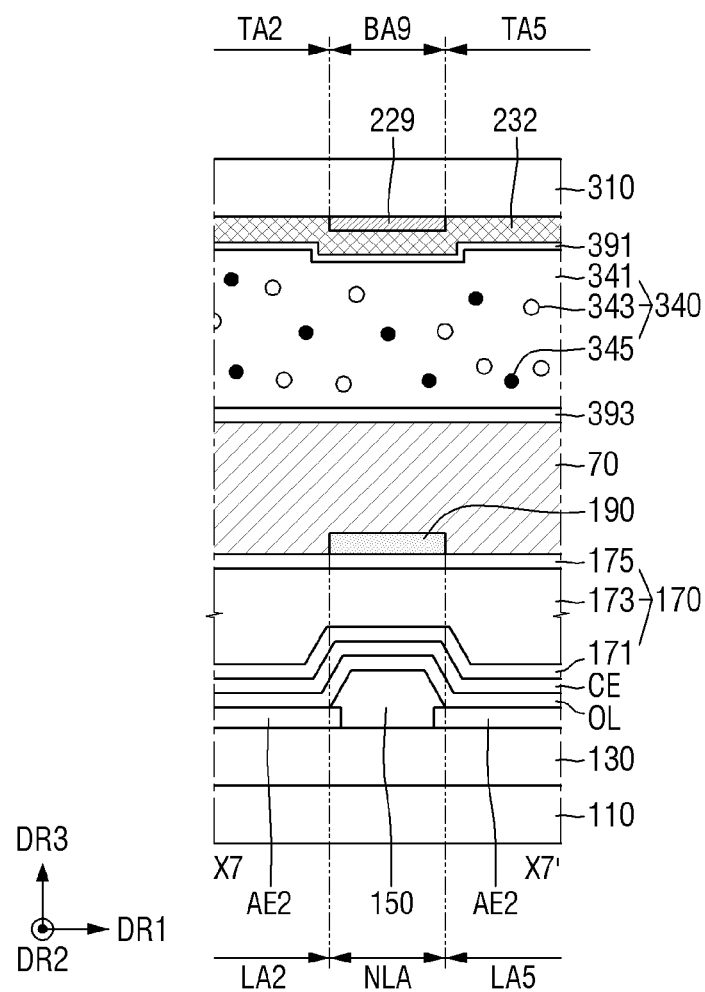
FIG. 17 is a cross-sectional view taken along line X7-X7' of FIGS. 3 and 4.

FIG. 12 is a plan view illustrating the arrangement of barriers in a color converting substrate according to an embodiment of the disclosure. FIG. 13 is a plan view illustrating the arrangement of light blocking members in the color converting substrate according to an embodiment of the disclosure. FIG. 14 is a plan view illustrating the arrangement of a light blocking pattern in the color converting substrate according to an embodiment of the disclosure. FIG. 15 is a cross-sectional view taken along line X5-X5' of FIGS. 3 and 4. FIG. 16 is a cross-sectional view taken along line X6-X6' of FIGS. 3 and 4. FIG. 17 is a cross-sectional view taken along line X7-X7' of FIGS. 3 and 4.

FIG. 15 is a cross-sectional view taken across part of a ninth light blocking region BA9 of the color converting substrate 30, FIG. 16 is a cross-sectional view taken across parts of third and sixth light transmitting regions TA3 and TA6, and FIG. 17 is a cross-sectional view taken across second and fifth light transmitting regions TA2 and TA5.

Referring to FIGS. 12 through 17 and further to FIGS. 5 and 6, the barriers 370 may extend in the second direction DR2 on the color converting substrate 30. As described above, the barriers 370 may be disposed in all the light blocking regions BA except for the third and sixth light blocking regions BA3 and BA6. The barriers 370 may not be disposed in a portion of the ninth light blocking region BA9 between the adjacent light transmitting regions TA in the second direction DR2, for example, between the first light transmitting regions TA1 and the fourth light transmitting regions TA4, between the second light transmitting regions TA2 and the fifth light transmitting regions TA5, and between the third and sixth light transmitting regions TA3 and TA6. As a result, the first color filters 231, the second color filters 232, the third color filters 233, the first wavelength converting patterns 330, the second wavelength converting patterns 340, and the light transmitting patterns 350 may disposed to extend through the adjacent light transmitting regions TA in the second direction DR2 on the color converting substrate 30, i.e., may be formed as stripes.

As illustrated in FIGS. 15 through 17, the first color filters 231, the second color filters 232, the third color filters 233, the first wavelength converting patterns 330, the second wavelength converting patterns 340, and the light transmitting patterns 350 may be positioned in the ninth light blocking regions BA9. Parts of the display substrate 10 that overlap with the ninth light blocking regions BA9 in the plan view may correspond to the non-emission region NLA where the light-emitting elements ED are not disposed, and in the non-emission region NLA, the panel light-blocking member 190 of the display substrate 10 may be disposed to extend.

However, the disclosure is not limited to this. Alternatively, the barriers 370 may be disposed to extend in the first direction DR1 on the ninth light blocking regions BA9. In this case, the first color filters 231, the second color filters 232, the third color filters 233, the first wavelength converting patterns 330, the second wavelength converting patterns 340, and the light transmitting patterns 350 of the first row RL1 may be spaced apart from those of the second row RL2 in the second direction DR2 on the color converting substrate 30, i.e., may be formed as islands.

The first wavelength converting patterns 330 may be disposed in the first light transmitting regions TA1 and the fourth light transmitting regions TA4, among spaces defined by the barriers 370. The second wavelength converting patterns 340 may be disposed in the second light transmitting regions TA2 and the fifth light transmitting regions TA5, among the spaces defined by the barriers 370. The light transmitting patterns 350 may be disposed in the third and sixth light transmitting regions TA3 and TA6, among the spaces defined by the barriers 370.

The light blocking members 220 and the light blocking pattern 240 may be disposed in the light blocking regions BA and may form a single lattice pattern together. As illustrated in FIG. 13, the light blocking members 220 may be positioned in regions other than the third and sixth light blocking regions BA3 and BA6 and parts of the ninth light blocking regions BA9. The light blocking pattern 240 may be positioned in regions where the light blocking members 220 are not disposed, i.e., in the third and sixth light blocking regions BA3 and BA6 where identical light-transmitting regions are disposed adjacent to one another and in parts of the ninth light blocking regions BA9. The light blocking members 220 and the light blocking pattern 240 may be positioned to surround the light transmitting regions TA.

In one example, the color converting substrate 30 may include first-type light transmitting regions having the light blocking members 220 disposed on both sides thereof and second-type light transmitting regions having the light blocking members 220 positioned on one side thereof and the light blocking pattern 240 disposed on the other side thereof. As described above, the color converting substrate 30 may include the first light transmitting regions TA1, the second light transmitting regions TA2, and the third light transmitting regions TA3, which are positioned in the first row RT1, and may include the first region where the first light transmitting regions TA1, the second light transmitting regions TA2, and the third light transmitting regions TA3 are arranged in the order of first second, and third light transmitting regions TA1, TA2, and TA3 and the second region where the first light transmitting regions TA1, the second light transmitting regions TA2, and the third light transmitting regions TA3 are arranged in the order of third, second, and first light transmitting regions TA3, TA2, and TA1. The light blocking members 220 may be disposed in some of the light blocking regions BA between the first light transmitting regions TA1, the second light transmitting regions TA2, and the third light transmitting regions TA3.

At least some of the first light transmitting regions TA1, the second light transmitting regions TA2, and the third light transmitting regions TA3, for example, the first light transmitting regions TA1 and the second light transmitting regions TA2, may have the light blocking members 220 disposed on both sides thereof. That is, the first light transmitting regions TA1 and the second light transmitting regions TA2 may be first-type light transmitting regions. As illustrated in FIGS. 5, 6, and 11, the first light transmitting regions TA1 and the second light transmitting regions TA2 may have the light blocking members 220 and the barriers 370 disposed on both sides thereof in a cross-sectional view. Accordingly, the first color filters 231, the second color filters 232, the first wavelength converting patterns 330, and the second wavelength converting patterns 340 may also have the light blocking members 220 or the barriers 370 disposed on both sides thereof.

Meanwhile, in the first row RT1 of the color converting substrate 30, the third light blocking region BA3 may be positioned between the first region where the first light transmitting regions TA1, the second light transmitting regions TA2, and the third light transmitting regions TA3 are arranged in the order of first, second, and third light transmitting regions TA1, TA2, and TA3 and the second region where the first light transmitting regions TA1, the second light transmitting regions TA2, and the third light transmitting regions TA3 are arranged in the order of third, second, and first light transmitting regions TA3, TA2, and TA1. In one example, the barriers 370 and the light blocking members 220 are not provided in the third light blocking region BA3, and the light blocking pattern 240 may be positioned in the third light blocking region BA3. Accordingly, the third light transmitting regions TA3 may have the light blocking members 220 disposed on one side thereof and the light blocking pattern 240 on the other side thereof. That is, the third light transmitting regions TA3 may be second-type light transmitting regions. As illustrated in FIGS. 5, 6, and 10, the third light transmitting regions TA3 may have the light blocking members 220 and the barriers 370 disposed on one side thereof and may have only the light blocking pattern 240 disposed on the other side thereof. Accordingly, the third color filters 233 may have the light blocking members 220 disposed on one side thereof and the light blocking pattern 240 disposed on the other side thereof. On the contrary, the light transmitting patterns 350 may have the barriers 370 disposed on both sides thereof and may overlap with the light blocking pattern 240 in the plan view. That is, the light transmitting patterns 350 may be positioned in and across adjacent third light blocking regions BA3. In other words, the light transmitting patterns 350 in the adjacent third light transmitting regions TA3 may be connected to each other and may thus be integrated.

In one example, at least parts of the light transmitting patterns 350 may overlap with the light blocking pattern 240 in the plan view. The light transmitting patterns 350 may be disposed to overlap with one or more light transmitting regions that are arranged in the first direction DR1. The light blocking pattern 240 may be disposed in an area where one or more light transmitting regions are disposed adjacent to each other, and the light transmitting patterns 350 may overlap with, and cover, the light transmitting pattern 240 in the plan view. In one example, the width of the light transmitting patterns 350 may be greater than each of the widths of the first light wavelength converting patterns 330 and the second wavelength converting patterns 340.

However, the disclosure is not limited to this. Alternatively, the light transmitting pattern 240 may be positioned in a light blocking region other than the third light blocking region BA3 where the third light transmitting regions TA3 are disposed adjacent to each other, for example, in the seventh light blocking region BA7 where the first light transmitting regions TA1 and other first light transmitting regions TA1 are disposed adjacent to one another. In this case, the color converting substrate 30 may include the second light transmitting regions TA2 as first-type light transmitting regions and the first light transmitting regions TA1 and the third light transmitting regions TA3 as second-type light transmitting regions. Accordingly, the first wavelength converting patterns 330 may also overlap with, and cover, the light blocking pattern 240 in the plan view. Also, the light blocking pattern 240 may be disposed in the ninth light blocking regions BA9 to extend in the first direction DR1. Various other embodiments of the arrangement of the light blocking pattern 240 will be described later.

The shape of the light blocking pattern 240 may be obtained by arranging some of the light transmitting regions TA adjacent to their respective identical light transmitting regions TA and not providing the barriers 370 between adjacent identical light transmitting regions TA, during the fabrication of the color converting substrate 30. In a case where the first wavelength converting patterns 330, the second wavelength converting patterns 340, and the light transmitting patterns 350 are formed by inkjet printing, ink needs to be sprayed into areas corresponding to the light transmitting regions TA. A small amount of ink may be sprayed into light transmitting regions having a relatively small area, such as the third light transmitting regions TA3. In the color converting substrate 30, identical light transmitting regions may be arranged adjacent to one another, and the barriers 370 may not be provided between the adjacent identical light transmitting regions. As identical light transmitting regions having a relatively small area are disposed adjacent to one another, ink can be sprayed into the adjacent identical light transmitting regions at the same time, and as a result, the impact precision of ink required for ink to be precisely mounted in each light transmitting region TA can be lowered. Accordingly, during the fabrication of the color converting substrate 30 through inkjet printing, the impact precision of ink can be improved, and the distribution of inkjet printing processes using multiple nozzles can be improved. The fabrication of the color converting substrate 30 will hereinafter be described.

FIGS. 18 through 23 are cross-sectional views illustrating processes of the fabrication of a display device according to an embodiment of the disclosure.

FIGS. 18 through 23 illustrate how to fabricate the color converting substrate 30 of the display device 1. FIGS. 18 through 23 illustrate a second light transmitting region TA2 and two adjacent third light transmitting regions TA3. That is, the fabrication of the color converting substrate 30 will hereinafter be described, taking one first-type light transmitting region and two second-type light transmitting regions. However, the description that follows may also be applicable to other light transmitting regions TA, for example, the first light transmitting regions TA1, the fourth light transmitting regions TA4, the fifth light transmitting regions TA5, the sixth light transmitting regions TA6.

Figure 18:
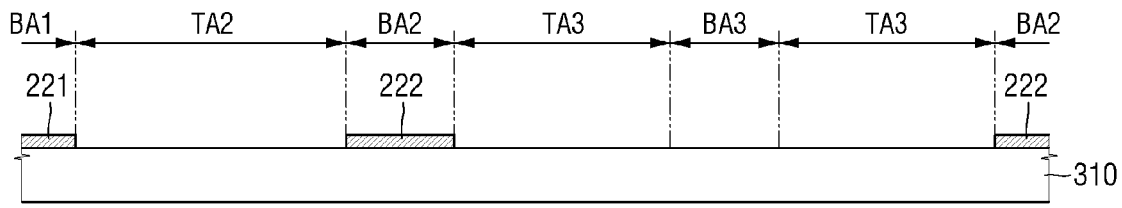
FIGS. 18 through 23 are cross-sectional views illustrating processes of the fabrication of a display device according to an embodiment of the disclosure.

Referring to FIGS. 18 through 23, the light blocking members 220 are formed on the surface of the second base part 310, as illustrated in FIG. 18. The light blocking members 220 are arranged as already described above. The light blocking members 220, which are disposed on the surface of the second base part 310, may include first light blocking members 221, which are positioned in the first light blocking regions BA1, and second light blocking regions BA2, which are positioned in the second light blocking regions BA2. As described above, the light blocking members 220 may not be disposed in the third light blocking regions BA3. The light blocking members 220 may form a lattice pattern on the surface of the second base part 310.

Figure 19:
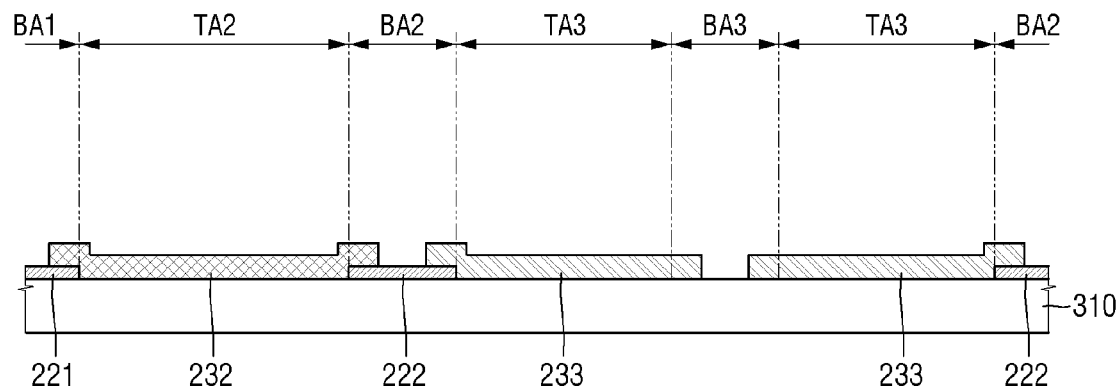

Thereafter, as illustrated in FIG. 19, the color filters 230 are formed on the surface of the second base part 310, between the light blocking members 220. The color filters 230 may be formed in areas that overlap with the light transmitting regions TA in the plan view. The color filters 230 may be formed by applying a photosensitive organic material including a particular colorant and exposing and developing the photosensitive organic material. In one example, the first color filters 231 may be formed by applying a photosensitive organic material including a red colorant and exposing and developing the photosensitive organic material including the red colorant, the second color filters 232 may be formed by applying a photosensitive organic material including a green colorant and exposing and developing the photosensitive organic material including the green colorant, and the third color filters 233 may be formed by applying a photosensitive organic material including a blue colorant and exposing and developing the photosensitive organic material including the blue colorant.

The second color filters 232 may be formed between the first light blocking members 221 and the second light blocking members 222, and the third color filters 233 may be formed in the third light transmitting regions BA3 between the second light blocking members 222. The first sides and the second sides of the second color filers 232 may be positioned on the first light blocking members 221 and the second light blocking members 222. The first sides of the third color filters 233 may be disposed on the second light blocking members 222, and the second sides of the third color filters 233 may be disposed on the second base part 310. The third color filters 233 are illustrated as being formed to be spaced apart from each other in the third light blocking region BA3, but the disclosure is not limited thereto. Alternatively, third color filters 233 disposed in the adjacent third light transmitting regions TA3 may be integrally formed.

Figure 20:
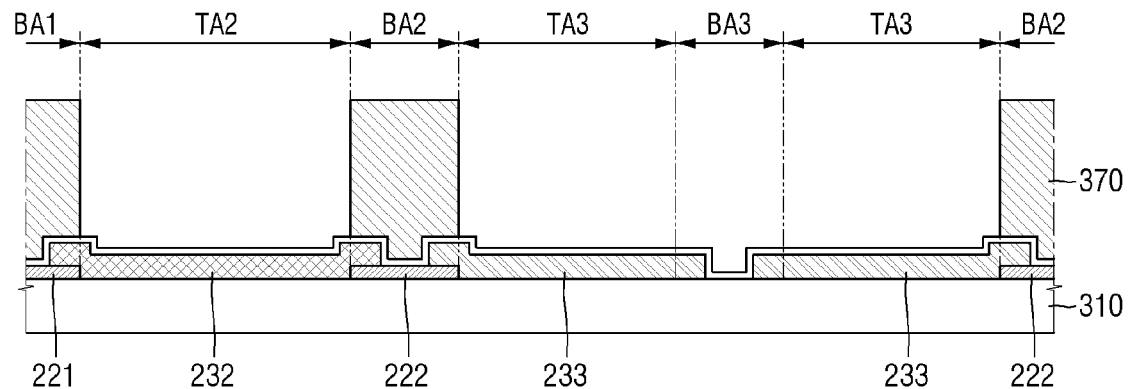

Thereafter, as illustrated in FIG. 20, the first capping layer 391, which covers the second color filters 232, the third color filters 233, the first light blocking members 221, and the second light blocking members 222, is formed, and the barriers 370 are formed in the first light blocking regions BA1 and the second light blocking regions BA2. The arrangements and the shapes of the barriers 370 and the first capping layer 391 are as already described above. The barriers 370 may not be disposed in the third light blocking region BA3 where the third light transmitting regions TA3 are disposed adjacent to each other. In the third light blocking region BA3, the first capping layer 391 may be in part in contact with the second base part 310, but the disclosure is not limited thereto. Alternatively, in a case where the third color filters 233 are integrally formed, the first capping layer 391 may not be in contact with the second base part 310, in the third light blocking region BA3.

Figure 21:
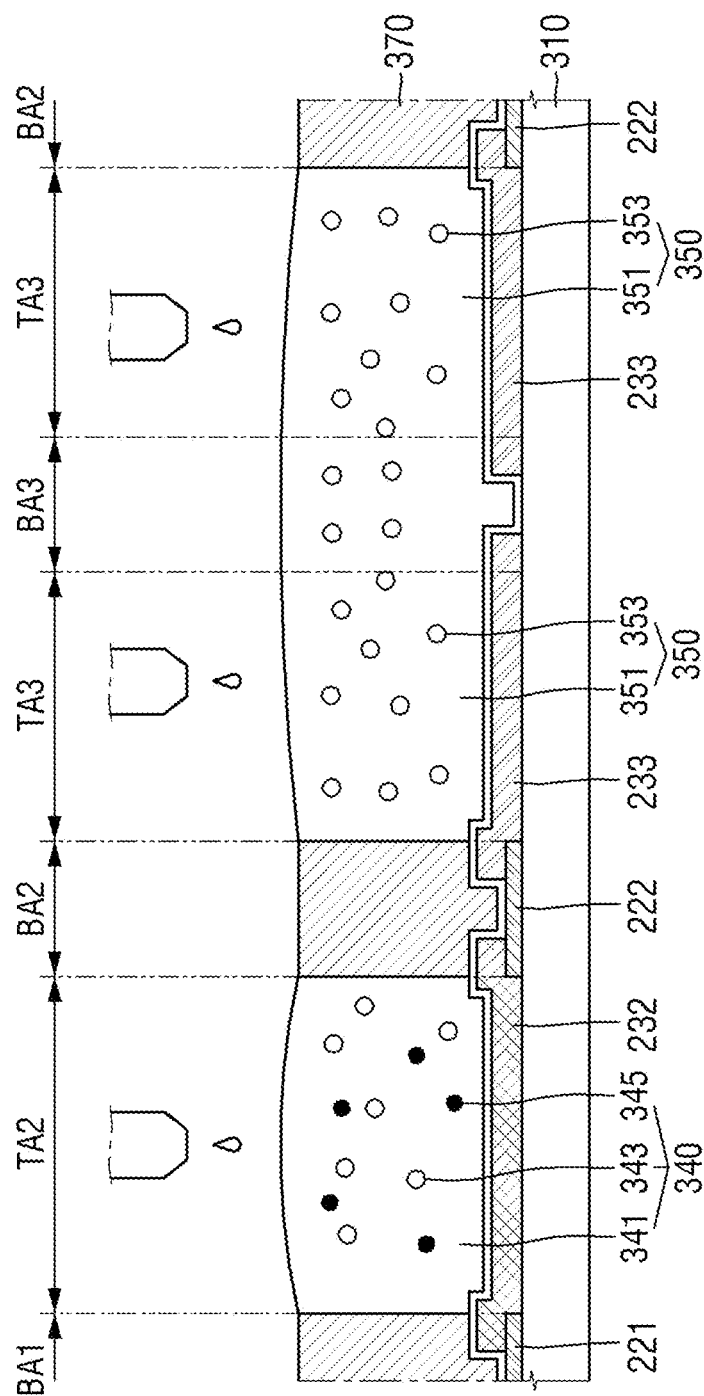
Figure 22:
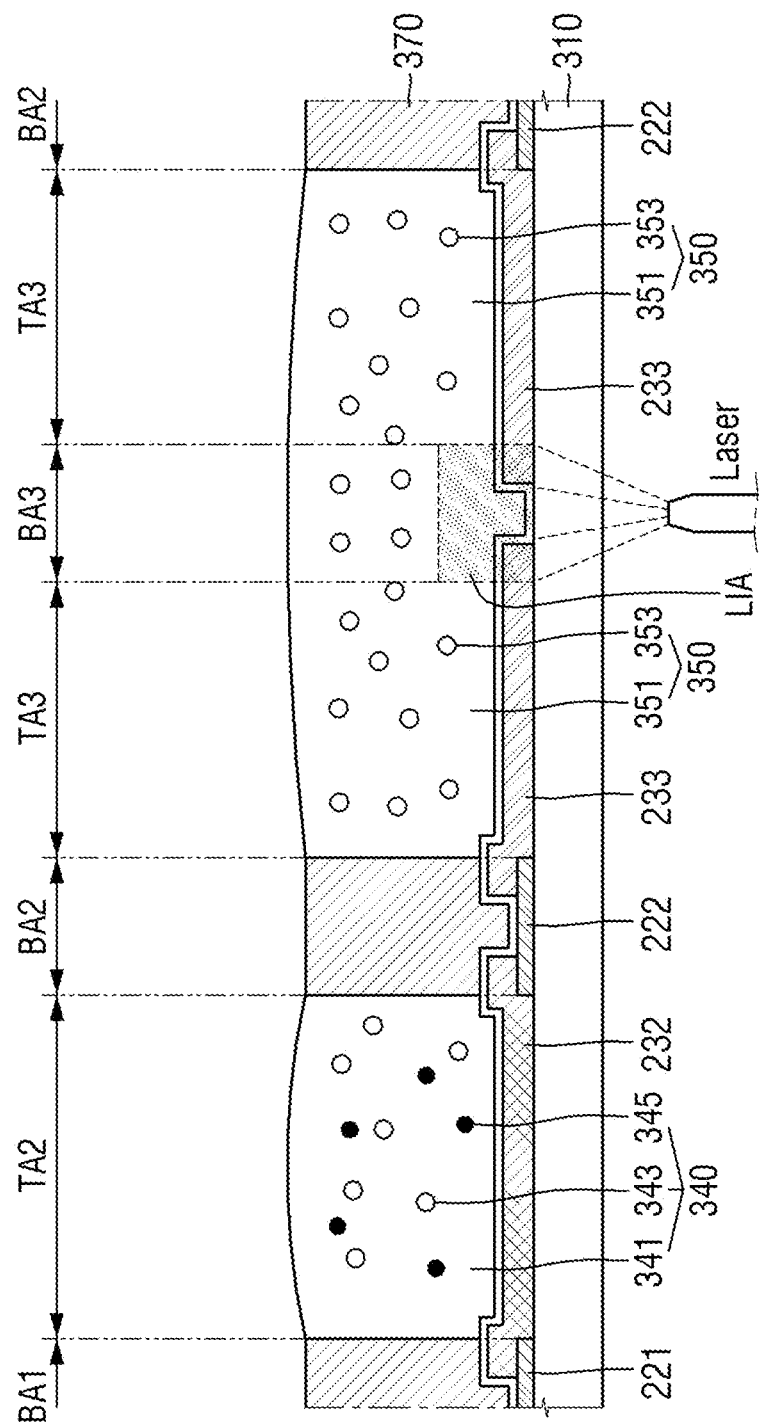

Thereafter, as illustrated in FIGS. 21 and 22, the second wavelength converting patterns 340 and the light transmitting patterns 350 are formed by spraying ink into the second light transmitting regions TA2 and the third light transmitting regions TA3. The second wavelength converting patterns 340 and the light transmitting patterns 350 may be formed in areas surrounded by the barriers 370. As described above, each of the second wavelength converting patterns 3s40 may be formed in one second light transmitting region TA2 surrounded by the barriers 370. The light transmitting patterns 350 may be formed in two adjacent third light transmitting regions TA3 and the third light blocking region BA3 surrounded by the barriers 370. As illustrated, the second wavelength converting patterns 340 may be sprayed into their respective second light transmitting regions TA2 through single nozzles, and the light transmitting patterns 350 may be sprayed into the two adjacent third light transmitting regions TA3 through two nozzles at the same time. A third width WT3 of the third light transmitting regions TA3 may be smaller than a second width WT2 of the second light transmitting regions TA2, and a small amount of ink may be sprayed into each of the third light transmitting regions TA3. However, in the display device 1, as the barriers 370 are not provided between the two adjacent third light transmitting regions TA3, a relatively large amount of ink can be sprayed into the two adjacent third light transmitting regions TA3 at the same time. As a result, the impact precision of ink can be improved during the fabrication of the color converting substrate 30, and the distribution of inkjet processes using multiple nozzles can be improved by simplifying the fabrication of the color converting substrate 30.

After the formation of the light transmitting patterns 350, the light blocking pattern 240 is formed by applying laser light to parts LIA of the light transmitting patterns 350 positioned in the third light blocking region BA3. The laser light may be applied to the parts LIA in the third light blocking region BA3, and parts of the light transmitting patterns 350, the third color filters 233, and the first capping layer 391 may be carbonized by the laser light. The light blocking pattern 240 may be formed in an area carbonized by the laser light.

In one example, the laser light may be applied from below the other surface of the second base part 310 that is opposite to the surface of the second base part 310 where the light transmitting patterns 350 are formed. That is, the laser light may be applied from below the other surface of the second base part 310 to the light transmitting patterns 350, passing through the other surface of the second base part 310, and the light blocking pattern 240 may be formed directly on the surface of the second base part 310. As described above, the light blocking pattern 240 may be disposed between the adjacent third light transmitting regions TA3 to prevent color mixing therebetween. However, the light blocking pattern 240 may not necessarily be formed on the surface of the second base part 310. Alternatively, the laser light may be applied from above the surface of the second base part 310, and the light blocking pattern 240 may be formed to be spaced apart from the second base part 310. This will be described later in detail.

Figure 23:
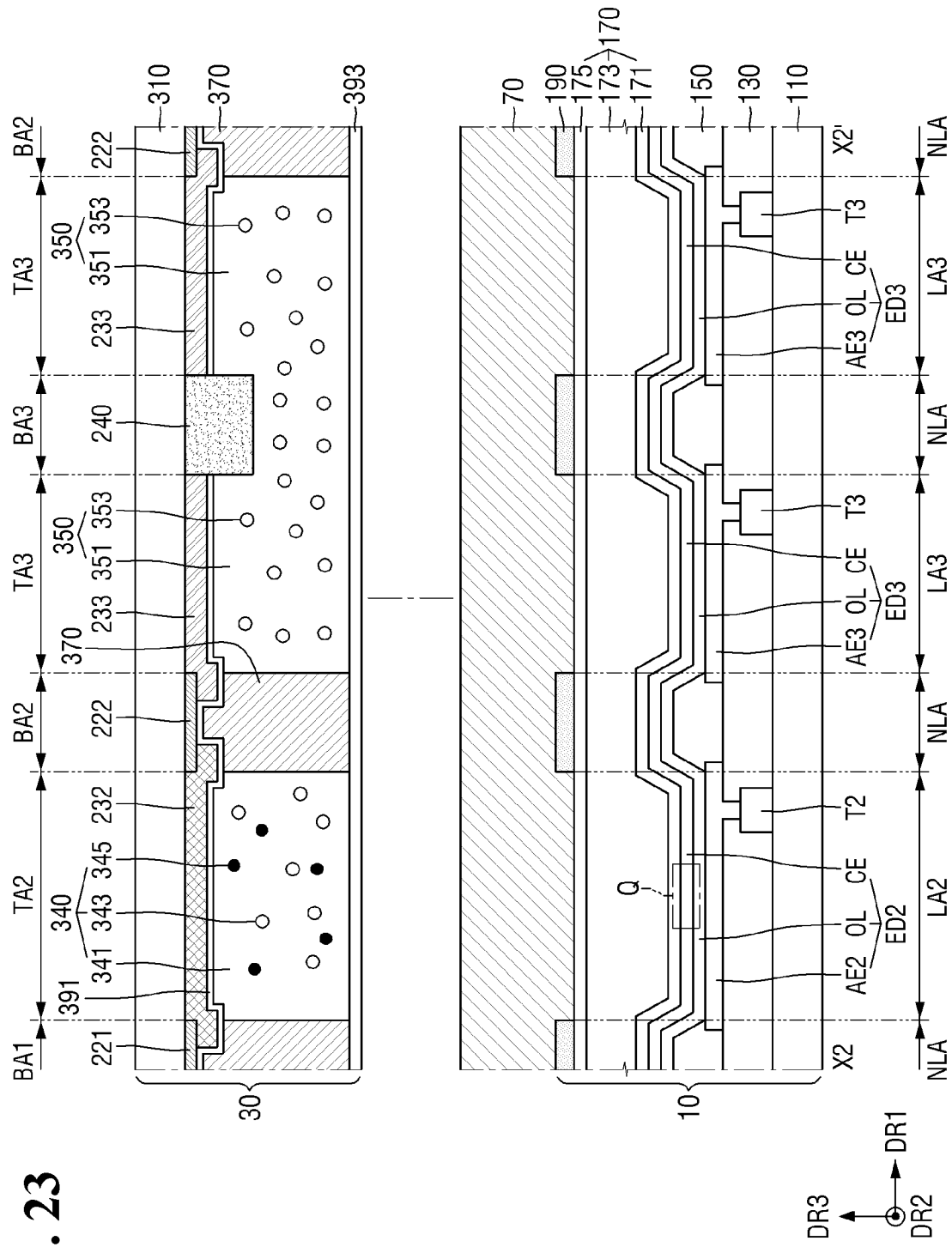

Thereafter, as illustrated in FIG. 23, the second capping layer 393 is formed to cover the second wavelength converting patterns 340, the barriers 370, and the light transmitting patterns 350, and the display substrate 10 and the color converting substrate 30 are bonded together, thereby obtaining the display device 1. In one example, during the fabrication of the color converting substrate 30, the barriers 370 may not be provided between adjacent identical light transmitting regions, for example, between the third light transmitting regions TA3, and the light transmitting patterns 350 may be integrally formed in the third light transmitting regions TA3 and the third light blocking region BA3 at the same time. The light transmitting patterns 350 may be disposed in two adjacent third light transmitting regions TA3 and the third light blocking region BA3 between the two adjacent third light transmitting regions TA3 and may overlap with the light blocking pattern 240, in the third light blocking region BA3. Accordingly, during the fabrication of the color converting substrate 30, the impact precision of ink for forming the light transmitting patterns 350 can be improved, and the distribution of inkjet printing processes using multiple nozzles can be improved. Also, the light blocking pattern 240 can be formed in the third light blocking region BA3 near the two adjacent third light transmitting regions TA3 and can prevent color mixing between the two adjacent third light transmitting regions TA3.

A color converting substrate 30 of a display device 1 according to another embodiment of the disclosure will hereinafter be described.

Figure 24:
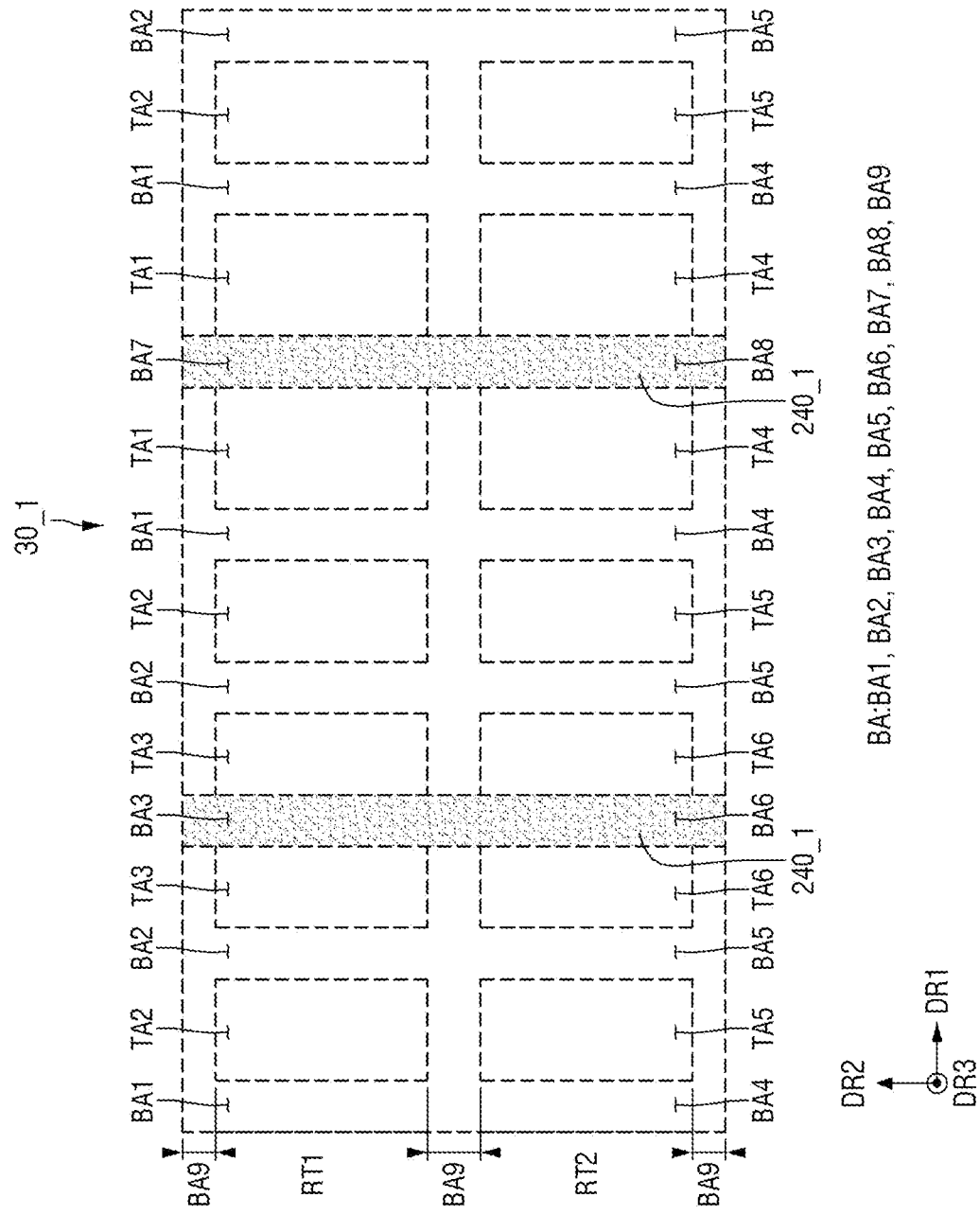
FIG. 24 is a plan view illustrating the arrangement of light blocking patterns in a color converting substrate according to another embodiment of the disclosure.

FIG. 24 is a plan view illustrating the arrangement of light blocking patterns in a color converting substrate according to another embodiment of the disclosure.

Referring to FIG. 24, light blocking patterns 240_1 of a color converting substrate 30_1 may be disposed in a third light blocking region BA3 between two adjacent third light transmitting regions TA3 and in a seventh light blocking region BA7 between two adjacent first light transmitting regions TA1. The color converting substrate 30_1 of FIG. 24 is the same as the color converting substrate 30 of FIG. 14 except that the light blocking patterns 240_1 are also disposed in the seventh light blocking region BA7 and an eighth light blocking region BAB. The color converting substrate 30_1 of FIG. 24 will hereinafter be described, focusing mainly on the differences with the color converting substrate 30 of FIG. 14.

In a first row RT1 of the color converting substrate 30_1, first light transmitting regions TA1, second light transmitting regions TA2, and the third light transmitting regions TA3 may be arranged in the order of first, second, and third light transmitting regions TA1, TA2, and TA3 or in the order of third, second, and first light transmitting regions TA3, TA2, and TA1. Two identical light transmitting regions TA, for example, the first light transmitting regions TA1 or the third light transmitting regions TA3, may be disposed adjacent to each other between a first region where the first light transmitting regions TA1, the second light transmitting regions TA2, and the third light transmitting regions TA3 are arranged in the order of first, second, and third light transmitting regions TA1, TA2, and TA3 and a second region where the first light transmitting regions TA1, the second light transmitting regions TA2, and the third light transmitting regions TA3 are arranged in the order of third, second, and first light transmitting regions TA3, TA2, and TA1. In the color converting substrate 30_1, barriers 370 and light blocking members 220 may not be provided between every two adjacent identical light transmitting regions TA, and the light blocking patterns 240_1 may be disposed between every two adjacent identical light transmitting regions TA. In the color converting substrate 30_1 of FIG. 24, unlike in the color converting substrate 30 of FIG. 14, the barriers 370, seventh light blocking members 227, and eighth light blocking members 228 are not provided in a seventh light blocking region BA7 where two first light transmitting regions TA1 are disposed adjacent to each other and in an eighth light blocking region BA8 where two fourth light transmitting regions TA4 are disposed adjacent to each other, and the light blocking patterns 240_1 may be disposed in the seventh and eighth light blocking regions BA7 and BA8. Accordingly, the first light transmitting regions TA1 may have first light blocking members 221 disposed on sides thereof that are adjacent to the second light transmitting regions TA2 and may have the light blocking patterns 240_1 disposed on sides thereof that are adjacent to other first light transmitting regions TA1. That is, in the color converting substrate 30_1 of FIG. 24, the first light transmitting regions TA1 may be second-type light transmitting regions.

During the fabrication of the color converting substrate 30_1 of FIG. 24, the light transmitting patterns 350 and the first wavelength converting patterns 330 can be formed in two types of light transmitting regions TA, i.e., two third light transmitting regions TA3 and two first light transmitting regions TA1. Although not specifically illustrated, the first wavelength converting patterns 330, like the light transmitting patterns 350, may overlap with the light blocking patterns 240_1 in the plan view.

Figure 25:
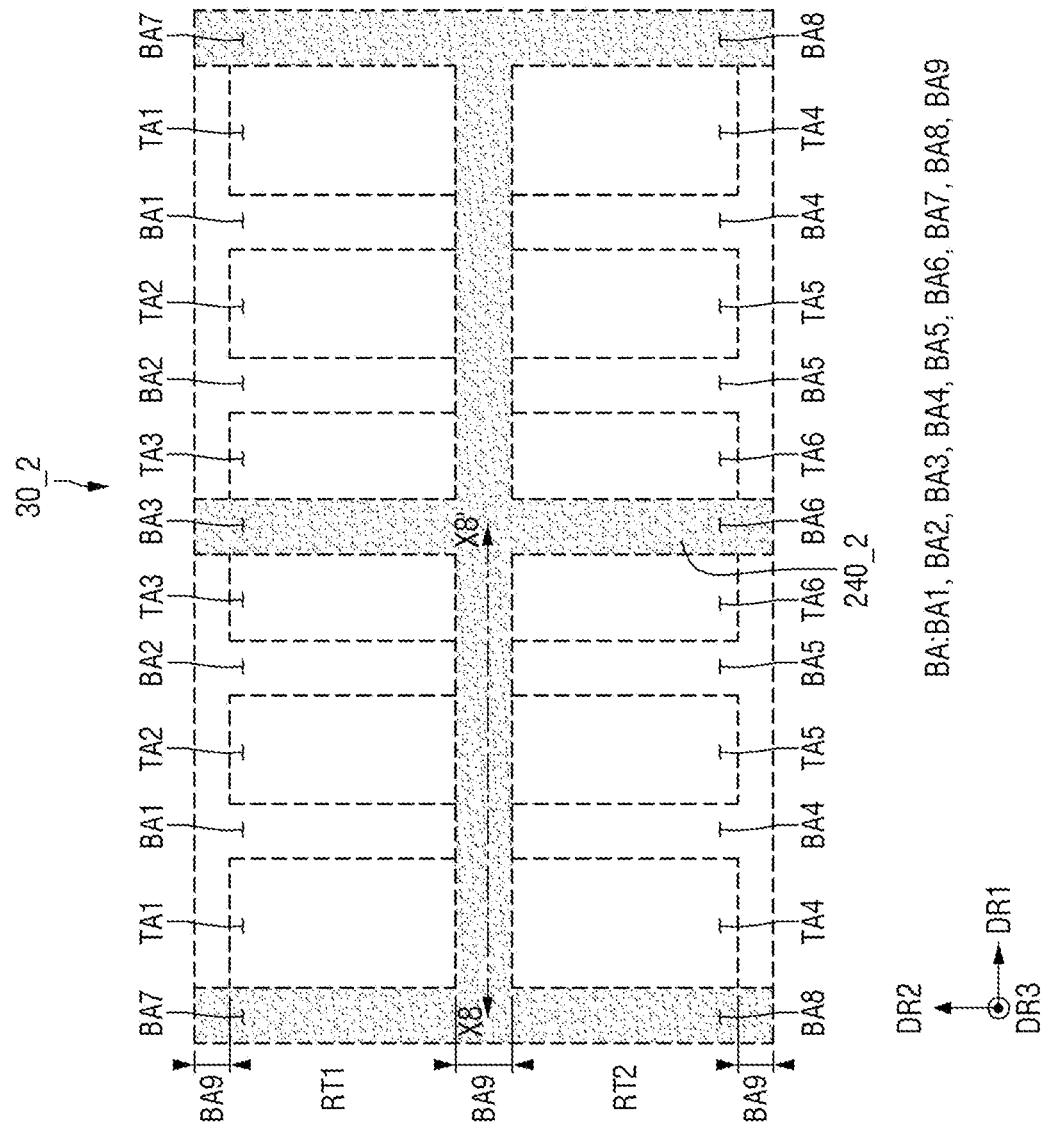
FIG. 25 is a plan view illustrating the arrangement of a light blocking pattern in a color converting substrate according to another embodiment of the disclosure.
Figure 26:
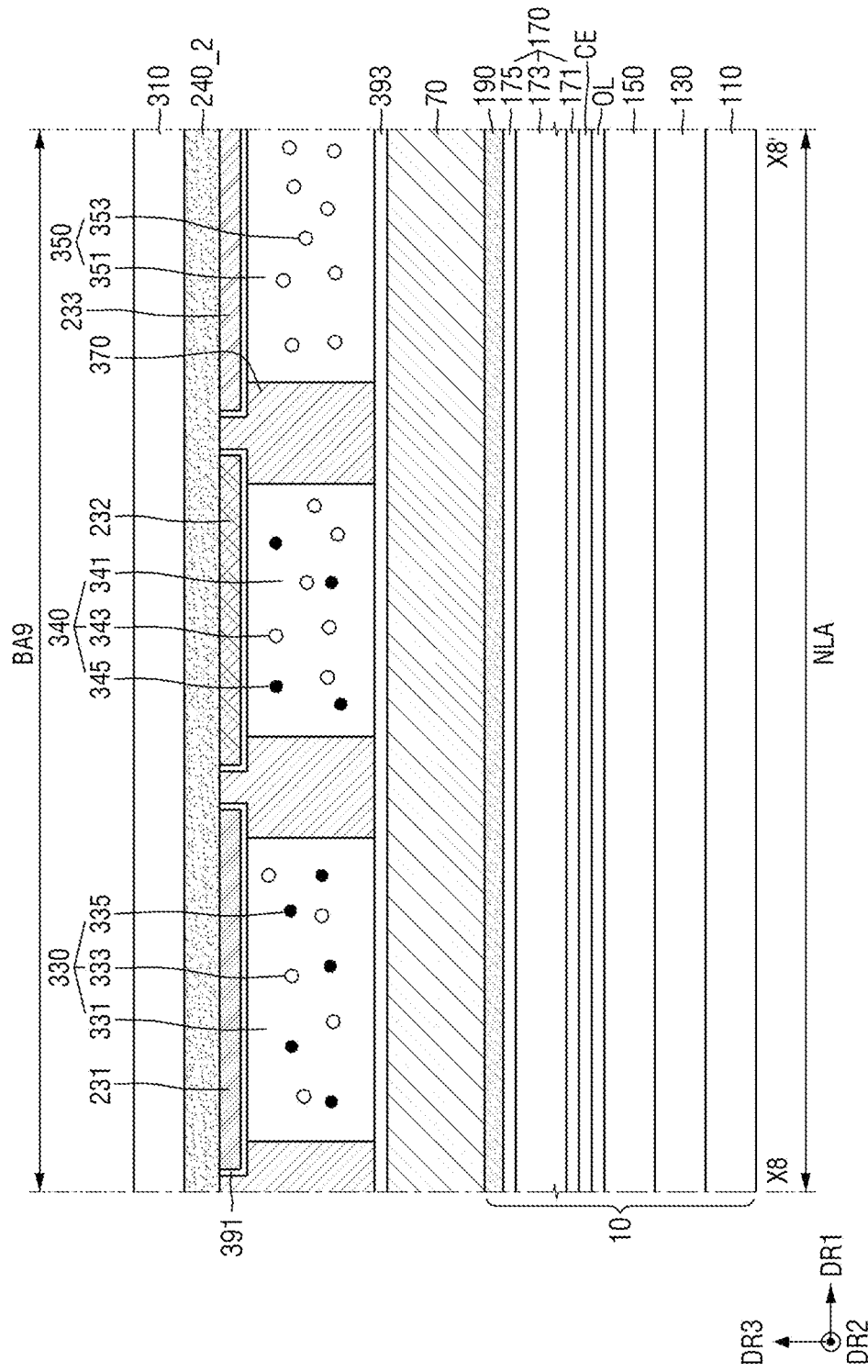
FIG. 26 is a cross-sectional view taken along line X8-X8' of FIG. 25.

FIG. 25 is a plan view illustrating the arrangement of a light blocking pattern in a color converting substrate according to another embodiment of the disclosure. FIG. 26 is a cross-sectional view taken along line X8-X8' of FIG. 25.

Referring to FIGS. 25 and 26, a light blocking pattern 240_2 of a color converting substrate 30_2 may be disposed in ninth light blocking regions BA9 to extend in a first direction DR1. The color converting substrate 30_2 of FIG. 25 is the same as the color converting substrate 30_1 of FIG. 24 except that the light blocking pattern 240_2 is disposed in the ninth light blocking regions BA9. The color converting substrate 30_2 of FIG. 25 will hereinafter be described, focusing mainly on the differences with the color converting substrate 30_1 of FIG. 24.

In the color converting substrate 30_2 of FIGS. 25 and 26, ninth light blocking members 229 are not provided, and the light blocking pattern 240_2 may be disposed in the ninth light blocking regions BA9. During the fabrication of the color converting substrate 30_2, the light blocking pattern 240_2 may be formed by applying laser light between each pair of adjacent identical light transmitting regions, for example, between third light transmitting regions TA3 and between first light transmitting regions TA1. The laser light may also be applied between first and second rows RT1 and RT2 of the color converting substrate 30_2, i.e., in the ninth light blocking regions BA9. Parts of the light blocking pattern 240_2 disposed between each pair of adjacent light transmitting regions may extend in a second direction DR2, and parts of the light blocking pattern 240_2 disposed between the first and second rows RT1 and RT2 may extend in the first direction DR1.

Although not specifically illustrated, first wavelength converting patterns 330, second wavelength converting patterns 340, and light transmitting patterns 350 may be formed as islands that are spaced apart from one another in the ninth light blocking regions BA9, instead of extending in the second direction DR2. Also, first color filters 231, second color filters 232, and third color filters 233 may be formed as islands. In this case, in the ninth light blocking regions BA9 of FIG. 26, the first color filters 231, the second color filters 232, the third color filters 233, the first wavelength converting patterns 330, the second wavelength converting patterns 340, and the light transmitting patterns 350 may not be disposed, and barriers 370 may be formed instead.

Figure 27:
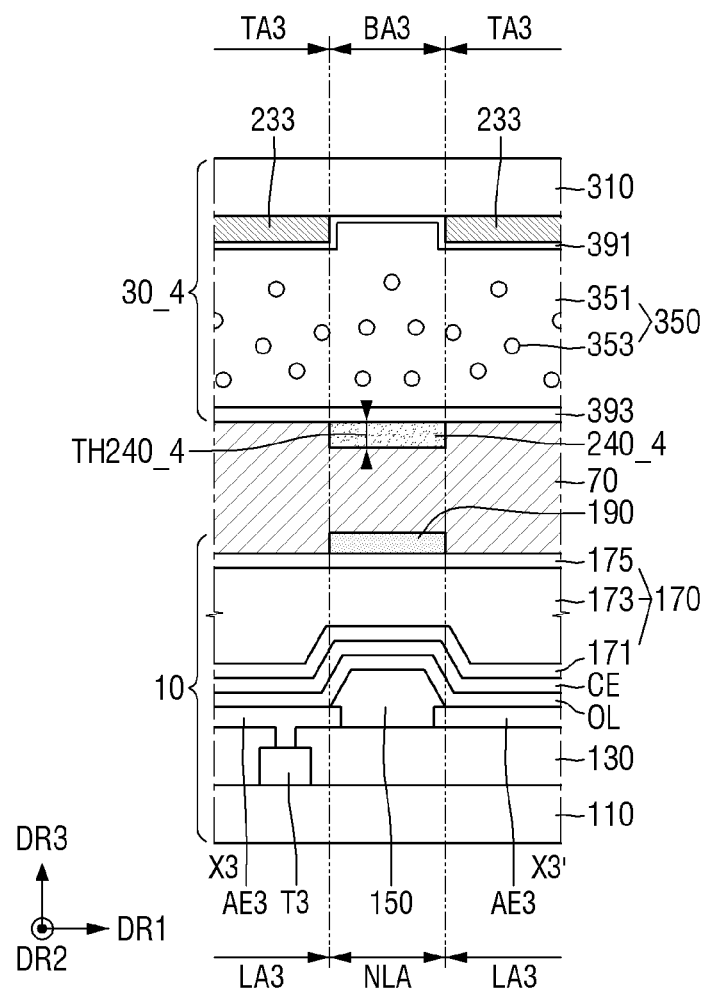
FIGS. 27 and 28 are cross-sectional views illustrating light blocking patterns according to other embodiments of the disclosure.
Figure 28:
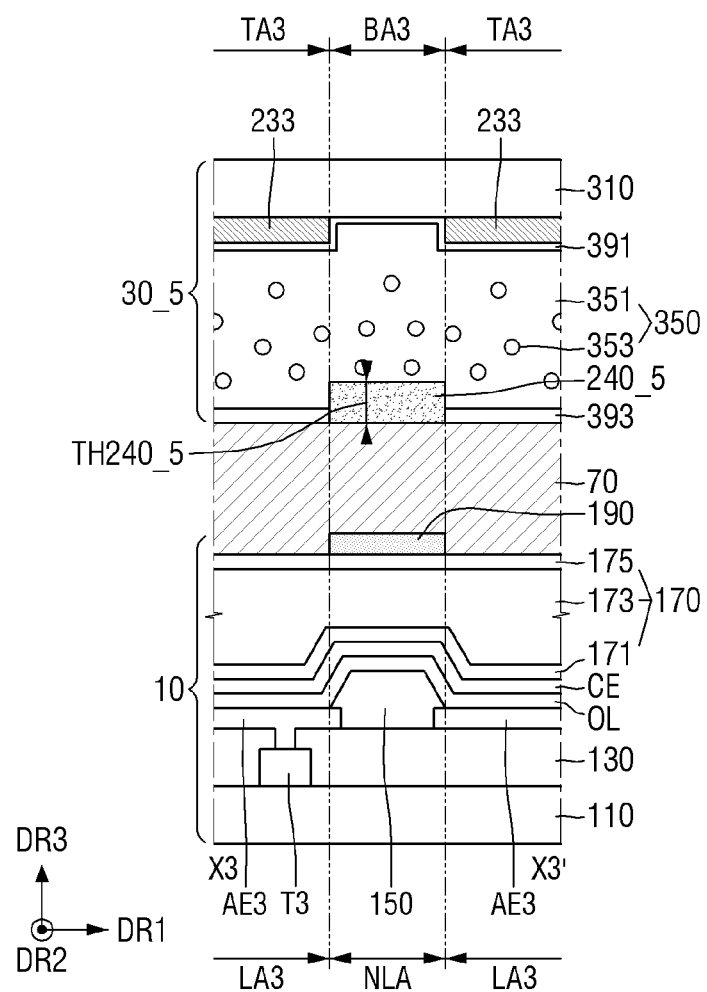

FIGS. 27 and 28 are cross-sectional views illustrating light blocking patterns according to other embodiments of the disclosure.

As described above, laser light for forming a light blocking pattern 240 during the fabrication of a color converting substrate 30 may not necessarily be applied from below the other surface of a second base part 310. Also, the light blocking pattern 240 may not necessarily be formed by applying laser light, but may be formed by patterning substantially the same material as light blocking members 220.

Referring to FIG. 27, a light blocking pattern 240_4 may be disposed on one surface of a second capping layer 393. A color converting substrate 30_4 of FIG. 27 may be disposed on the second capping layer 393 and may prevent color mixing that may occur between adjacent third light transmitting regions TA3. The light blocking pattern 240_4 may be spaced apart from the second base part 310. In this case, the light blocking pattern 240_4 may be positioned closer to a display substrate 10, upon which emission light L is incident, in the color converting substrate 30_4 than in the color converting substrate 30 of FIGS. 5 and 6.

In one example, a thickness TH240_4 of the light blocking pattern 240_4, which is positioned on the second capping layer 393, may be smaller than the thickness TH240 of the light blocking pattern 240 on one surface of the second base part 310. As the light blocking pattern 240_4 is positioned close to light-emitting elements ED, light emitted from arbitrary light-emitting elements, i.e., third light-emitting elements ED3, can be prevented from being output to other third light transmitting regions TA3 than their respective third light transmitting regions, even though the light blocking pattern 240_4 is thinner than when positioned on one surface of the second base part 310.

The light blocking pattern 240_4 may include substantially the same material as the light blocking members 220 and may be formed by the same method as the light blocking members 220. The light blocking pattern 240_4 of FIG. 27 may be formed by forming light transmitting patterns 350 and the second capping layer 393, which covers the light transmitting patterns 350, on one surface of the second base part 310 and coating and exposing an organic light-blocking material on the second capping layer 393, but the disclosure is not limited thereto.

Referring to FIG. 28, a light blocking pattern 240_5 may be formed to be spaced apart from a second base part 310, but may be surrounded by light transmitting patterns 350. That is, side surfaces of the light blocking pattern 240_5 may be in contact with the light transmitting patterns 350, but not with third color filters 233. The side surface of the light blocking pattern 240_5 is a surface parallel to the third direction DR3 as shown in FIG. 28. The light blocking pattern 240_5 may be formed by forming the light transmitting patterns 350 and a second capping layer 393, which covers the light transmitting patterns 350, on one surface of the second base part 310 and applying laser light from above the second capping layer 393 to carbonize parts of the second capping layer 393 and the light transmitting patterns 350. The light blocking pattern 240_5 of FIG. 28, unlike the light blocking pattern 240 of FIGS. 5 and 6, may be spaced apart from the second base part 310 and may thus be in contact with the second capping layer 393, instead of being in contact with a first capping layer 391.

Also, the light blocking pattern 240_5 of FIG. 28 may be positioned closer than the light blocking pattern 240 of FIGS. 5 and 6 to a display substrate 10, upon which emission light L is incident.

In one example, a thickness TH240_5 of the light blocking pattern 240_5, which is formed to be in contact with the second capping layer 393, may be smaller than the thickness TH240 of the light blocking pattern 240, which is positioned on one surface of the second base part 310. This is the same as described above with reference to FIG. 27, and thus, a detailed description thereof will be omitted.

Figure 29:
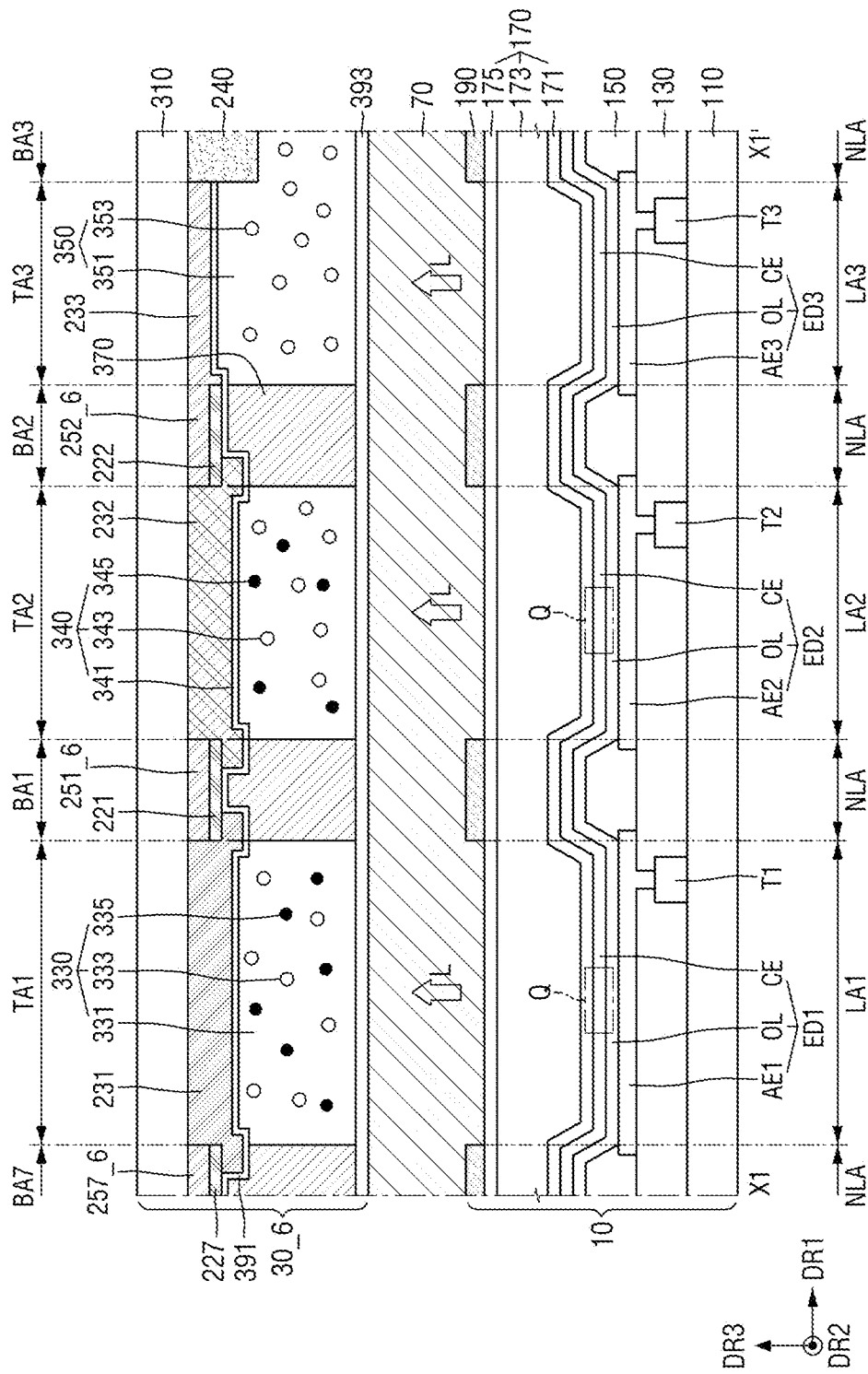
FIGS. 29 and 30 are cross-sectional views of display devices according to other embodiments of the disclosure.
Figure 30:
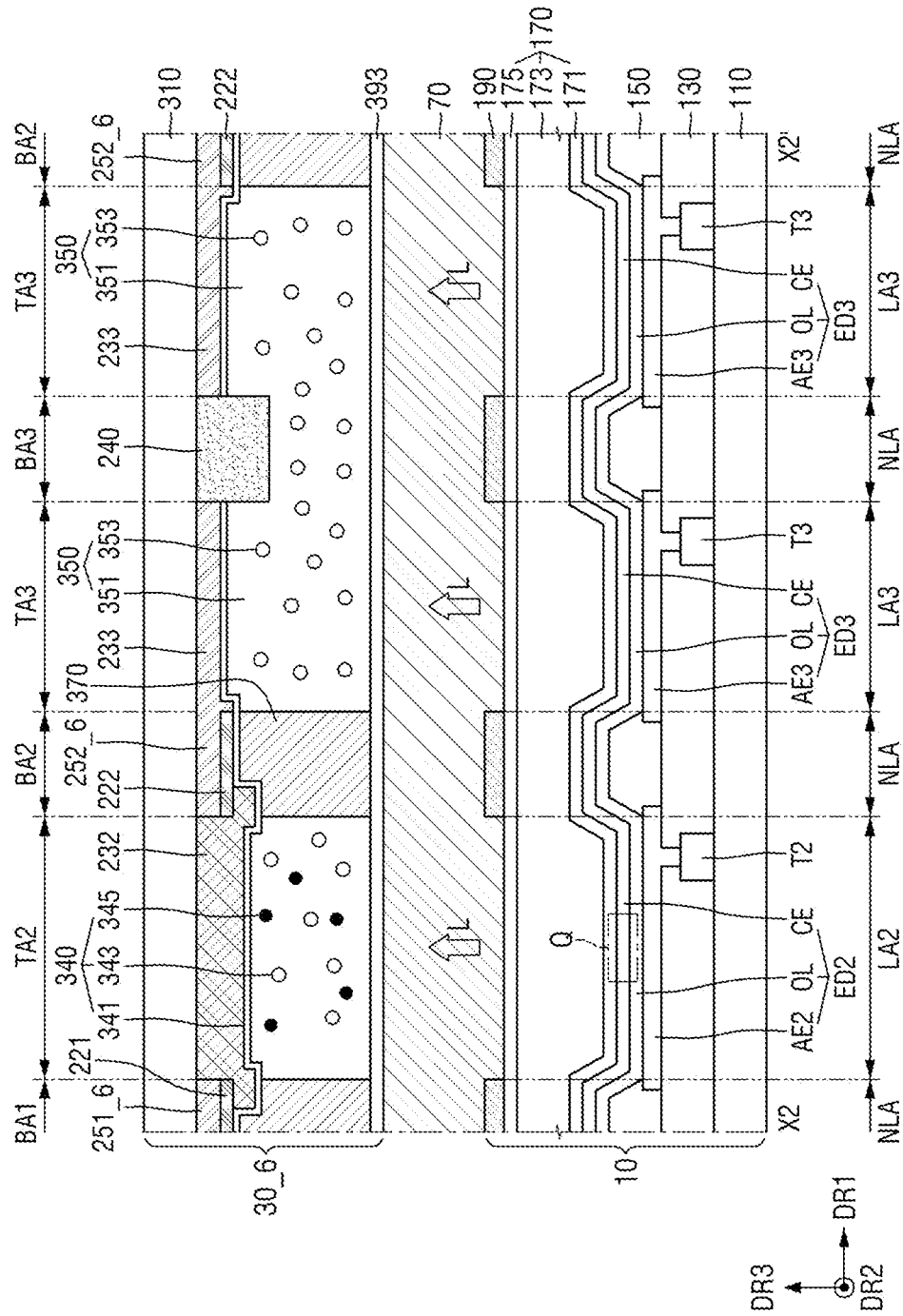

FIGS. 29 and 30 are cross-sectional views of display devices according to other embodiments of the disclosure. FIG. 29 is a cross-sectional view taken across first, second, and third light transmitting regions TA1, TA2, and TA3 of a display device 1 according to another embodiment of the disclosure, and FIG. 30 is a cross-sectional view taken across a second light transmitting region TA2, a third light transmitting region TA3, and another third light transmitting region TA3 of the display device 1 according to another embodiment of the disclosure.

Referring to FIGS. 29 and 30, a color converting substrate 30_6 may further include a plurality of color patterns (251_6, 252_6, and 257_6). The color converting substrate 30_6 of FIGS. 29 and 30 is the same as the color converting substrate 30 of FIGS. 5 and 6 except that it further includes the color patterns (251_6, 252_6, and 257_6), which are disposed on one surface of a second base part 310. Thus, the color converting substrate 30_6 of FIGS. 29 and 30 will hereinafter be described, focusing mainly on the differences with the color converting substrate 30 of FIGS. 5 and 6.

The color patterns (251_6, 252_6, and 257_6) can reduce the reflection of external light by absorbing some of the light introduced from outside the display device 1 to the color converting substrate 30_6.

In some embodiments, the color patterns (251_6, 252_6, and 257_6), like third color filters 233, may include a blue colorant such as a blue pigment or a blue dye. In some embodiments, the color patterns (251_6, 252_6, and 257_6) may be formed of the same material as the third color filters 233 and may be formed during the formation of the third color filters 233. That is, the third color filters 233 and the color patterns (251_6, 252_6, and 257_6) may be formed at the same time by applying a photosensitive organic material including a blue colorant on one surface of the second base part 310 and exposing and developing the photosensitive organic material.

In some embodiments, the thickness of the color patterns (251_6, 252_6, and 257_6) may be substantially the same as the thickness of the third color filters 233. In a case where the color patterns (251_6, 252_6, and 257_6) include a blue colorant, external light or reflected light passing through the color patterns (251_6, 252_6, and 257_6) may have a blue wavelength range. Eye color sensibility may vary depending on the color of light. Specifically, blue-wavelength light may be perceived by a user less sensitively than green- and red-wavelength light. Thus, as the color patterns (251_6, 252_6, and 257_6) include a blue colorant, the user can perceive reflected light less sensitively.

Some of the color patterns (251_6, 252_6, and 257_6) may be positioned on the surface of the second base part 310 and may be located in light blocking regions BA. Also, the color patterns (251_6, 252_6, and 257_6) may be disposed to overlap with a non-emission region NLA in the plan view. In some embodiments, the color patterns (251_6, 252_6, and 257_6) may be in direct contact with the surface of the second base part 310. Alternatively, in a case where a separate buffer layer for preventing the introduction of impurities is disposed on the surface of the second base part 310, the color patterns (251_6, 252_6, and 257_6) may be in direct contact with the buffer layer.

In some embodiments, the color patterns (251_6, 252_6, and 257_6) may include first color patterns 251_6, which are positioned in first light blocking regions BA1, second color patterns 252_6, which are positioned in second light blocking regions BA2, and seventh color patterns 257_6, which are positioned in seventh light blocking regions BA7. Although not specifically, color patterns may also be disposed in fourth light blocking regions BA4, fifth light blocking regions BA5, eighth light blocking regions BAB, and ninth light blocking regions BA9. However, color patterns may be formed in third and sixth light blocking regions BA3 and BA6 by substantially the same process as the third color filters 233 and may form a light blocking pattern 240 via laser light. Color patterns adjacent to the third color filters 233, i.e., the second color patterns 252_6, may be connected to the third color filters 233.

As the color patterns (251_6, 252_6, and 257_6) are disposed on the surface of the second base part 310, light blocking members 220 may be positioned on the color patterns (251_6, 252_6, and 257_6). In some embodiments, first light blocking members 221 may be positioned on the first color patterns 251_6, second light blocking members 222 may be positioned on the second color patterns 252_6, and seventh light blocking members 227, which are positioned on the seventh color patterns 257_6. Although not specifically illustrated, color patterns may also be positioned on the fourth light blocking members 224, the fifth light blocking members 225, the eighth light blocking members 228, and the ninth light blocking members 229. In some embodiments, as the color patterns (251_6, 252_6, and 257_6) are positioned between the light blocking members 220 and the second base part 310, the light blocking members 220 may not be in contact with the second base part 310.

The color patterns (251_6, 252_6, and 257_6) can reduce the reflection of external light by absorbing some of the light introduced from outside the display device 1 to the color converting substrate 30.

Meanwhile, the display device 1 may have a different layout of the emission regions LA of the display substrate 10 and the light transmitting regions TA of the color converting substrate 30 from that illustrated in FIGS. 3 and 4. In some embodiments, different emission regions LA and different light transmitting regions TA may be alternately arranged in the first and second directions DR1 and DR2.

Figure 31:
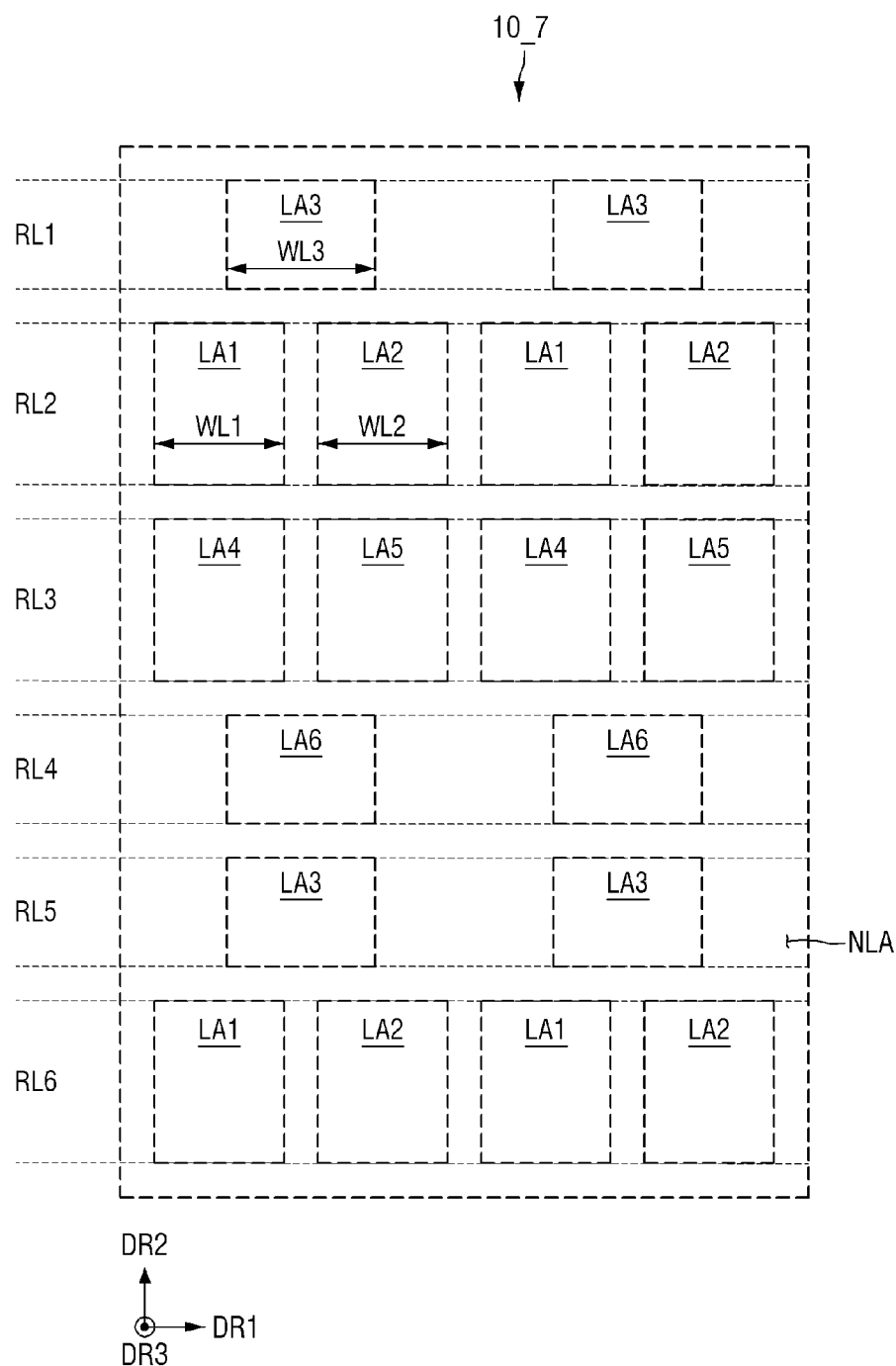
FIG. 31 is a plan view of a display substrate in a display area of a display device according to another embodiment of the disclosure.
Figure 32:
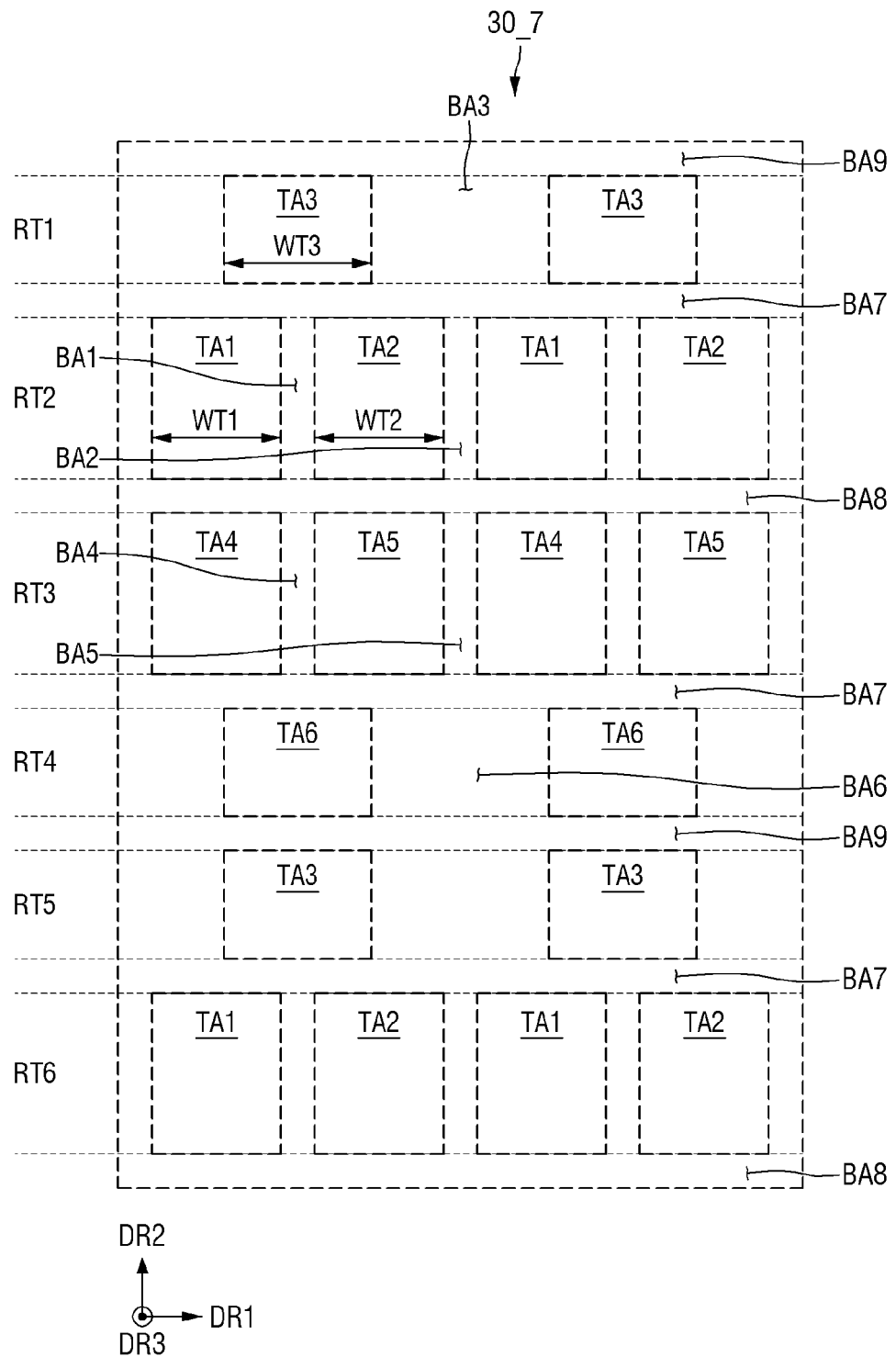
FIG. 32 is a plan view of a color converting substrate in the display area of the display device of FIG. 31.
Figure 33:
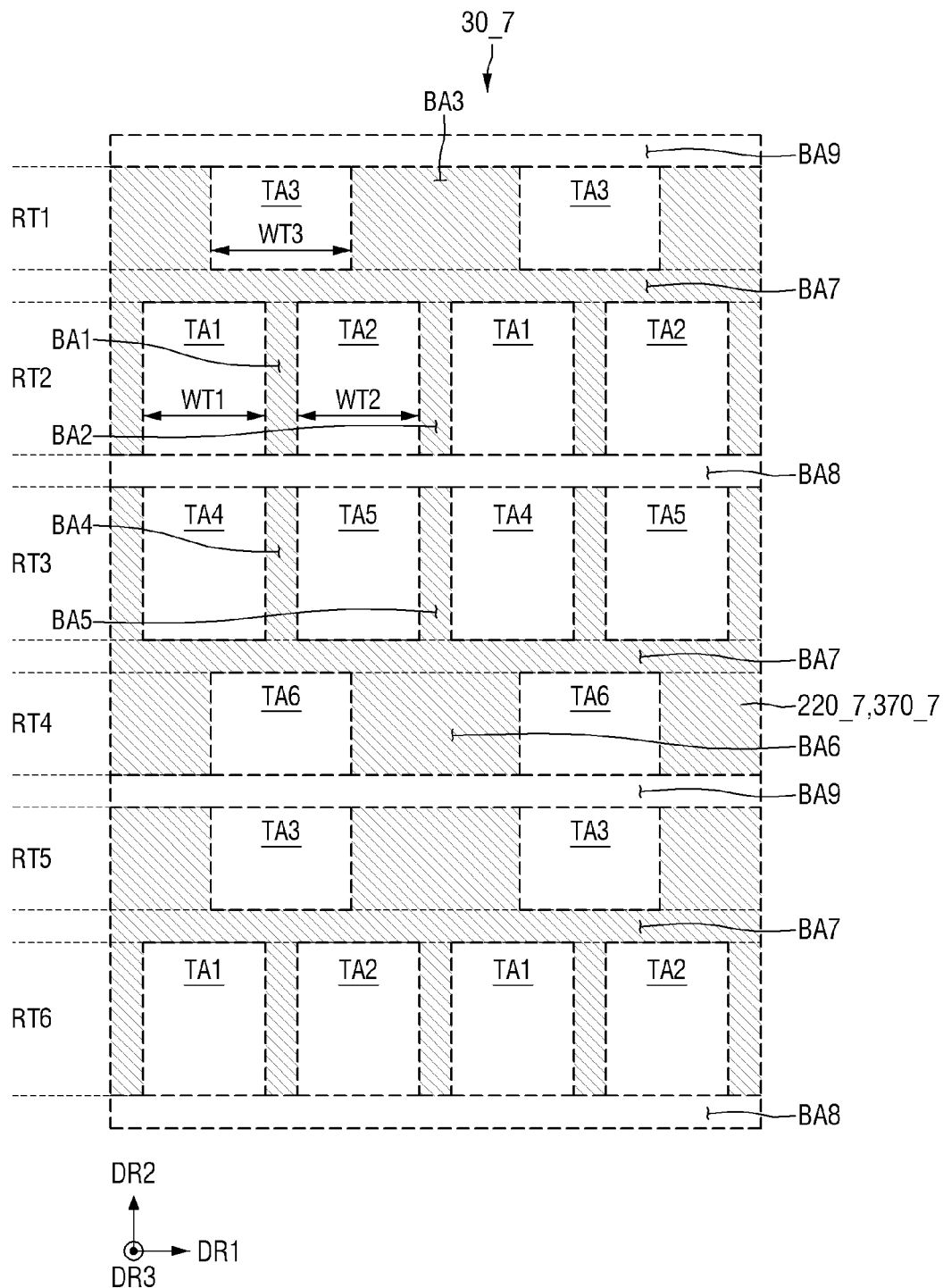
FIG. 33 is a plan view illustrating the arrangement of barriers and light blocking members in the color converting substrate of FIG. 32.
Figure 34:
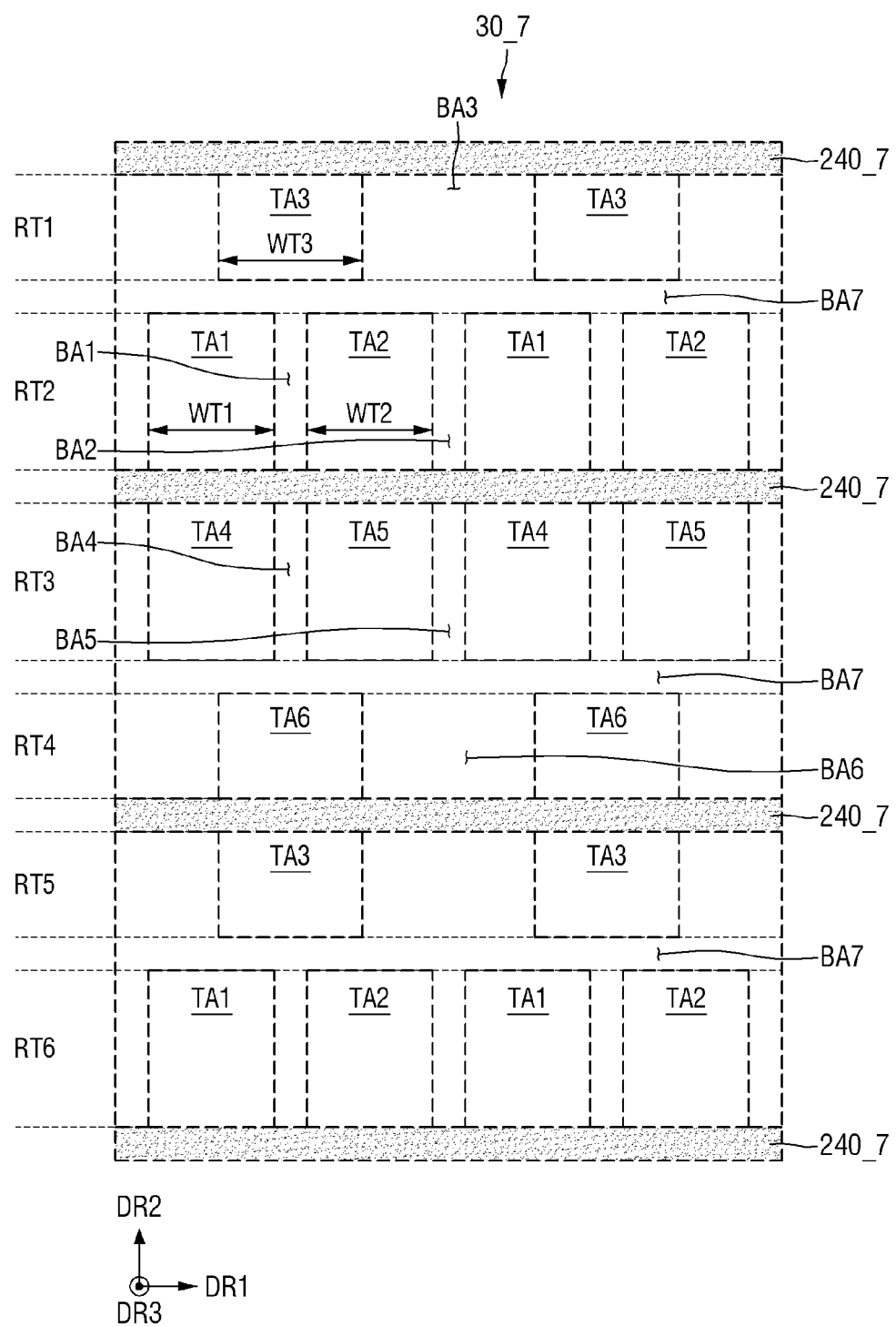
FIG. 34 is a plan view illustrating the arrangement of light blocking patterns in the color converting substrate of FIG. 32.

FIG. 31 is a plan view of a display substrate in a display area of a display device according to another embodiment of the disclosure. FIG. 32 is a plan view of a color converting substrate in the display area of the display device of FIG. 31. FIG. 33 is a plan view illustrating the arrangement of barriers and light blocking members in the color converting substrate of FIG. 32. FIG. 34 is a plan view illustrating the arrangement of light blocking patterns in the color converting substrate of FIG. 32.

Referring to FIGS. 31 through 34, a display substrate 10_7 may include a plurality of emission regions LA, which are arranged in multiple rows RL in a display area DA. The rows RL may include odd-numbered rows (RL1, RL3, RL5, . . . ) and even-numbered rows (RL2, RL4, RL6, . . . ) and may include different types of emission regions LA from one another.

In one example, in a first row RL1 of the display substrate 10_7, third emission regions LA3 may be repeatedly arranged, and in a second row RL2 of the display substrate 10_7, first emission regions LA1 and second emission regions LA2 may be alternately arranged. The first emission regions LA1 and the second emission regions LA2 may be disposed to be spaced apart from one another in a first direction DR1, in the second row RL2, and the third emission region LA3 may be disposed to be aligned in the spaces between the first emission regions LA1 and the second emission regions LA2 in a second direction DR2, in the first row RL1, and may thus be arranged in a staggered fashion with the first emission regions LA1 and the second emission regions LA2. In the first row RL1, which is an odd-numbered row, the third emission regions LA3 may be disposed, and in the second row RL2, which is an even-numbered row, the first emission regions LA1 and the second emission regions LA2 may be disposed.

On the contrary, in a third row RL3, which is an odd-numbered row, fourth emission regions LA4 and fifth emission regions LA5 may be alternately arranged, and in a fourth row RL4, which is an even-numbered row, sixth emission regions LA6 may be repeatedly arranged. The fourth emission regions LA4 and the fifth emission regions LA5 may be disposed to be spaced apart from one another in the first direction DR1, in the third row RL3, and the sixth emission regions LA6 may be disposed to be aligned in the spaces between the fourth emission regions LA4 and the fifth emission regions LA5 in the second direction DR2, in the fourth row RL4, and may thus be arranged in a staggered fashion with the fourth emission regions LA4 and the fifth emission regions LA5. The arrangements of the emission regions LA in the first and second rows RL1 and RL2 may be symmetrical with the arrangements of the emission regions LA in the third and fourth rows RL3 and RL4.

The arrangements of the emission regions LA in fifth and sixth rows RL5 and RL6 may be the same as the arrangements of the emission regions LA in the first and second rows RL1 and RL2. That is, in the fifth rows RL5, third emission regions L3 may be repeatedly arranged, and in the sixth row RL6, first emission regions LA1 and second emission regions LA2 may be alternately arranged.

Accordingly, the first emission regions LA1 and the fourth emission regions LA2 may be disposed adjacent to one another in the second direction DR2, and the second emission regions LA2 and the fifth emission regions LA5 may be disposed adjacent to one another in the second direction DR2. Also, the third emission regions LA3 and the sixth emission regions LA6 may be disposed adjacent to one another in the second direction DR2. The arrangement of the emission regions LA of the display substrate 10_7 may correspond to the arrangement of light transmitting regions TA of a color converting substrate 30_7. In some embodiments, light transmitting regions TA that transmit light of the same color therethrough may be disposed adjacent to one another, and emission regions LA corresponding to the transmitting regions TA that transmit light of the same color therethrough may also be disposed adjacent to one another.

As described above, a region where the light emitting regions LA are not disposed may be defined as a non-emission region NLA.

The emission regions LA may have widths (WL1, WL2, and WL3) in the first direction DR1. A first width WL1 of the first emission regions LA1 and a second width WL2 of the second emission regions WL2 are illustrated as being greater than a third width WL3 of the third emission regions LA3, but the disclosure is not limited thereto. The widths and the areas of the first emission regions LA1, the second emission regions LA2, the third emission regions LA3, the fourth emission regions LA4, the fifth emission regions LA5, and the sixth emission regions LA6 may vary, as necessary.

Similarly, the display area DA of the color converting substrate 30_7 may include a plurality of light transmitting regions TA, which are disposed in multiple rows RT. The rows RT may include odd-numbered rows (RT1, RT3, RT5, . . . ) and even-numbered rows (RT2, RT4, RT6, . . . ) and may include different types of light transmitting regions TA from one another.

In one example, in a first row RT1 of the color converting substrate 30_7, third light transmitting regions TA3 may be repeatedly arranged, and in a second row RT2 of the color converting substrate 30_7, first light transmitting regions TA1 and second light transmitting regions TA2 may be alternately arranged. The first light transmitting regions TA1 and the second light transmitting regions TA2 may be disposed to be spaced apart from one another in the first direction DR1, in the second row RT2, and the third emission region LA3 may be disposed to be aligned in the spaces between the first light transmitting regions TA1 and the second light transmitting regions TA2 in the second direction DR2, in the first row RT1, and may thus be arranged in a staggered fashion with the first light transmitting regions TA1 and the second light transmitting regions TA2. In the first row RT1, which is an odd-numbered row, the third light transmitting regions TA3 may be disposed, and in the second row RT2, which is an even-numbered row, the first light transmitting regions TA1 and the second light transmitting regions TA2 may be disposed.

On the contrary, in a third row RT3, which is an odd-numbered row, fourth light transmitting regions TA4 and fifth light transmitting regions TA5 may be alternately arranged, and in a fourth row RT4, which is an even-numbered row, sixth light transmitting regions TA6 may be repeatedly arranged. The fourth light transmitting regions TA4 and the fifth light transmitting regions TA5 may be disposed to be spaced apart from one another in the first direction DR1, in the third row RT3, and the sixth light transmitting regions TA6 may be disposed to be aligned in the spaces between the fourth light transmitting regions TA4 and the fifth light transmitting regions TA5 in the second direction DR2, in the fourth row RT4, and may thus be arranged in a staggered fashion with the fourth light transmitting regions TA4 and the fifth light transmitting regions TA5. The arrangements of the light transmitting regions TA in the first and second rows RT1 and RT2 may be symmetrical with the arrangements of the light transmitting regions TA in the third and fourth rows RT3 and RT4.

The arrangements of the light transmitting regions TA in fifth and sixth rows RT5 and RT6 may be the same as the arrangements of the light transmitting regions TA in the first and second rows RT1 and RT2. That is, in the fifth rows RT5, third light transmitting regions T3 may be repeatedly arranged, and in the sixth row RT6, first light transmitting regions TA1 and second light transmitting regions TA2 may be alternately arranged.

Accordingly, the first light transmitting regions TA1 and the fourth light transmitting regions TA2 may be disposed adjacent to one another in the second direction DR2, and the second light transmitting regions TA2 and the fifth light transmitting regions TA5 may be disposed adjacent to one another in the second direction DR2. Also, the third light transmitting regions TA3 and the sixth light transmitting regions TA6 may be disposed adjacent to one another in the second direction DR2.

As described above, as color filters including the same colorant, for example, first color filters 231, are disposed in the first light transmitting regions TA1 and the fourth light transmitting regions TA4, the first light transmitting regions TA1 and the fourth light transmitting regions TA4 may transmit light of the same color therethrough. Also, as color filters including the same colorant, for example, second color filters 232, are disposed in the second light transmitting regions TA2 and the fifth light transmitting regions TA5, the second light transmitting regions TA2 and the fifth light transmitting regions TA5 may transmit light of the same color therethrough. Also, as color filters including the same colorant, for example, third color filters 233, are disposed in the third light transmitting regions TA3 and the sixth light transmitting regions TA6, the third light transmitting regions TA3 and the sixth light transmitting regions TA6 may transmit light of the same color therethrough.

Although not specifically illustrated, first wavelength converting patterns 330 and first color filters 231 may be disposed in the first light transmitting regions TA1, second wavelength converting pattern 340 and second color filters 232 may be disposed in the second light transmitting regions TA2, and light transmitting patterns 350 and third color filters 233 may be disposed in the third light transmitting regions TA3. Also, first wavelength converting patterns 330 and first color filters 231 may be disposed in the fourth light transmitting regions TA4, second wavelength converting pattern 340 and second color filters 232 may be disposed in the fifth light transmitting regions TA5, and light transmitting patterns 350 and third color filters 233 may be disposed in the sixth light transmitting regions TA6. Wavelength converting patterns (330 and 340) and light transmitting patterns 350 may be disposed in areas surrounded by barriers 370_7, which are disposed in the light blocking regions BA, to correspond to the light transmitting regions TA. In some embodiments, the wavelength converting patterns (330 and 340) and the light transmitting patterns 350 may be disposed on one surface of a second base part 310 to form island patterns.

In the color converting substrate 30_7, light transmitting regions TA where identical color filters are disposed to transmit light of the same color therethrough may be arranged adjacent to one another at least in the second direction DR2. The first light transmitting regions TA1 and the second light transmitting regions TA2, which are alternately arranged in the second row RT2 of the color converting substrate 30_7, may be disposed adjacent to the fourth light transmitting regions TA4 and the fifth light transmitting regions TA5, respectively, which are alternately arranged in the third row RT3 of the color converting substrate 30_7. Also, the sixth light transmitting regions TA6, which are repeatedly arranged in the fourth row RT4, may be arranged adjacent to the third light transmitting regions TA3, which are repeatedly arranged in the fifth row RT5. The emission regions LA of the display substrate 10_7 of the display device 1 may be arranged to correspond to the light transmitting regions TA of the color converting substrate 30_7.

The light blocking regions BA may be defined in a region where the light transmitting regions TA are not disposed. The light blocking regions BA may include first light blocking regions BA1 between the first light transmitting regions TA1 and the second light transmitting regions TA2 and a third light blocking region BA3 between the third light transmitting regions TA3. The light blocking regions BA may further include fourth light blocking regions BA4 between the fourth light transmitting regions TA4 and the fifth light transmitting regions TA5 and a sixth light blocking region BA6 between the sixth light transmitting regions TA6. The light blocking regions BA may further include seventh light blocking regions BA7, an eighth light blocking region BA8, and a ninth light blocking region BA9, which extend in the first direction DR1 between the rows RT. The seventh light blocking regions BA7 may be disposed between the first and second rows RT1 and RT2, the eighth light blocking region BA8 may be disposed between the second and third rows RT2 and RT3, and the ninth light blocking region BA9 may be disposed between the fourth and fifth rows RT4 and RT5. The seventh light blocking regions BA7 may also be disposed between the third and fourth rows RT3 and RT4 and between the fifth and sixth rows RT5 and RT6.

As described above, light blocking members 220_7, barriers 370_7, and light blocking patterns 240_7 may be disposed in the light blocking regions BA to separate each pair of adjacent light blocking regions TA. The light blocking patterns 240 may be disposed between each pair of adjacent light transmitting regions TA that transmit light of the same color therethrough. In one example, the light blocking patterns 240 may be disposed between the first light transmitting regions TA1 and the fourth light transmitting regions TA4, which are alternately arranged in the second and third rows RT2 and RT3, respectively, and between the second and fifth light transmitting regions TA2 and TA5, which are alternately arranged in the second and third rows RT2 and RT3, respectively. The light blocking patterns 240_7 may be disposed in the eighth light blocking region BA8 to separate each pair of adjacent light transmitting regions TA from the second and third rows RT2 and RT3. Also, the light blocking patterns 240_7 may be disposed between the third light transmitting regions TA3, which are repeatedly arranged in each of the fourth and fifth rows RT4 and RT5, i.e., in the ninth light blocking region BA9.

In light blocking regions BA where the light blocking patterns 240_7 are not disposed, the light blocking members 220_7 and the barriers 370_7 may be disposed. The light blocking members 220_7 and the barriers 370_7 may be disposed in all the light blocking regions BA except for the eighth and ninth light blocking regions BA8 and BA9 to surround the light transmitting regions TA. The light blocking members 220_7 and the barriers 370_7 may separate each pair of adjacent light transmitting regions that transmit light of different colors or of the same color therethrough.

The light blocking members 220_7 or the barriers 370_7 may be disposed between each pair of adjacent light transmitting regions TA to define each pair of adjacent light transmitting regions TA, but the light blocking patterns 240_7 may be disposed between light transmitting regions TA That transmit light of the same color therethrough. In the color converting substrate 30_7, some light transmitting regions TA that transmit light of the same color therethrough may be arranged adjacent to one another with no barriers 370_7 disposed therebetween. As described above, in a case where the wavelength converting patterns (330 and 340) and the light transmitting patterns 350 are formed by inkjet printing, a necessary amount of ink needs to be sprayed at a location corresponding to each of the light transmitting regions TA. In a case where light transmitting regions TA that transmit light of the same color therethrough are disposed adjacent to one another, the impact precision of ink required for ink to be precisely mounted in each of the light transmitting regions TA can be lowered because ink can be sprayed into neighboring light transmitting regions TA at the same time. Accordingly, during the fabrication of the color converting substrate 30_7 through inkjet printing, the impact precision of ink can be improved, and the distribution of inkjet printing processes using multiple nozzles can be improved.

Also, the light transmitting regions TA and the emission regions LA may have greater widths WL and WT in the first direction DR1 than their respective counterparts of FIG. 4 and may have smaller widths in the second direction DR2 than their respective counterparts of FIG. 4. As the difference between the width, in the first direction DR1, of the light transmitting regions TA and the length, in the second direction DR2, of the light transmitting regions TA decreases, any loss in the light conversion efficiency of the wavelength converting patterns 330 and 340 can be minimized.

Figure 35:
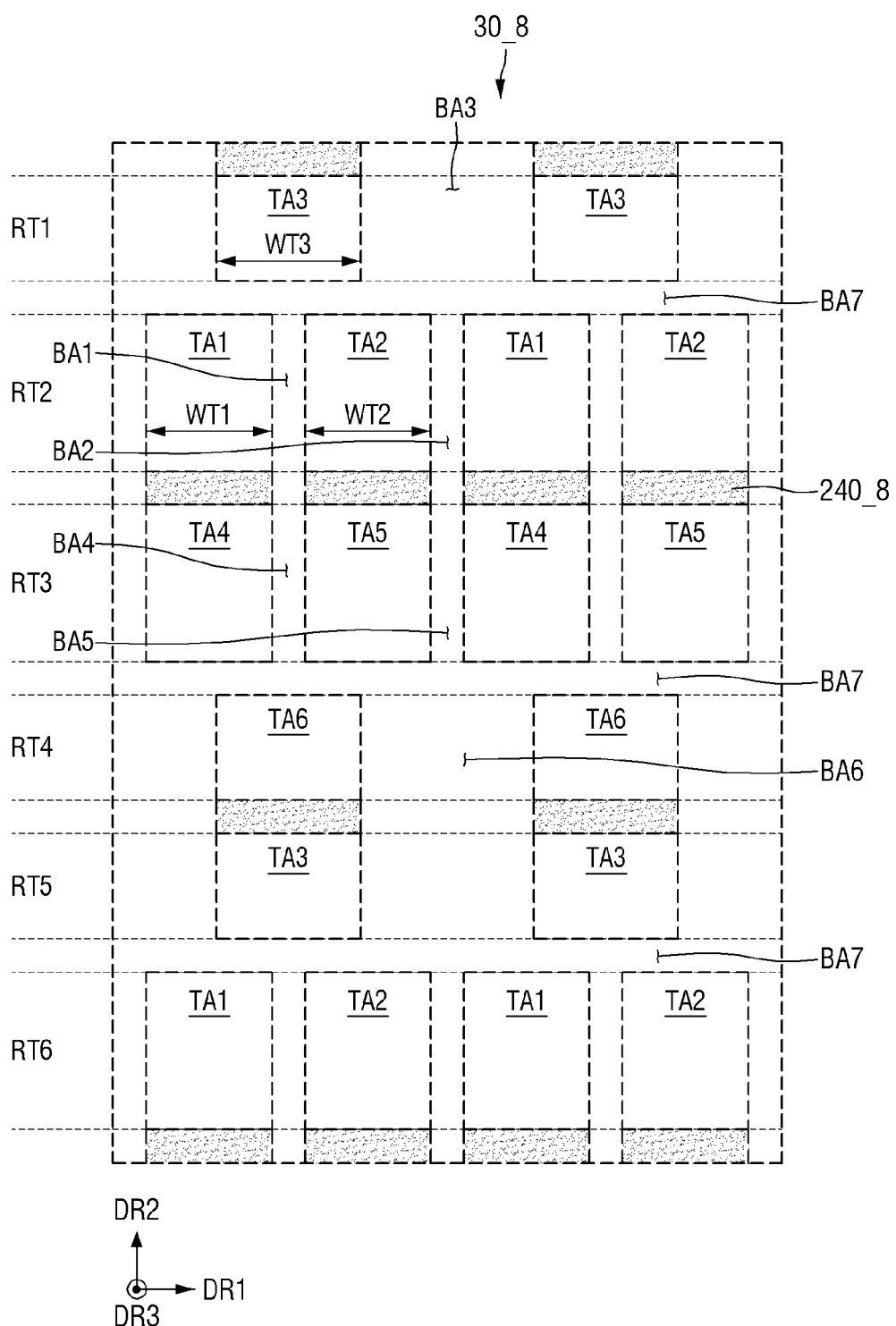
FIGS. 35 and 36 are plan views illustrating the arrangement of light blocking patterns in each of color converting substrates according to other embodiments of the disclosure.
Figure 36:
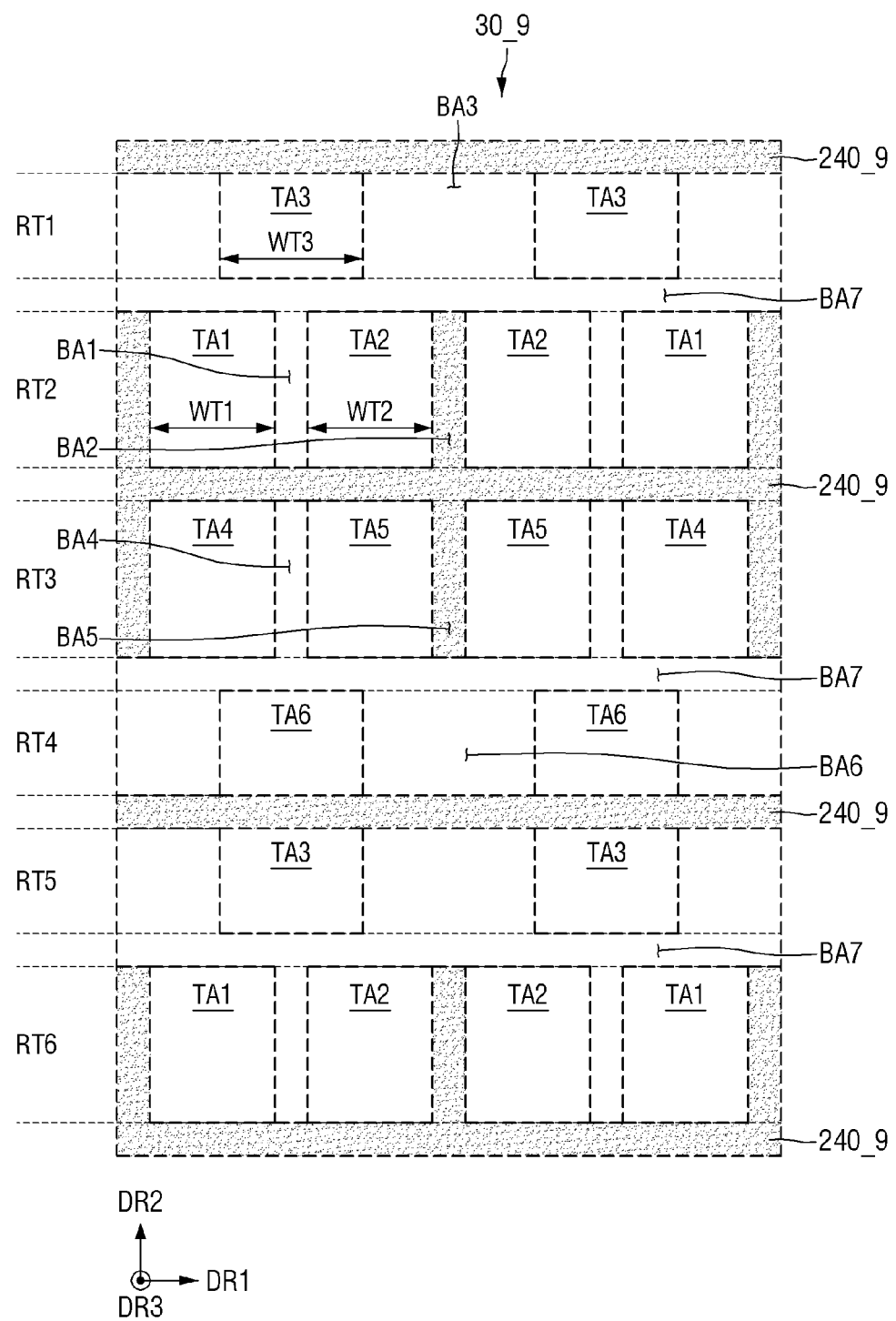

FIGS. 35 and 36 are plan views illustrating the arrangement of light blocking patterns in each of color converting substrates according to other embodiments of the disclosure.

Referring to FIG. 35, in a color converting substrate 30_8, light blocking patterns 240_8 may be disposed only between neighboring light transmitting regions TA. In the embodiment of FIG. 35, unlike in the embodiment of FIG. 34, the light blocking patterns 240_8 may be disposed only between light transmitting regions TA that transmit light of the same color therethrough. In one example, light blocking patterns 240_8 may be disposed only between second and third rows RT2 and RT3, particularly, between first and fourth light transmitting regions TA1 and TA4 and between second and fifth light transmitting regions TA2 and TA5. The light blocking patterns 240_8 disposed between the second and third rows RT2 and RT3 may be spaced apart from one another in a first direction DR1. In regions between the second row RT2 and the third row RT3 where the light blocking patterns 240_8 are not disposed, light blocking members 220 and barriers 370 may be disposed.

In the embodiment of FIG. 35, like in the embodiment of FIG. 34, as laser light is applied along the spaces between the light transmitting regions TA during the formation of the light blocking patterns 240_7, the light blocking patterns 240_7 may be formed to extend in the first direction DR1, but the disclosure is not limited thereto. Alternatively, the laser light may be applied only into the spaces between neighboring light transmitting regions TA so that the light blocking patterns 240_8 may be spaced apart from one another in the first direction DR1. The light blocking patterns 240_8 may be formed as island patterns, over the entire surface of the color converting substrate 30_8. The embodiment of FIG. 35 differs from the embodiment of FIG. 34 in the arrangement of the light blocking patterns 240_8.

Also, some of the light transmitting regions TA arranged in the same row may be identical light transmitting regions TA disposed adjacent to one another.

Referring to FIG. 36, some of light transmitting regions TA of a color converting substrate 30_9 may be identical light transmitting regions TA disposed adjacent to one another in a first direction DR1. In one example, first light transmitting regions TA1 and second light transmitting regions TA2 may be alternately arranged in a second row RT2, but the first light transmitting regions TA1 or the second light transmitting regions TA2 may be disposed adjacent to one another. Light blocking patterns 240_9 may be disposed even between each pair of adjacent first light transmitting regions TA1 and between each pair of adjacent second light transmitting regions TA2. That is, the light blocking patterns 240_9 may be disposed not only in eighth and ninth light blocking regions BA8 and BA9, but also in a second light blocking region BA2. In this case, barriers 370 and light blocking members 220 are not disposed between second light transmitting regions TA2 and fifth light transmitting regions TA5, which are disposed adjacent to the second light transmitting regions TA2, and the second light transmitting regions TA2 and the fifth light transmitting regions TA5 may be separated from one another by the gaps therebetween. The embodiment of FIG. 36 differs from the embodiment of FIG. 34 in the arrangements of the light transmitting regions TA and the light blocking patterns 240_9.

In the color converting substrate 30_9, different light transmitting regions TA that transmit light of the same color therethrough or identical light transmitting regions that transmit light of the same color therethrough may be disposed adjacent to one another, and the light blocking patterns 240_9 may be disposed between the different light transmitting regions TA or the identical light transmitting regions TA. Accordingly, even if the area of the light transmitting regions TA decreases, the impact precision of ink required for inkjet printing can be lowered, and the distribution of processes can be improved.

In concluding the detailed description, those skilled in the art will appreciate that many variations and modifications can be made to the preferred embodiments without substantially departing from the principles of the invention. Therefore, the disclosed preferred embodiments of the invention are used in a generic and descriptive sense only and not for purposes of limitation.

The invention claimed is:
1. A color converting substrate comprising:
a base part having, defined therein, a first light transmitting region, a second light transmitting region spaced apart from the first light transmitting region in a first direction, and a first light blocking region between the first light transmitting region and the second light transmitting region;
a first color filter positioned on one surface of the base part and overlapping with the first light transmitting region in a plan view;
a second color filter positioned on the one surface of the base part and overlapping with the second light transmitting region in the plan view;
a light blocking pattern overlapping with the first light blocking region in the plan view and positioned on the one surface of the base part; and
a light transmitting pattern positioned on the first color filter, the second color filter, and the light blocking pattern,
wherein the first and second color filters include a colorant of a first color.

2. The color converting substrate of claim 1, wherein
a third light transmitting region spaced apart from the second light transmitting region in the first direction and a second light blocking region between the second transmitting region and the third light transmitting region are further defined in the base part, and
the color converting substrate further comprises: a third color filter positioned on the one surface of the base part, overlapping with the third light transmitting region in the plan view, and including a colorant of a second color, which is different from the colorant of the first color; a first light blocking member positioned between the second color filter and the third color filter and overlapping with the second light blocking region in the plan view; and a first wavelength converting pattern positioned on the third light transmitting region.

3. The color converting substrate of claim 2, wherein a width, in the first direction, of the light transmitting pattern is greater than a width, in the first direction, of the first wavelength converting pattern.

4. The color converting substrate of claim 2, further comprising:
a barrier positioned in the second light blocking region and disposed between the light transmitting pattern and the first wavelength converting pattern.

5. The color converting substrate of claim 4, wherein a thickness of the light blocking pattern is greater than a thickness of the first light blocking member and smaller than a thickness of the barrier.

6. The color converting substrate of claim 5, wherein the light blocking pattern is disposed on the one surface of the base part and is in contact with the first and second color filters.

7. The color converting substrate of claim 5, wherein
the light blocking pattern is disposed to be spaced apart from the one surface of the base part, and
at least part of a side surface of the light blocking pattern is in contact with the light transmitting pattern.

8. The color converting substrate of claim 4, wherein the barrier extends in a second direction, which intersects the first direction.

9. The color converting substrate of claim 8,
wherein a fifth light transmitting region spaced apart from the first light transmitting region in the second direction is defined in the base part,
wherein the light blocking pattern is disposed between the first light transmitting region and the fifth light transmitting region.

10. The color converting substrate of claim 2, wherein
a fourth light transmitting region spaced apart from the third light transmitting region in the first direction and a third light blocking region between the third transmitting region and the fourth light transmitting region are further defined in the base part, and
the color converting substrate further comprises: a fourth color filter positioned on the one surface of the base part, overlapping with the fourth light transmitting region in the plan view, and including a colorant of a third color, which is different from the colorants of the first and second colors; a second light blocking member positioned between the third and fourth color filters and overlapping with the third light blocking region in the plan view, and a second wavelength converting pattern positioned on the fourth light transmitting region.

11. The color converting substrate of claim 10, wherein
a first side of the second color filter is in contact with the light blocking pattern,
a second side of the second color filter is in contact with the first light blocking member,
a first side of the third color filter is in contact with the first light blocking member, and
a second side of the third color filter is in contact with the second light blocking member.

12. The color converting substrate of claim 11, wherein
a first side portion of the third color filter is positioned in the second light blocking region, and
a second side portion of the third color filter is positioned in the third light blocking region.

13. The color converting substrate of claim 10, further comprising:
a barrier positioned in the third light blocking region and disposed between the first and second wavelength converting patterns.

14. The color converting substrate of claim 10, wherein
the first and second color filters transmit light of the first color therethrough and block transmission of light of the second and third colors therethrough,
the third color filter transmits light of the second color therethrough and blocks transmission of light of the third and first colors therethrough, and
the fourth color filter transmits light of the third color therethrough and blocks transmission of light of the first and second colors therethrough.

15. The color converting substrate of claim 1, wherein
a third light transmitting region spaced apart from the first light transmitting region in the first direction, a fourth light transmitting region spaced apart from the third light transmitting region in a second direction, which intersects the first direction, and a sixth light transmitting region spaced apart from the third light transmitting region in the first direction are further defined in the base part,
the color converting substrate further comprises: a third color filter positioned on the one surface of the base part, overlapping with the third light transmitting region in the plan view, and including a colorant of a second color, which is different from the colorant of the first color; a fourth color filter positioned on the one surface of the base part, overlapping with the fourth light transmitting region in the plan view, and including a colorant of a third color, which is different from the first and second colors; and a sixth color filter positioned on the one surface of the base part, overlapping with the sixth light transmitting region in the plan view, and including a colorant of the second color filter, and
the light blocking pattern is further disposed between the third and sixth light transmitting regions.

16. The color converting substrate of claim 15, wherein
a seventh light transmitting region spaced apart from the fourth light transmitting region in the second direction is further defined in the base part,
the color converting substrate further comprises a seventh color filter positioned on the one surface of the base part, overlapping with the seventh light transmitting region in the plan view, and including a colorant of the third color, and
the light blocking pattern is further disposed between the fourth and seventh light transmitting regions.

17. A color converting substrate comprising:
a base part having, defined therein, a first light transmitting region, a second light transmitting region spaced apart from the first light transmitting region in a first direction, and a third light transmitting region spaced apart from a space between the first and second light transmitting regions in a second direction, which intersects the first direction;

a first color filter positioned on one surface of the base part, overlapping with the first light transmitting region in a plan view, and including a colorant of a first color;

a second color filter positioned on the one surface of the base part, overlapping with the second light transmitting region in the plan view, and including a colorant of a second color;

a third color filter positioned on the one surface of the base part, overlapping with the third light transmitting region in the plan view, and including a colorant of a third color, wherein the base part has, further defined therein, a fourth light transmitting region spaced apart from the first light transmitting region in the second direction, and the color converting substrate further comprises a fourth color filter positioned on the one surface of the base part, overlapping with the fourth light transmitting region in the plan view, and including a colorant of the first color and a light blocking pattern positioned between the first and fourth light transmitting regions.

18. The color converting substrate of claim 17, wherein the base part has, further defined therein, a fifth light transmitting region spaced apart from the second light transmitting region in the first direction, the color converting substrate further comprises a fifth color filter positioned on the one surface of the base part, overlapping with the fifth light transmitting region in the plan view, and including a colorant of the second color, and the light blocking pattern is further positioned between the second light transmitting region and the fifth light transmitting region.

19. The color converting substrate of claim 17, further comprising:

a barrier disposed to surround the first and fourth light transmitting regions; and a first wavelength converting pattern disposed on the first color filter, the fourth color filter, and the light blocking pattern, in a region surrounded by the barrier.

20. The color converting substrate of claim 19, wherein the base part has, further defined therein, a sixth light transmitting region spaced apart from the third light transmitting region in the second direction, the barrier is further disposed to surround the third and sixth light transmitting regions, the light blocking pattern is further positioned between the third and sixth light transmitting regions, and the color converting substrate further comprises a sixth color filter positioned on the one surface of the base part, overlapping with the sixth light transmitting region in the plan view, and including a colorant of the third color and a light transmitting pattern disposed on the third color filter, the sixth color filter, and the light blocking pattern, in a region surrounded by the barrier.

21. A display device comprising:

a display substrate having, defined therein, a first emission region, a second emission region spaced apart from the first emission region in a first direction, and a non-emission region between the first emission region and the second emission region; and a color converting substrate disposed on the display substrate, wherein the color converting substrate comprises a base part having, defined therein, a first light transmitting region, a second light transmitting region spaced apart from the first light transmitting region in the first direction and a first light blocking region between the first light transmitting region and the second light transmitting region, a first color filter positioned on one surface of the base part and overlapping with the first light transmitting region in a plan view, a second color filter positioned on the one surface of the base part and overlapping with the second light transmitting region in the plan view, a light blocking pattern overlapping with the first light blocking region and positioned on the one surface of the base part in the plan view, and a light transmitting pattern positioned on the first color filter, the second color filter, and the light blocking pattern, and the first and second color filters include a colorant of a first color.

22. The display device of claim 21, wherein the first light transmitting region overlaps with the first emission region in the plan view, the second light transmitting region overlaps with the second emission region in the plan view, the first and second emission regions emit emission light of the first color, and the emission light is incident upon the light transmitting pattern.

23. The display device of claim 22, wherein at least some of the emission light emitted from the first emission region and incident upon the light transmitting pattern is output from the first light transmitting region, and at least some of the emission light emitted from the first emission region and incident upon the light transmitting pattern is blocked by the light blocking pattern.

24. The display device of claim 21, wherein the display substrate has, further defined therein, a third emission region spaced apart from the second emission region in the first direction, and the color converting substrate has, defined therein, a third light transmitting region spaced apart from the second light transmitting region in the first direction and a second light blocking region positioned between the second transmitting regions and the third light transmitting region and further comprises a third color filter positioned on the one surface of the base part, overlapping with the third light transmitting region in the plan view, and including a colorant of a second color, which is different from the first color; a first light blocking member positioned between the second color filter and the third color filter and overlapping with the second light blocking region in the plan view; and a first wavelength converting pattern positioned on the third light transmitting region.

25. The display device of claim 21, further comprising:

a barrier positioned in the second light blocking region and disposed between the light transmitting pattern and the first wavelength converting pattern.

26. The display device of claim 25, wherein
the third emission region emits emission light of the first color, and
the emission light is incident upon the first wavelength converting pattern.

* * * * *